(12) United States Patent
Yamazaki et al.

(10) Patent No.: US 12,453,187 B2
(45) Date of Patent: Oct. 21, 2025

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Erika Takahashi, Kanagawa (JP); Kunihiro Fukushima, Kanagawa (JP); Katsuaki Tochibayashi, Kanagawa (JP); Ryota Hodo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 454 days.

(21) Appl. No.: 17/285,782

(22) PCT Filed: Oct. 18, 2019

(86) PCT No.: PCT/IB2019/058888
§ 371 (c)(1),
(2) Date: Apr. 15, 2021

(87) PCT Pub. No.: WO2020/084415
PCT Pub. Date: Apr. 30, 2020

(65) Prior Publication Data
US 2021/0384326 A1    Dec. 9, 2021

(30) Foreign Application Priority Data

Oct. 26, 2018  (JP) ................................ 2018-201656
Nov. 22, 2018  (JP) ................................ 2018-219302
(Continued)

(51) Int. Cl.
*H10D 99/00*    (2025.01)
*H01L 21/02*    (2006.01)
(Continued)

(52) U.S. Cl.
CPC ......... *H10D 99/00* (2025.01); *H01L 21/0206* (2013.01); *H01L 21/0214* (2013.01);
(Continued)

(58) Field of Classification Search
None
See application file for complete search history.

(56) References Cited

U.S. PATENT DOCUMENTS

| 6,611,449 | B1 | 8/2003 | Hilliger |
| 7,267,127 | B2 | 9/2007 | Watanabe et al. |

(Continued)

FOREIGN PATENT DOCUMENTS

| CN | 103107200 A | 5/2013 |
| CN | 106030792 A | 10/2016 |

(Continued)

OTHER PUBLICATIONS

International Search Report (Application No. PCT/IB2019/058888) Dated Dec. 24, 2019.
(Continued)

*Primary Examiner* — Khaja Ahmad
(74) *Attorney, Agent, or Firm* — Nixon Peabody LLP; Jeffrey L. Costellia

(57) ABSTRACT

A semiconductor device with high reliability is provided by the following steps: forming an oxide semiconductor; forming a first insulator in contact with the oxide semiconductor; forming a second insulator over the first insulator; forming a third insulator over the second insulator; forming an opening in the third insulator, the second insulator, and the first insulator; cleaning the inside of the opening; embedding a conductor in the cleaned opening; forming the first insulator to include an excess-oxygen region; forming the second insulator to have a higher barrier property against oxygen, hydrogen, or water than the first insulator; and
(Continued)

processing the opening to have a cylindrical shape or an inverted cone shape.

3 Claims, 29 Drawing Sheets

(30) Foreign Application Priority Data

| Jan. 25, 2019 | (JP) | 2019-010809 |
|---|---|---|
| May 31, 2019 | (JP) | 2019-102132 |
| Jun. 12, 2019 | (JP) | 2019-109842 |

(51) Int. Cl.
    *H10B 12/00*     (2023.01)
    *H10D 30/67*     (2025.01)
    *H10D 62/80*     (2025.01)

(52) U.S. Cl.
    CPC .. *H01L 21/02178* (2013.01); *H01L 21/02565* (2013.01); *H10D 30/6734* (2025.01); *H10D 30/6755* (2025.01); *H10D 62/80* (2025.01); *H10B 12/00* (2023.02)

(56) References Cited

U.S. PATENT DOCUMENTS

| | | | |
|---|---|---|---|
| 9,082,861 B2 | 7/2015 | Yamazaki | |
| 9,343,357 B2 | 5/2016 | Xu et al. | |
| 9,356,054 B2 | 5/2016 | Miyairi et al. | |
| 9,372,379 B2 | 6/2016 | Choi et al. | |
| 9,450,080 B2 | 9/2016 | Yamazaki et al. | |
| 9,704,868 B2 | 7/2017 | Miyairi et al. | |
| 9,768,318 B2 | 9/2017 | Yamazaki et al. | |
| 9,806,198 B2 | 10/2017 | Suzawa | |
| 9,882,064 B2 | 1/2018 | Yamazaki | |
| 9,954,113 B2 | 4/2018 | Shimomura et al. | |
| 10,236,390 B2 | 3/2019 | Yamane et al. | |
| 10,411,003 B2 | 9/2019 | Okuno et al. | |
| 10,411,013 B2 | 9/2019 | Godo et al. | |
| 10,438,982 B2 | 10/2019 | Kurata et al. | |
| 10,460,984 B2 | 10/2019 | Kurata et al. | |
| 10,658,520 B2 | 5/2020 | Kimura et al. | |
| 10,910,359 B2 | 2/2021 | Okuno et al. | |
| 11,004,727 B2 | 5/2021 | Kurata et al. | |
| 11,380,688 B2 | 7/2022 | Sato et al. | |
| 11,729,965 B2 | 8/2023 | Sato et al. | |
| 11,791,201 B2 | 10/2023 | Kurata et al. | |
| 2013/0119373 A1 | 5/2013 | Yamazaki | |
| 2014/0361289 A1 | 12/2014 | Suzawa | |
| 2015/0179774 A1 | 6/2015 | Yamazaki et al. | |
| 2015/0187823 A1* | 7/2015 | Miyairi | H10D 30/6755 257/43 |
| 2015/0214256 A1* | 7/2015 | Miyairi | H10D 84/83 257/43 |
| 2015/0249038 A1 | 9/2015 | Xu et al. | |
| 2016/0233126 A1* | 8/2016 | Xu | H01L 21/76843 |
| 2016/0293732 A1* | 10/2016 | Kurata | H10D 87/00 |
| 2016/0307777 A1* | 10/2016 | Kurata | H01L 21/02063 |
| 2016/0380107 A1* | 12/2016 | Yamazaki | H01L 29/66969 257/43 |
| 2018/0033892 A1* | 2/2018 | Yamane | H10D 30/6739 |
| 2018/0061989 A1* | 3/2018 | Endo | H01L 27/088 |
| 2019/0273024 A1* | 9/2019 | Li | H01L 21/28518 |
| 2020/0006328 A1 | 1/2020 | Yamazaki et al. | |
| 2020/0144310 A1 | 5/2020 | Onuki et al. | |
| 2020/0373435 A1 | 11/2020 | Kimura et al. | |

FOREIGN PATENT DOCUMENTS

| | | |
|---|---|---|
| EP | 3111473 A | 1/2017 |
| JP | 2004-119978 A | 4/2004 |
| JP | 2006-165023 A | 6/2006 |
| JP | 2013-123045 A | 6/2013 |
| JP | 2015-015458 A | 1/2015 |
| JP | 2015-026810 A | 2/2015 |
| JP | 2015-135953 A | 7/2015 |
| JP | 2015-144267 A | 8/2015 |
| JP | 2016-149548 A | 8/2016 |
| JP | 2016-208024 A | 12/2016 |
| JP | 2017-508290 | 3/2017 |
| JP | 2017-120904 A | 7/2017 |
| JP | 2017-168838 A | 9/2017 |
| JP | 2018-037651 A | 3/2018 |
| JP | 2018-067708 A | 4/2018 |
| JP | 2018-098308 A | 6/2018 |
| JP | 2018-125528 A | 8/2018 |
| JP | 2018-133550 A | 8/2018 |
| KR | 2013-0052513 A | 5/2013 |
| KR | 2015-0073096 A | 6/2015 |
| KR | 2016-0102236 A | 8/2016 |
| TW | 201526120 | 7/2015 |
| TW | 201906088 | 2/2019 |
| WO | WO-2015/097593 | 7/2015 |
| WO | WO-2015/130549 | 9/2015 |
| WO | WO-2018/020350 | 2/2018 |
| WO | WO-2018/138604 | 8/2018 |

OTHER PUBLICATIONS

Written Opinion (Application No. PCT/IB2019/058888) Dated Dec. 24, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

* cited by examiner

1471

1472

1473

1474

1475

1476

1477

1478

SEMICONDUCTOR DEVICE AND METHOD FOR MANUFACTURING SEMICONDUCTOR DEVICE

TECHNICAL FIELD

One embodiment of the present invention relates to a semiconductor device and a method of manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has been attracting attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

SUMMARY OF THE INVENTION

Problems to be Solved by the Invention

An object of one embodiment of the present invention is to provide a semiconductor device with high reliability. Another object of one embodiment of the present invention is to provide a semiconductor device having favorable electrical characteristics. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

In one embodiment of the present invention, an oxide semiconductor is formed; a first insulator in contact with the oxide semiconductor is formed; a second insulator is formed over the first insulator; a third insulator is formed over the second insulator; an opening is formed in the third insulator, the second insulator, and the first insulator; the inside of the opening is cleaned; a conductor is embedded in the cleaned opening; the first insulator is formed to include an excess-oxygen region; the second insulator is formed to have a higher barrier property against oxygen, hydrogen, or water than the first insulator; and the opening is processed to have a cylindrical shape or an inverted cone shape.

In one embodiment of the present invention, an oxide semiconductor is formed; a first insulator in contact with the oxide semiconductor is formed; a second insulator over the first insulator is formed by a sputtering method under an oxygen atmosphere; a third insulator is formed over the second insulator; an opening is formed in the third insulator, the second insulator, and the first insulator; the inside of the opening is cleaned; a conductor is embedded in the cleaned opening; the first insulator is silicon oxynitride; the second insulator is aluminum oxide; and the opening is processed to have a cylindrical shape or an inverted cone shape.

In the above, a step of forming a fourth insulator on a side surface of the cleaned opening is included, and the fourth insulator has a higher barrier property against oxygen, hydrogen, or water than the first insulator.

In one embodiment of the present invention, a first insulator is formed; an oxide semiconductor is formed over the first insulator; a second insulator in contact with the oxide semiconductor is formed; a third insulator is formed over the second insulator; a fourth insulator is formed over the third insulator; an opening is formed in the fourth insulator, the third insulator, and the second insulator; the inside of the opening is cleaned; a conductor is embedded in the cleaned opening; the second insulator is formed to include an excess-oxygen region; the second insulator and the third insulator are formed to have a higher barrier property against oxygen, hydrogen, or water than the first insulator; the first insulator and the fourth insulator are formed of the same material; the first insulator and the second insulator are in contact with each other in a peripheral region of the oxide semiconductor; and the opening is processed to have a cylindrical shape or an inverted cone shape.

In one embodiment of the present invention, a first insulator is formed; an oxide semiconductor is formed over the first insulator; a second insulator in contact with the oxide semiconductor is formed; a third insulator is formed over the second insulator by a sputtering method under an oxygen atmosphere; a fourth insulator is formed over the third insulator; an opening is formed in the fourth insulator, the third insulator, and the second insulator; the inside of the opening is cleaned; a conductor is embedded in the cleaned opening; the first insulator and the fourth insulator are silicon nitride; the first insulator is silicon oxynitride; the second insulator is aluminum oxide; the first insulator and the second insulator are in contact with each other in a peripheral region of the oxide semiconductor; and the opening is processed to have a cylindrical shape or an inverted cone shape.

In the above, the oxide semiconductor is an In—Ga—Zn oxide.

Effect of the Invention

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. According to another embodiment of the present invention, a semiconductor device with low power consumption can be provided.

Note that the description of the effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

MODE FOR CARRYING OUT THE INVENTION

Figure 1A:
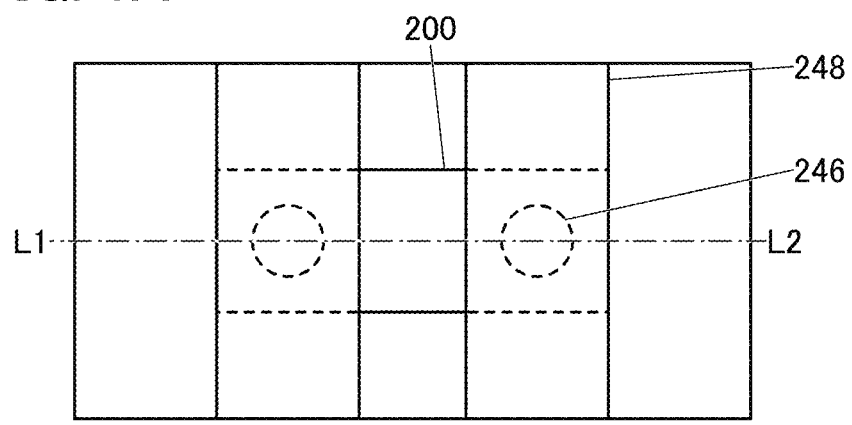
FIG. 1A and FIG. 1B are a top view and a cross-sectional view of a semiconductor device of one embodiment of the present invention.

Hereinafter, embodiments will be described with reference to the drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, they are not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which might not be reflected in the drawings for easy understanding of the invention. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not sometimes correspond to the ordinal numbers that are used to specify one embodiment of the present invention.

In this specification and the like, terms for describing arrangement, such as "over" and "under", are used for convenience in describing a positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, and the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, and the average value in a channel formation region.

Note that in this specification and the like, depending on the transistor structure, a channel width in a region where a channel is actually formed (hereinafter also referred to as an effective channel width) is sometimes different from a channel width shown in a top view of a transistor (hereinafter also referred to as an apparent channel width). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, transition metals other than the main components of the oxide semiconductor, and the like; hydrogen, lithium, sodium, silicon, boron, phosphorus, carbon, nitrogen, and the like are given as examples. Note that water also serves as an impurity in some cases. Entry of an impurity may cause oxygen vacancies in an oxide semiconductor, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle of greater than or equal to −10° and less than or equal to 10°. Thus, the case where the angle is greater than or equal to −5° and less than or equal to 5° is also included. In addition, the term "substantially parallel" indicates a state where two straight lines are placed at an angle greater than or equal to −30° and less than or equal to 30°. Moreover, "perpendicular" indicates a state where two straight lines are placed at an angle of greater than or equal to 80° and less than or equal to 100°. Thus, the case where the angle is greater than or equal to 85° and less than or equal to 95° is also included. Furthermore, "substantially perpendicular" indicates a state where two straight lines are placed at an angle greater than or equal to 60° and less than or equal to 1200.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, normally off means drain current per micrometer of channel width flowing through a transistor being $1\times10^{-20}$ A or less at room temperature, $1\times10^{-18}$ A or less at 85° C., or $1\times10^{-16}$ A or less at 125° C. when a potential is not applied to a gate or a ground potential is applied to the gate.

Embodiment 1

Figure 1B:
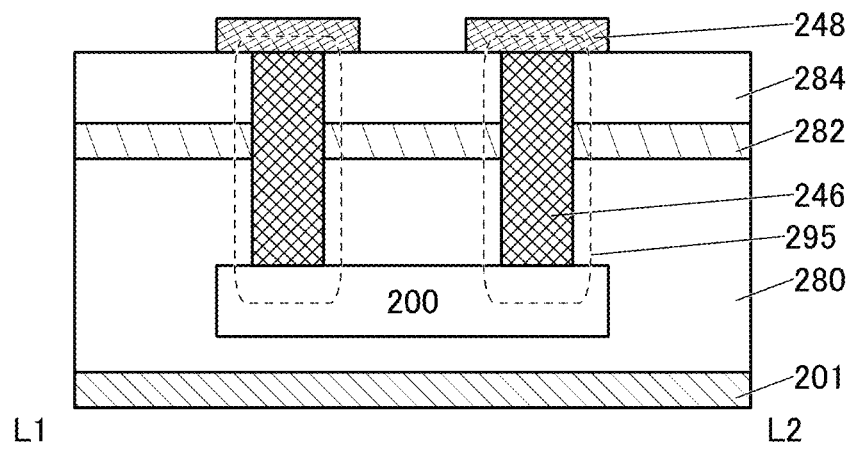

An example of a semiconductor device including a transistor 200 of one embodiment of the present invention is described in this embodiment.
<Structure Example of Semiconductor Device>
FIG. 1 is a top view and a cross-sectional view of a semiconductor device including the transistor 200 of one embodiment of the present invention. FIG. 1A is a top view of the semiconductor device. FIG. 1B is a cross-sectional view of a portion indicated by a dashed-dotted line L1-L2 in FIG. 1A. Note that for clarity of the drawing, some components of the semiconductor device are not shown in FIG. 1.

The semiconductor device of one embodiment of the present invention includes a substrate 201, the transistor 200, an insulator 280, an insulator 282, an insulator 284 functioning as interlayer films, and conductors 246 connected to the transistor 200.

The transistor 200 preferably uses a metal oxide functioning as an oxide semiconductor (hereinafter also referred to as an oxide semiconductor) in a semiconductor including a region where a channel is formed (hereinafter also referred to as a channel formation region).

As an oxide semiconductor, a metal oxide such as an In-M-Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide semiconductor, an In—Ga oxide or an In—Zn oxide may be used.

The transistor 200 using an oxide semiconductor in a channel formation region has an extremely low leakage current in a non-conduction state; thus, a semiconductor device with low power consumption can be provided. An oxide semiconductor can be deposited by a sputtering method or the like, and thus can be used in the transistor 200 included in a highly integrated semiconductor device.

In contrast, a transistor using an oxide semiconductor is likely to have normally-on characteristics (characteristics in that a channel exists without voltage application to a gate electrode and current flows in a transistor) owing to an impurity and an oxygen vacancy in the oxide semiconductor that affect the electrical characteristics. In the case where the transistor is driven in the state where excess oxygen exceeding the proper amount is included in the oxide semiconductor, the valence of the excess oxygen atoms is changed and the electrical characteristics of the transistor are changed, so that reliability is decreased in some cases.

Therefore, it is preferable to use, as the oxide semiconductor used in the transistor, a highly purified intrinsic oxide semiconductor that does not include an impurity, an oxygen vacancy, and oxygen in excess of oxygen in the stoichiometric composition (hereinafter, also referred to as excess oxygen).

However, in the transistor using the oxide semiconductor, oxygen in the oxide semiconductor is gradually absorbed by a conductor included in the transistor or a conductor used for a plug or a wiring connected to the transistor, and an oxygen vacancy is generated as one of changes over time in some cases.

Accordingly, it is preferable to provide a structure body including an excess-oxygen region in the vicinity of the oxide semiconductor of the transistor. Excess oxygen of the structure body including the excess-oxygen region is diffused into oxygen vacancies generated in the oxide semiconductor, whereby the oxygen vacancies can be compensated for. On the other hand, in the case where the amount of diffused excess oxygen of the structure body including the excess-oxygen region exceeds the proper value, the oversupplied oxygen might cause a change in the structure of the oxide semiconductor.

Specifically, an insulator containing oxygen is used as the insulator 280 functioning as an interlayer film in the vicinity of the transistor 200. It is particularly preferable to use, as the insulator 280, an oxide that contains more oxygen than oxygen in the stoichiometric composition. That is, in the insulator 280, a region in which oxygen in excess of that in the stoichiometric composition exists (hereinafter also referred to as an excess-oxygen region) is preferably formed.

As the insulator including an excess-oxygen region, specifically, an oxide material that releases part of oxygen by heating is preferably used. An oxide that releases oxygen by heating (hereinafter also referred to as an insulating material including an excess-oxygen region) is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{30}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

In order to provide the excess-oxygen region in the insulator 280, oxygen (including at least oxygen radicals, oxygen atoms, or oxygen ions) is introduced into the insulator 280, whereby a region containing oxygen in excess is formed.

A method for stacking metal oxides over the insulator 280 using a sputtering apparatus is given as an example of the oxygen introduction treatment. For example, when the deposition in an oxygen gas atmosphere is performed using a sputtering apparatus as a means for depositing the insulator 282, oxygen can be introduced into the insulator 280 while the insulator 282 is deposited.

In particular, it is preferable that silicon oxynitride be used as the insulator 280 and aluminum oxide be used as the insulator 282. When an aluminum oxide film is formed over a silicon oxynitride film by a sputtering method, an excess-oxygen region can be formed in silicon oxide, which is the object to be formed.

Aluminum oxide may have a function of inhibiting diffusion of oxygen (hereinafter also referred to as a barrier property). Compared to silicon oxynitride, in particular, aluminum oxide has a function of inhibiting diffusion of oxygen or impurities such as water or hydrogen.

Note that in this specification, a function of inhibiting diffusion of impurities or oxygen means a function of inhibiting diffusion of any one or all of the impurities and the oxygen. A film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

Thus, when aluminum oxide is used as the insulator 282, impurities such as water or hydrogen can be inhibited from being diffused into the transistor 200 side from above the insulator 282.

When a metal layer is provided over a metal oxide film such as an aluminum oxide film, the etch rate selectivity ratio of the metal film with respect to the metal oxide may be low. The insulator 284 is preferably provided over the insulator 282 including a metal oxide. When a metal layer is provided over the insulator 284, the insulator 284 is preferably formed using a material whose etch rate selectivity ratio with respect to the metal layer is high.

The stack of the insulator 280, the insulator 282, and the insulator 284 includes openings 295, which expose the transistor 200. In the openings 295, the conductors 246 in contact with the transistor 200 are embedded. An insulator having a barrier property may be provided between the conductor 246 and the stack.

It is preferable that the openings 295 be provided to have a shape with no corner in the top view. Specifically, the shape of these projected areas is circle or oval. That is, the shape of the openings 295 is a column or an inverted conical frustum. Thus, the shape of the conductors 246 provided in the openings 295 is preferably a column or an inverted conical frustum.

Over the insulator 284 and the conductors 246, conductors 248 functioning as wirings wiring connected to the conductors 246 may be provided.

<Manufacturing Method of Semiconductor Device>

Next, a method of manufacturing a semiconductor device shown in FIG. 1 including the transistor 200 of one embodiment of the present invention is described with FIG. 2A to FIG. 3C. FIG. 2A to FIG. 3C are cross-sectional views of a semiconductor device including the transistor 200 of one embodiment of the present invention. Note that for clarity of the drawing, some components are not shown of the semiconductor device shown in FIG. 2A to FIG. 3C.

First, the transistor 200 including an oxide semiconductor is formed over the substrate 201.

Then, the insulator 280 is formed in the vicinity of the transistor 200. For example, as an insulating film to be the insulator 280, a silicon oxynitride film is deposited by a CVD method or a sputtering method. The insulator 280 may have a multilayer structure. The insulating film to be the insulator 280 may have a structure in which a silicon oxide film is deposited by a sputtering method and another silicon oxide film is deposited thereover by a CVD method, for example.

CMP (chemical mechanical polishing) treatment may be performed on the insulator 280 to form the insulator 280 with the flat top surface. The insulator 280 that covers the transistor 200 may function as a planarization film that covers uneven shapes thereunder. This structure improves the coverage with a film over the insulator 280. Thus, the insulator 282 can seal the transistor 200 and the insulator 280 with no gaps.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. Thus, a film with few defects can be obtained by a thermal CVD method.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition.

Unlike a deposition method in which particles released from a target or the like are deposited, a CVD method and an ALD method are deposition methods in which a film is formed by reaction at a surface of an object to be processed. Thus, the CVD method and the ALD method are deposition methods that are less likely to be influenced by the shape of the object to be processed and thus enable good step coverage. In particular, the ALD method enables good step coverage and high thickness uniformity and thus is suitable for covering a surface of an opening portion with a high aspect ratio, for example. Note that the ALD method has a relatively low deposition rate, and thus is preferably used in combination with another deposition method with a high deposition rate, such as the CVD method, in some cases.

Next, the insulator 282 is deposited over the insulator 280. The insulator 282 can be deposited by a sputtering method, a CVD method, an MBE method, a PLD method, an ALD method, or the like.

As the insulator 282, an aluminum oxide film is preferably deposited by a sputtering method, for example. In addition, the insulator 282 may have a multilayer structure. For example, a structure may be employed in which an aluminum oxide film is deposited by a sputtering method and silicon nitride is deposited over the aluminum oxide film by a sputtering method.

When the insulator 282, which is a metal oxide, is stacked over the insulator 280 by a sputtering method, oxygen introduction treatment on the insulator 280 can be performed at the same time. Specifically, the insulator 282 is formed using a sputtering apparatus under an oxygen gas atmosphere, whereby oxygen can be introduced into the insulator 280 while the insulator 282 is being formed.

During a deposition by a sputtering method, ions and sputtered particles exist between a target and a substrate. For example, a potential $E_0$ is supplied to the target, to which a power source is connected. A potential $E_1$ such as aground potential is supplied to the substrate. Note that the substrate may be electrically floating. In addition, there is a region at a potential $E_2$ between the target and the substrate. The relationship between the potentials is $E_2 > E_1 > E_0$.

The ions in plasma are accelerated by a potential difference $E_2 - E_0$ and collide with the target, whereby the sputtered particles are ejected from the target. These sputtered particles are attached on a deposition surface and deposited thereover; as a result, a film is deposited. Some ions recoil by the target and might pass through the deposited film as recoil ions, and be taken into the insulator 280 in contact with the deposition surface. The ions in the plasma are accelerated by a potential difference $E_2 - E_1$ and collide with the deposition surface. At this time, some ions reach the inside of the insulator 280. The ions are taken into the insulator 280, so that a region into which the ions are taken is formed in the insulator 280. That is, an excess-oxygen region is formed in the insulator 280 in the case where the ions contain oxygen.

Next, the insulator 284 may be deposited over the insulator 282. The insulator 284 can be deposited by a sputtering method, a CVD method, an MBE method, a PLD method, an ALD method, or the like.

Then, a film 290A to be a hard mask is formed over the insulator 284. As the film 290A to be a hard mask, tungsten or tantalum nitride is formed by a sputtering method, for example.

Figure 2A:
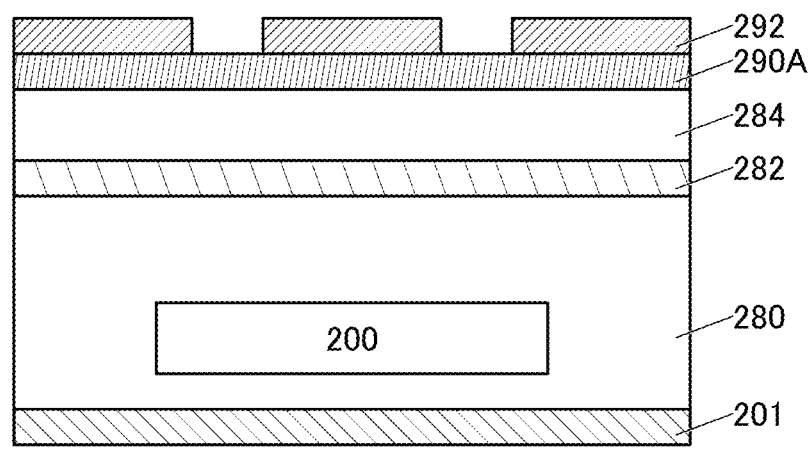
FIG. 2A, FIG. 2B, and FIG. 2C are cross-sectional views showing a manufacturing method of a semiconductor device of one embodiment of the present invention.

Next, a resist mask 292 is formed over the film 290A to be a hard mask by a photolithography method (see FIG. 2A).

Figure 2B:
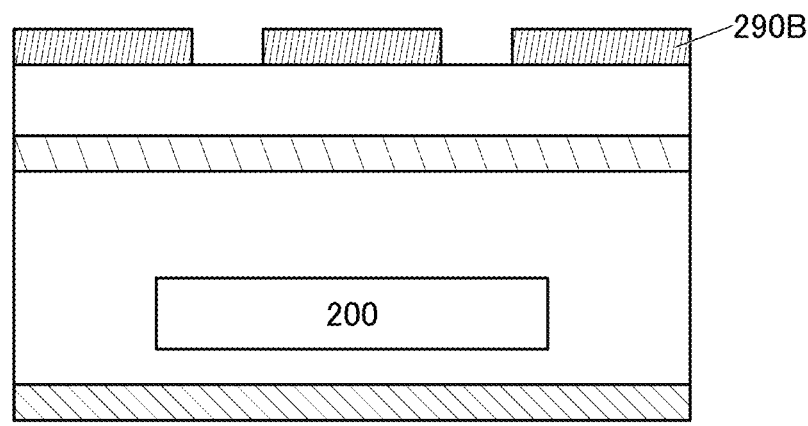

By using the resist mask 292, part of the film 290A to be a hard mask is selectively removed to form a hard mask 290B (see FIG. 2B).

By using the hard mask 290B to process the stack of the insulator 280, the insulator 282, and the insulator 284 in this step, the openings 295 is inhibited from being unnecessarily etched (also referred to as CD loss).

Figure 2C:
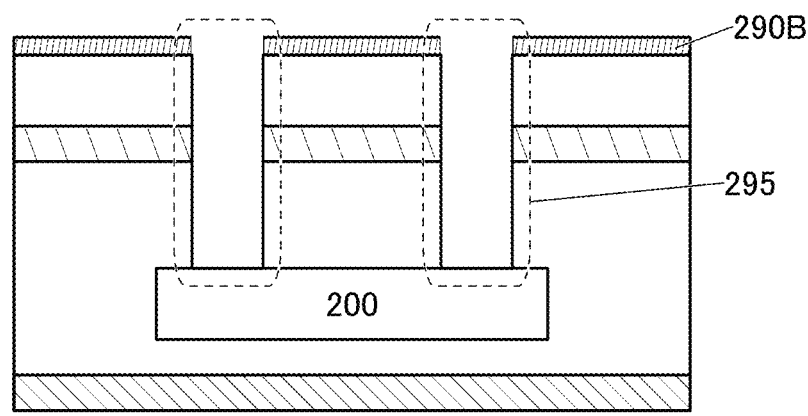

Next, by using the hard mask 290B, the insulator 284, the insulator 282, and the insulator 280 are selectively removed to form openings to expose the transistor 200, by which the openings 295 are formed (see FIG. 2C). Note that at this time, part of the hard mask 290B may be removed.

Note that examples of the openings include a groove and a slit. A region where an opening is formed may be referred to as an opening. Wet etching can be used for the formation of the openings; however, dry etching is preferably used for microfabrication.

Figure 3A:
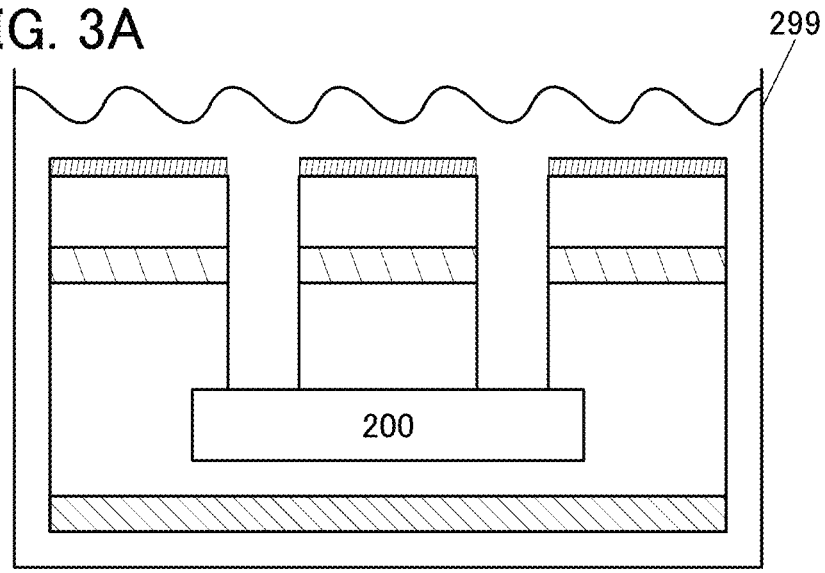
FIG. 3A, FIG. 3B, and FIG. 3C are cross-sectional views showing a manufacturing method of a semiconductor device of one embodiment of the present invention.
Figure 3B:
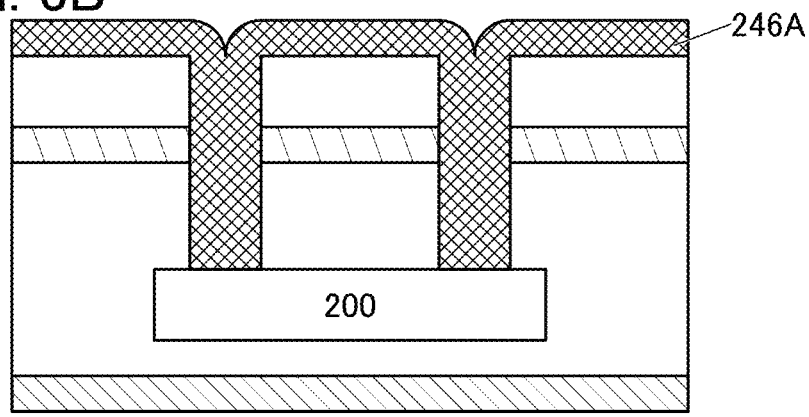
Figure 3C:
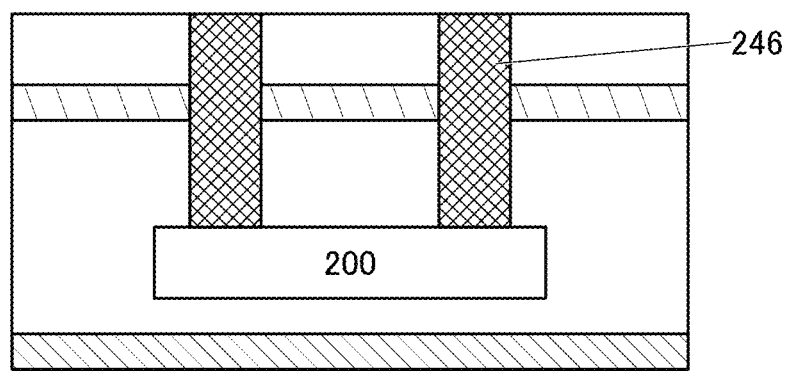

In that step, the metal oxide used as the insulator 282 may react with the etching gas to be a byproduct to remain inside the openings 295. After removing the hard mask 290B, cleaning treatment is performed with a cleaning machine 299 (see FIG. 3A). FIG. 3A is an example showing a batch-type-like cleaning machine; alternatively, a single wafer cleaner using spin can be used.

Examples of the cleaning treatment include wet cleaning using a cleaning solution and the like, plasma treatment using plasma, and cleaning by heat treatment, and any of these cleaning treatments may be performed in appropriate combination.

As the wet cleaning, cleaning treatment may be performed using an aqueous solution in which ammonia water, oxalic acid, phosphoric acid, hydrofluoric acid, or the like is diluted with carbonated water or pure water, pure water; carbonated water; or the like. Alternatively, ultrasonic cleaning using such an aqueous solution, pure water, or carbonated water may be performed. Further alternatively, such cleaning methods may be performed in combination as appropriate.

For example, using the aqueous solution, pure water, or carbonated water, QDR (Quick Dump Rinsing) cleaning is preferably performed with a batch type cleaning machine. In the batch-type cleaning machine, a substrate cassette that can hold one or more substrates is put in a cleaning bath so that cleaning can be performed.

QDR (Quick Dump Rinsing) cleaning steps are as follows, for example: a first step of supplying pure water or carbonated water such that the cleaning bath overflows while bubbling the pure water or carbonated water in the cleaning bath with the use of a nitrogen gas; a second step of eliminating the pure water or carbonated water in the cleaning bath while supplying pure water or carbonated water from a shower to the cleaning bath; a third step of rapidly supplying pure water or carbonated water in the cleaning bath; and a fourth step of supplying pure water or carbonated water such that the cleaning bath overflows while bubbling the pure water or carbonated water in the cleaning bath with the use of a nitrogen gas.

The first step, the second step, the third step, and the fourth step complete one cycle; the number of cycles is set as necessary.

The openings 295 preferably have a cylindrical shape or an inverted conical frustum shape. No corner shape makes it easy to remove byproducts remaining inside the openings 295.

Next, a conductive film 246A is formed to cover the openings 295 and the insulator 284. As the conductive film 246A, a conductive material containing tungsten, copper, or aluminum as its main component is preferably used. The conductive film 246A may have a stacked-layer structure (see FIG. 3B).

Before the conductive film 246A is provided, an insulator having a barrier property such as aluminum oxide may be provided only on the side surfaces of the openings 295.

Next, part of the conductive film 246A is removed, so that the insulator 284 is exposed. In this step, CMP treatment can be used, for example. By the CMP treatment, an unnecessary structure body is removed and the insulator 284 is exposed, whereby the conductors 246 remain only in the openings 295. Note that the insulator 284 may be partly removed by the CMP treatment (see FIG. 3C).

Next, the conductors 248 are formed over the conductors 246 and the insulator 284. As the conductor functioning as a wiring, a conductive material containing tungsten, copper, or aluminum as its main component is preferably used. Furthermore, the conductor may have a stacked-layer structure and may be a stack of titanium or titanium nitride and any of the above conductive materials, for example. Note that the conductor may be formed to be embedded in an opening provided in an insulator.

Through the above steps, the semiconductor device including the transistor 200 shown in FIG. 1 can be manufactured.

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. Another object of one embodiment of the present invention is to provide a semiconductor device with low power consumption.

<Application Example of Semiconductor Device>

An example of a semiconductor device including the transistor 200 of one embodiment of the present invention is described below using FIG. 4.

Impurities such as hydrogen, water, or a metal oxide increase the possibility of electric characteristic variation of the oxide semiconductor of the transistor 200; it is preferable to stop the entry of impurities from the outside.

Thus, the transistor 200 is preferably sealed by an insulator having a barrier property. In addition, sealing the transistor 200 and the insulator 280, which includes an excess-oxygen region, with an insulator having a barrier property can inhibit the excess oxygen in the insulator 280 from being diffused into components other than the oxide semiconductor of the transistor 200.

Note that in the semiconductor device shown in FIG. 4, structures having the same functions as the structures included in the semiconductor device described in <Structure Example of Semiconductor Device> are denoted by the same reference numerals. Note that the materials described in detail in <Structure Example of Semiconductor Device> can also be used as constituent materials of the semiconductor devices in this section.

Application Example 1 of Semiconductor Device

Figure 4A:
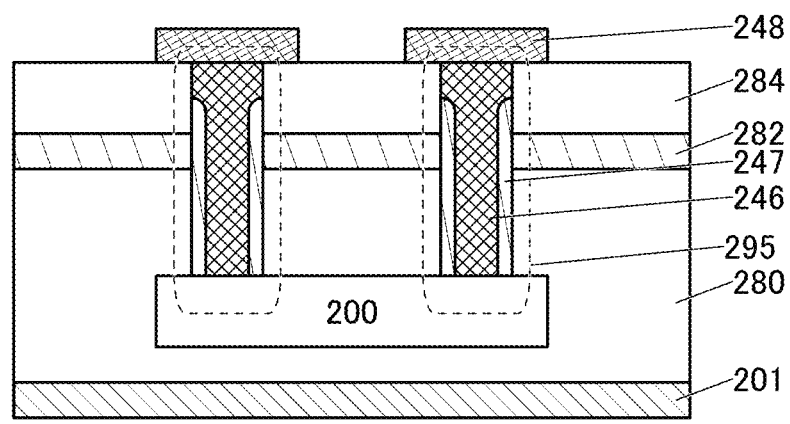
FIG. 4A and FIG. 4B are cross-sectional views showing a manufacturing method of a semiconductor device of one embodiment of the present invention.

The semiconductor device shown in FIG. 4A includes insulators 247 on the side surfaces of the openings 295.

When the insulator 280 including an excess-oxygen region is provided in the vicinity of the transistor 200 including an oxide semiconductor, oxidization of the conductors 246 can be inhibited by providing the insulators 247 having a barrier property between the insulator 280, which includes the excess-oxygen region, and the conductors 246, which are provided in the insulator 280. In addition, reduction in the excess oxygen amount in the insulator 280 due to absorption of excess oxygen by the conductors 246 can be inhibited.

In particular, when the insulators 247 and the insulator 282 are provided to be in contact with each other as shown in FIG. 4A, the excess oxygen in the insulator 280 can be inhibited from being diffused above the insulator 282. Accordingly, excess oxygen can be efficiently supplied to the oxide semiconductor included in the transistor 200. Furthermore, diffusion of impurities from above the insulator 282 to the transistor 200 can be inhibited.

Note that the conductors 246 have a function of a plug or a wiring that is electrically connected to the transistor 200. Specifically, the insulators 247 are provided in contact with side walls of the openings in the insulator 284, the insulator 282, and the insulator 280, and the conductors 246 are formed in contact with these side surfaces. At least at part of the bottom of the openings, the transistor 200 is positioned and the conductors 246 are in contact with the transistor 200.

As the insulators 247, for example, an insulator that can be used as the insulator 282 or the like can be used. In particular, aluminum oxide deposited by an ALD method is preferably used, for example.

Application Example 2 of Semiconductor Device

Figure 4B:
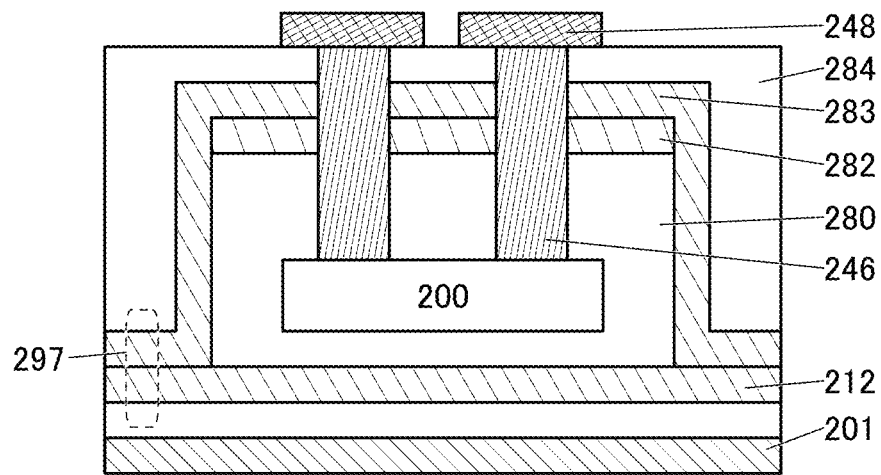

The semiconductor device shown in FIG. 4B includes an insulator 212 and an insulator 283, which function as barrier layers, over and under the transistor 200. The insulator 212 and the insulator 283 are in contact with each other at side of the transistor 200 or at a region 297 of the end portion of the substrate. In other words, the semiconductor device shown in FIG. 4B has a structure in which the transistor 200 and the insulator 280 including the excess-oxygen region are sealed by barrier layers.

The insulator 283 is provided over the insulator 282. The insulator 284 is formed using a material having high etch rate selectivity ratio with respect to the conductor 248 when the conductor 248 is processed. Thus, the insulator 284 is provided over the insulator 283 if necessary.

For example, silicon nitride can be used for the insulator 212 and the insulator 283. Moreover, it is possible to use, for example, a metal oxide such as aluminum oxide, hafnium oxide, magnesium oxide, gallium oxide, germanium oxide, yttrium oxide, zirconium oxide, lanthanum oxide, neodymium oxide, or tantalum oxide, or a nitride such as silicon nitride oxide.

The film kind of the insulator 283 is preferably different from that of the insulator 282. A stack of different kinds of films can inhibit the diffusion of more kinds of impurities against impurities entering from the outside. Specifically, aluminum oxide is preferably used as the insulator 282, and silicon nitride is preferably used as the insulator 283.

The film kind of the insulator 283 is preferably the same as that of the insulator 212. The insulator 283 and the insulator 212 are in contact with each other in the region 297. Using the same kind of film to the insulator 283 and the insulator 212 can improve adhesiveness between the insulator 283 and the insulator 212.

In the description, one transistor 200 is sealed for convenience in the diagrams, and the structure is not limited to this. The region 297 may be provided to surround a region where a plurality of transistor 200 is provided.

With the above structure, a semiconductor device that includes a transistor including an oxide semiconductor and having a high on-state current can be provided. Alternatively, a semiconductor device that includes a transistor including an oxide semiconductor and having a low off-state current can be provided. Alternatively, a semiconductor device that has small variations in electrical characteristics, stable electrical characteristics, and high reliability can be provided.

The structure, method, and the like described above in this embodiment can be used in an appropriate combination with the structures, the methods, and the like described in the other embodiments and examples.

Embodiment 2

An example of a semiconductor device including a transistor of one embodiment of the present invention is described in this embodiment. The semiconductor device including a transistor of one embodiment of the present invention is a transistor including an oxide semiconductor in its channel formation region.

<Structure Example of Semiconductor Device>

Figure 5A:
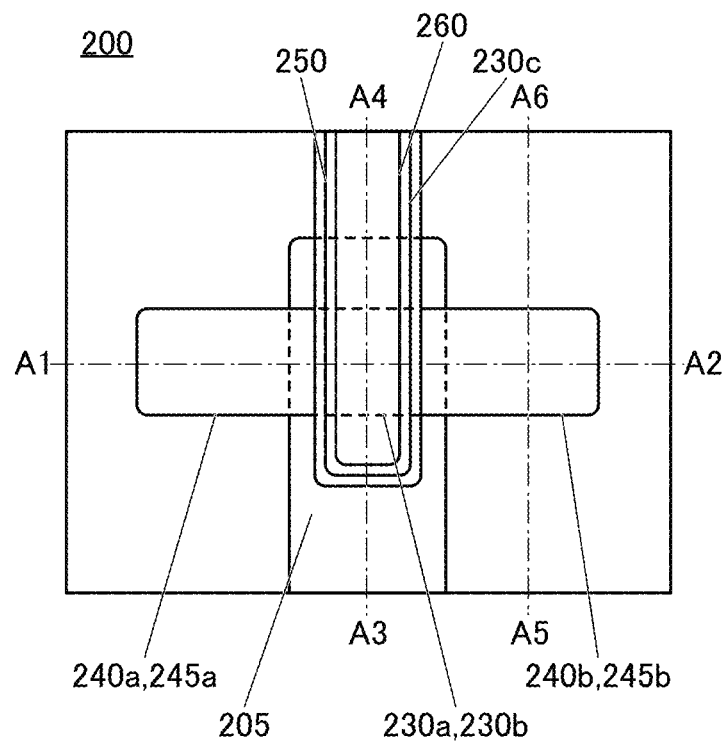
FIG. 5A, FIG. 5B, FIG. 5C, and FIG. 5D are a top view and cross-sectional views of a semiconductor device of one embodiment of the present invention.
Figure 5C:
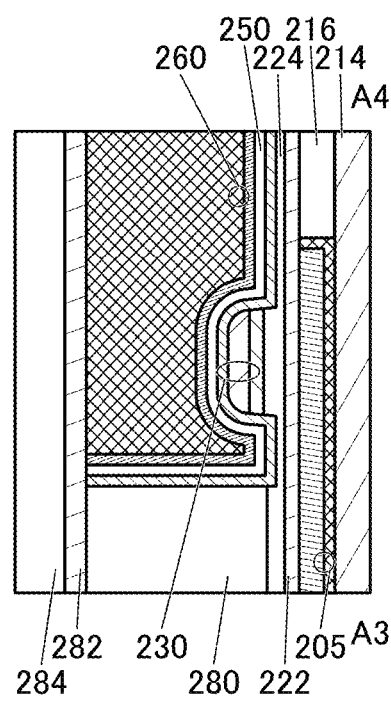
Figure 5B:
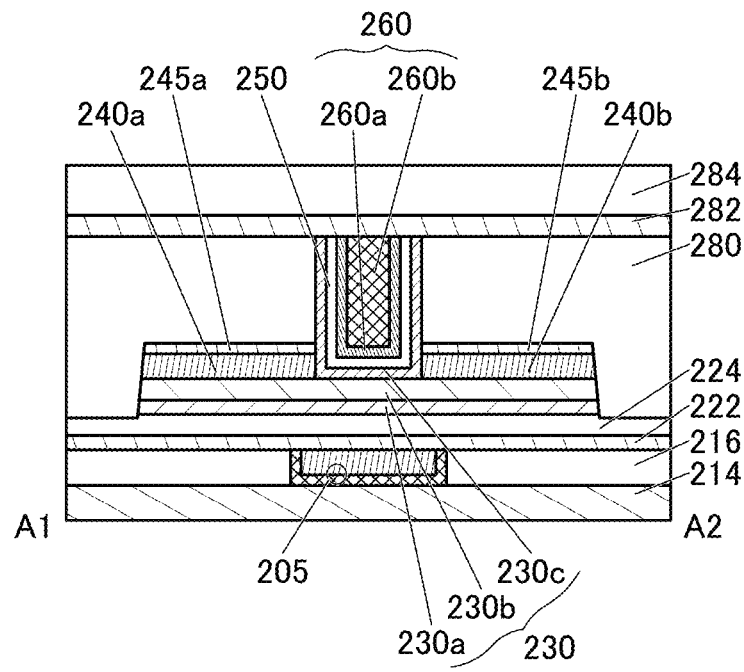
Figure 5D:
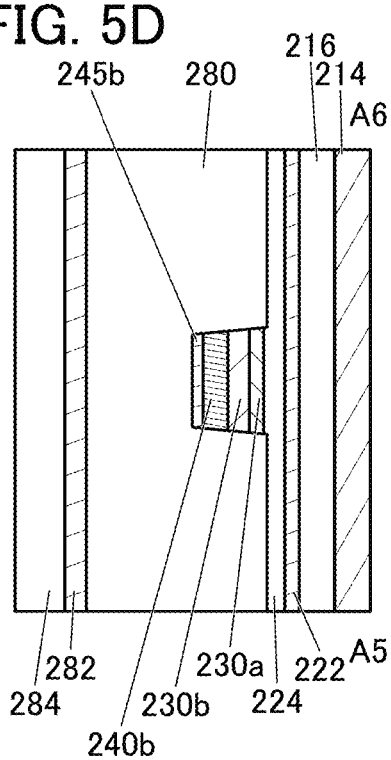

FIG. 5A to FIG. 5D includes a top view and cross-sectional views of a semiconductor device including the transistor 200 of one embodiment of the present invention. FIG. 5A is a top view of the semiconductor device. FIG. 5B to FIG. 5D are cross-sectional views of the semiconductor device. Here, FIG. 5B is a cross-sectional view of a portion indicated by the dashed-dotted line A1-A2 in FIG. 5A. FIG. 5C is a cross-sectional view of a portion indicated by the dashed-dotted line A3-A4 in FIG. 5A. FIG. 5D is a cross-sectional view of a portion indicated by dashed-dotted line A5-A6 in FIG. 5A. Note that for clarity of the drawing, some components are not shown in the top view of FIG. 5A.

The semiconductor device of one embodiment of the present invention includes the transistor 200, and an insulator 214, an insulator 216, the insulator 280, the insulator 282, and the insulator 284, which function as interlayer films. The insulator 280 is provided to be in contact with at least an oxide 230.

[Transistor 200]

As shown in FIG. 5A to FIG. 5D, the transistor 200 includes a conductor 205 that is positioned over a substrate (not illustrated) to be embedded in the insulator 216; an insulator 222 positioned over the insulator 216 and the conductor 205; an insulator 224 positioned over the insulator 222; the oxide 230 (an oxide 230a, an oxide 230b, an oxide 230c) positioned over the insulator 224; an insulator 250 positioned over the oxide 230; a conductor 260 (a conductor 260a and a conductor 260b) positioned over the insulator 250; a conductor 240a and a conductor 240b in contact with part of the top surface of the oxide 230b; an insulator 245a over the conductor 240a; and an insulator 245b over the conductor 240b.

In the transistor 200, a metal oxide functioning as an oxide semiconductor (hereinafter also referred to as an oxide semiconductor) is preferably used as the oxide 230 (the oxide 230a, the oxide 230b, and the oxide 230c), which includes a region where a channel is formed (hereinafter also referred to as a channel formation region).

The oxide semiconductor functioning as the channel formation region has a band gap of preferably 2 eV or higher, further preferably 2.5 eV or higher. With the use of an oxide semiconductor having such a wide band gap, the off-state current of the transistor can be reduced.

Note that the oxide 230 preferably has a stacked-layer structure using oxides with different chemical compositions. Specifically, the atomic ratio of the element M to In in the metal oxide used as the oxide 230a is preferably greater than the atomic ratio of the element M to In in the metal oxide used as the oxide 230b.

A metal oxide that can be used as the oxide 230a or the oxide 230b can be used as the oxide 230c.

For example, an In—Ga—Zn oxide, a Ga—Zn oxide, gallium oxide, or the like may be used as the oxide 230a and the oxide 230c when the oxide 230b is an In—Ga—Zn oxide.

The oxide 230b and the oxide 230c preferably have crystallinity. For example, a CAAC-(c-axis aligned crystalline oxide semiconductor) described below is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

Although a structure in which the oxide 230 has a three-layer stacked structure of the oxide 230a, the oxide 230b, and the oxide 230c in the transistor 200 is described, the present invention is not limited thereto. For example, the oxide 230 may be a single layer of the oxide 230b or has a two-layer structure of the oxide 230a and the oxide 230b, a two-layer structure of the oxide 230b and the oxide 230c, or a stacked-layer structure including four or more layers. Alternatively, each of the oxide 230a, the oxide 230b, and the oxide 230c may have a stacked-layer structure.

As shown in FIG. 5D, it is preferable that at least a side surface of the oxide 230b and a side surface of the conductor 240 be substantially perpendicular to the surface where the insulator 224 and the oxide 230a are in contact with each other. Specifically, in FIG. 5D, a side surface of the oxide 230b and a side surface of the conductor 240, and the surface where the insulator 224 and the oxide 230a are in contact with each other form an angle within the range of 60 degrees to 95 degrees, preferably within the range of 88 degrees to 92 degrees.

As shown in FIG. 5C, an upper end portion of the oxide 230 in a channel formation region preferably has a shape with curvature. That is, in the channel formation region, the top surface and the side surface of the oxide 230 are preferably smoothly connected with a curved surface without a corner. Since there is no corner in the channel formation region, concentration of electric field due to one or both of an electric field of the conductor 260 functioning as the first gate electrode and the conductor 205 functioning as the second gate electrode is not caused, and deterioration of the oxide 230 can be suppressed.

On the other hand, as shown in FIG. 5D, the upper end portions of the oxide 230 in a region overlapping with the conductor 240 preferably have a smaller curvature than the upper end portions of the oxide 230 in the channel formation region. The above structure can be formed by processing the oxide 230b and the conductor 240 with the same mask. Accordingly, the conductor 240 overlaps with the projected area of the oxide 230b, which leads to a minute transistor.

The conductor 260 functions as a first gate electrode (also referred to as a top gate).

Here, the conductor 260 is embedded in an opening in the insulator 280 and the like to form the transistor 200. In the step of forming the opening, part of a conductive layer to be the conductor 240 is exposed at the bottom of the opening in the insulator 280. In the conductive layer to be the conductor 240, a region overlapping with the bottom of the opening provided in the insulator 280 is removed, so that the conductor 240a and the conductor 240b are formed.

Therefore, an end portion of the conductor 240a and an end portion of the conductor 240b are on the same plane as the side surfaces of the opening. The conductor 260 is embedded in the opening formed in the insulator 280 with the insulator 250 and the like therebetween, whereby the conductor 260 can be arranged in a self-aligned manner without alignment in a region between the conductor 240a and the conductor 240b.

Moreover, as shown in FIG. 5B or FIG. 5C, the top surface of the conductor 260 is substantially aligned with the top surface of the insulator 250 and the top surface of the oxide 230c.

In a region where the conductor 260 does not overlap with the oxide 230, the shortest distance between the surface where the conductor 260 is in contact with the insulator 250 and the top surface of the insulator 222 is preferably shorter than the shortest distance between the surface where the oxide 230b is in contact with the oxide 230a and the top surface of the insulator 222, as shown in FIG. 5C. That is, in the channel width direction of the transistor 200, a side surface of the oxide 230b is covered by the conductor 260 with at least the insulator 250 therebetween.

When the conductor 260 functioning as the gate electrode covers the side and top surfaces of the channel formation region of the oxide 230b with the insulator 250 and the like therebetween, the electric field of the conductor 260 is likely to affect the entire channel formation region of the oxide 230b. Thus, the on-state current of the transistor 200 can be increased and the frequency characteristics of the transistor 200 can be improved.

Note that the conductor 260 preferably includes the conductor 260a and the conductor 260b positioned over the conductor 260a. For example, the conductor 260a is preferably positioned to cover a bottom surface and a side surface of the conductor 260b.

As the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used.

Alternatively, it is preferable to use a conductive material having a function of inhibiting diffusion of oxygen (e.g., at least one of oxygen atoms, oxygen molecules, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting oxygen diffusion, tantalum, tantalum nitride, rthenium, or rthenium oxide is preferably used, for example.

The conductor 260 also functions as a wiring and thus is preferably formed using a conductor having high conductivity. For example, a conductive material containing tungsten, copper, or aluminum as its main component can be used as the conductor 260b. The conductor 260b may have a stacked-layer structure; for example, a stacked-layer structure of titanium or titanium nitride and the above conductive material may be employed.

Although the conductor 260 has a two-layer structure of the conductor 260a and the conductor 260b in FIG. 5A to FIG. 5D, the conductor 260 can have a single-layer structure or a stacked-layer structure of three or more layers.

The conductor 205 sometimes functions as a second gate (also referred to as bottom gate) electrode.

When the conductor 205 functions as a gate electrode, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, drain current when a potential applied to the conductor 260 is 0 V can be lower in the case where a negative potential is applied to the conductor 205 than in the case where the negative potential is not applied to the conductor 205.

The conductor 205 is provided to overlap with the oxide 230 and the conductor 260. Furthermore, the conductor 205 is preferably provided to be embedded in the insulator 214 or the insulator 216.

Note that in the channel width direction, the conductor 205 is preferably provided larger than the channel formation region of the oxide 230. As shown in FIG. 5C, it is particularly preferable that the conductor 205 extend to a region outside an end portion of the oxide 230 that intersects with the channel width direction.

That is, the conductor 205 and the conductor 260 preferably overlap with each other with the insulators therebetween on an outer side of the side surface of the oxide 230 in the channel width direction. Since the above-described structure is included, the channel formation region of the oxide 230 can be electrically surrounded by the electric field of the conductor 260 functioning as the first gate electrode and the electric field of the conductor 205 functioning as the second gate electrode.

In FIG. 5A to FIG. 5D, the conductor 205 has a structure in which a first conductor and a second conductor are stacked, and the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, for the first conductor of the conductor 205, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom is preferably used. Alternatively, it is preferable to use a conductive material having a function of inhibiting diffusion of oxygen (e.g., at least one of oxygen atoms, oxygen molecules, and the like).

When a conductive material having a function of inhibiting diffusion of oxygen is used for the first conductor of the conductor 205, a reduction in the conductivity of the second conductor of the conductor 205 due to oxidation can be inhibited. As a conductive material having a function of inhibiting oxygen diffusion, tantalum, tantalum nitride, ruthenium, or ruthenium oxide is preferably used, for example. Accordingly, the first conductor of the conductor 205 is a single layer or stacked layers of the above conductive materials. For example, the first conductor of the conductor 205 may be a stack of tantalum, tantalum nitride, ruthenium, or ruthenium oxide and titanium or titanium nitride.

A conductive material containing tungsten, copper, or aluminum as its main component is preferably used for the second conductor of the conductor 205. Note that the second conductor of the conductor 205 is a single layer in the drawing but may have a stacked-layer structure, for example, a stacked-layer structure of the above conductive material and titanium or titanium nitride.

Furthermore, as shown in FIG. 5C, the conductor 205 extends to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

The conductor 240 (the conductor 240a and the conductor 240b) functions as a source electrode or a drain electrode.

As the conductor 240, $TaN_xO_y$ is preferably used, for example. Note that $TaN_xO_y$ may contain aluminum. As another example, titanium nitride, a nitride containing titanium and aluminum, ruthenium oxide, an oxide containing strontium and ruthenium, or an oxide containing lanthanum and nickel may be used. These materials are preferable because they are conductive materials that are not easily oxidized or materials that maintain the conductivity even when absorbing oxygen.

Over the conductor 240, an insulator 245 functioning as a barrier layer is preferably provided.

The insulator 245 is preferably in contact with the top surface of the conductor 240 as shown in FIG. 5B. The structure can inhibit absorption of excess oxygen in the insulator 280 by the conductor 240. Furthermore, by inhibiting oxidation of the conductor 240, an increase in the contact resistance between the transistor 200 and a wiring can be inhibited. Consequently, the transistor 200 can have favorable electrical characteristics and reliability.

The insulator 245 preferably has a function of inhibiting diffusion of oxygen. For example, the insulator 245 preferably has a function of inhibiting oxygen diffusion more than the insulator 280.

An insulator containing an oxide of one or both of aluminum and hafnium is preferably deposited as the insulator 245, for example. An insulator containing aluminum nitride may be used as the insulator 245, for example.

The insulator 250 functions as the first gate insulator.

The insulator 250 is preferably positioned in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Thus, microwave-excited plasma treatment is preferably performed under an atmosphere containing oxygen after the insulator 250 is deposited. By performing microwave-excited plasma treatment, an impurity in the insulator 250, such as hydrogen, water, or an impurity can be removed. Furthermore, microwave-excited plasma treatment improves the film quality of the insulator 250, whereby diffusion of hydrogen, water, an impurity, or the like can be inhibited. Accordingly, hydrogen, water, or an impurity can be inhibited from being diffused into the oxide 230 through the insulator 250 in the following step such as deposition of a conductive film to be the conductor 260 or the following treatment such as heat treatment.

In solid silicon oxide, for example, bond energy between a hydrogen atom and a silicon atom is 3.3 eV, bond energy between a carbon atom and a silicon atom is 3.4 eV, and bond energy between a nitrogen atom and a silicon atom is 3.5 eV. Thus, in order to remove a hydrogen atom bonded to a silicon atom, radicals or ions having an energy of at least greater than or equal to 3.3 eV are made to collide with a bond portion between the hydrogen atom and the silicon atom to cut the bond between the hydrogen atom and the silicon atom.

Note that the same applies to other impurities such as nitrogen and carbon; radicals or ions having energy at least greater than or equal to bond energy are made to collide with a bond portion between an impurity atom and a silicon atom to cut the bond between the impurity atom and the silicon atom.

Here, examples of radicals and ions generated by microwave-excited plasma include $O(^3P)$, which is an oxygen atom radical in the ground state, $O(^1D)$, which is an oxygen atom radical in the first excited state, and $O_2^+$, which is a monovalent cation of an oxygen molecule. The energy of $O(^3P)$ is 2.42 eV, and the energy of $O(^1D)$ is 4.6 eV. Furthermore, the energy of $O_2^+$ having charges is not uniquely determined because it is accelerated by the potential distribution in plasma and a bias; however, at least only the internal energy is higher than the energy of $O(^1D)$.

That is, radicals and ions such as $O(^1D)$ and $O_2^+$ can cut the bond between each of hydrogen, nitrogen, and a carbon atom in the insulator 250 and a silicon atom to remove hydrogen, nitrogen, and carbon bonded to the silicon atom. Furthermore, the impurities such as hydrogen, nitrogen, and carbon can also be reduced by thermal energy and the like applied to a substrate in performing the microwave-excited plasma treatment.

On the other hand, $O(^3P)$ has low reactivity, and thus does not react in the insulator 250 and is diffused deeply in the film. Alternatively, $O(^3P)$ reaches the oxide 230 through the insulator 250, and is diffused into the oxide 230. When $O(^3P)$ diffused into the oxide 230 comes close to the oxygen vacancy hydrogen enters, hydrogen in the oxygen vacancy is released from the oxygen vacancy and $O(^3P)$ enters the oxygen vacancy instead; thus, the oxygen vacancy is filled. Accordingly, an electron serving as a carrier can be inhibited from being generated in the oxide 230.

The proportion of $O(^3P)$ in the total radicals and ion species increases when microwave-excited plasma treatment is performed under a high pressure condition. The proportion of $O(^3P)$ is preferably high for compensation of the oxygen vacancies in the oxide 230. Thus, the pressure during the microwave-excited plasma treatment is higher than or equal to 133 Pa, preferably 200 Pa, further preferably higher than or equal to 400 Pa. Furthermore, the oxygen flow rate ratio ($O_2/O_2+Ar$) is lower than or equal to 50%, preferably higher than or equal to 10% and lower than or equal to 30%.

As the insulator 250, specifically, an oxide material from which part of oxygen is released by heating is preferably used. An oxide that releases oxygen by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^2$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

When an insulator that releases oxygen by heating is provided as the insulator 250 in contact with the top surface of the oxide 230c, oxygen can be efficiently supplied to the channel formation region of the oxide 230b and oxygen vacancies in the channel formation region of the oxide 230b can be reduced. Consequently, a transistor that has stable electrical characteristics with a small variation in electrical characteristics and improved reliability can be provided. The concentration of impurities such as water and hydrogen in the insulator 250 is preferably reduced.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

Note that the metal oxide functions as part of the gate insulator in some cases. Therefore, when silicon oxide, silicon oxynitride, or the like is used as the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, an insulator containing an oxide of one or both of aluminum and hafnium is preferably used.

The metal oxide may have a function of part of the first gate electrode. For example, an oxide semiconductor that can be used as the oxide 230 can be used as the metal oxide. In that case, when the conductor 260 is deposited by a sputtering method, the metal oxide can have a reduced electric resistance to be a conductor.

With the metal oxide, the on-state current of the transistor 200 can be increased without a reduction in the influence of the electric field from the conductor 260. Since the distance between the conductor 260 and the oxide 230 is kept by the physical thicknesses of the insulator 250 and the metal oxide, leakage current between the conductor 260 and the oxide 230 can be reduced. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The insulator 222 and the insulator 224 function as a second gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

As the insulator 222, an insulator containing an oxide of one or both of aluminum and hafnium, which is an insulating material, is preferably used. In particular, it is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

A single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) may be used as the insulator 222. With miniaturization and high integration of transistors, a problem such as leakage current may arise because of a thinner gate insulator. When a high-k material is used as an insulator functioning as the gate insulator, a gate potential during operation of the transistor can be lowered while the physical thickness of the gate insulator is kept.

It is preferable that oxygen be released from the insulator 224 in contact with the oxide 230 by heating like the insulator 250. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

Note that the insulator 222 and the insulator 224 may each have a stacked-layer structure of two or more layers. In such cases, without limitation to a stacked-layer structure formed of the same material, a stacked-layer structure formed of different materials may be employed.

The insulator 214, the insulator 216, the insulator 280, the insulator 282, and the insulator 284 function as interlayer films.

The insulator 214 preferably functions as an insulating barrier film that inhibits diffusion of impurities such as water and hydrogen from the substrate side into the transistor 200. Accordingly, as the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use an insulating material having a function of inhibiting diffusion of oxygen (e.g., at least one of an oxygen atom, an oxygen molecule, and the like).

For example, aluminum oxide, silicon nitride, or the like is preferably used as the insulator 214. Accordingly, impurities such as water and hydrogen can be inhibited from being diffused into the transistor 200 side from the substrate side through the insulator 214. Alternatively, oxygen contained in the insulator 224 and the like can be inhibited from being diffused to the substrate side through the insulator 214. Note that the insulator 214 may have a stacked-layer structure of two or more layers. In such cases, without limitation to a stacked-layer structure formed of the same material, a stacked-layer structure formed of different materials may be employed. For example, a stack of aluminum oxide and silicon nitride may be employed.

Furthermore, the insulator 214 is preferably formed of silicon nitride by a sputtering method, for example. In this manner, the hydrogen concentration in the insulator 214 can be reduced, and impurities such as water and hydrogen can be further inhibited from being diffused into the transistor 200 side from the substrate side through the insulator 214.

The permittivity of the insulator 216 functioning as an interlayer film is preferably lower than the permittivity of the insulator 214. When a material with a low dielectric constant is used as an interlayer film, the parasitic capacitance generated between wirings can be reduced. For the insulator 216, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 216 preferably includes a region that has a low hydrogen concentration and contains oxygen in excess of that in the stoichiometric composition (hereinafter also referred to as an excess-oxygen region), or preferably contains oxygen that is released by heating (hereinafter also referred to as excess oxygen). For example, silicon oxide deposited by a sputtering method is preferably used as the insulator 216. Thus, entry of hydrogen into the oxide 230 can be inhibited; alternatively, oxygen can be supplied to the oxide 230 to reduce oxygen vacancies in the oxide 230. Consequently, a transistor that has stable electrical characteristics with a small variation in electrical characteristics and improved reliability can be provided.

Note that the insulator 216 may have a stacked-layer structure. For example, in the insulator 216, an insulator similar to the insulator 214 may be provided at least in a portion in contact with a side surface of the conductor 205. With such a structure, oxidization of the conductor 205 due to oxygen contained in the insulator 216 can be inhibited. Alternatively, a reduction in the amount of oxygen contained in the insulator 216 due to the conductor 205 can be inhibited.

The insulator 280 is provided over the insulator 224, the oxide 230, and the conductor 240. In addition, the top surface of the insulator 280 may be planarized.

The insulator 280 functioning as an interlayer film preferably has a low permittivity. When a material with a low dielectric constant is used as an interlayer film, the parasitic capacitance generated between wirings can be reduced. The insulator 280 is preferably formed using a material similar to that used as the insulator 216, for example. In particular, silicon oxide and silicon oxynitride, which have thermal stability are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably reduced. Moreover, the insulator 280 preferably has a low hydrogen concentration and includes an excess-oxygen region or excess oxygen, and may be formed using a material similar to that for the insulator 216, for example. Note that the insulator 280 may have a stacked-layer structure of two or more layers.

Like the insulator 214 and the like, the insulator 282 preferably functions as an insulating barrier film that inhibits diffusion of impurities such as water and hydrogen into the insulator 280 from the upper area. In addition, like the insulator 214 and the like, the insulator 282 preferably has a low hydrogen concentration and has a function of inhibiting diffusion of hydrogen.

As shown in FIG. 5B, the insulator 282 is preferably in contact with the top surfaces of the conductor 260, the insulator 250, and the oxide 230c. This can inhibit entry of impurities such as hydrogen contained in the insulator 284 and the like into the insulator 250. Thus, adverse effects on the electrical characteristics of the transistor and the reliability of the transistor can be suppressed.

The insulator 284 functioning as an interlayer film is preferably provided over the insulator 282. Like the insulator 216 or the like, the insulator 284 preferably has a low permittivity. As in the insulator 224 and the like, the concentration of impurities such as water and hydrogen in the insulator 284 is preferably reduced.

<Constituent Materials of Semiconductor Device>

Constituent materials that can be used to the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used as the insulator functioning as a gate insulator, the voltage during operation of the transistor can be lowered while the physical thickness of the gate insulator is maintained. In contrast, when a material with a low dielectric constant is used for the insulator functioning as an interlayer film, the parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of oxygen and impurities such as hydrogen (e.g., the insulator 214, the insulator 222, the insulator 245, the insulator 282, and the like), the electrical characteristics of the transistor can be stable. As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that maintain the conductivity even when absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as an oxide semiconductor is preferably used. A metal oxide that can be used as the oxide 230 according to the present invention is described below.

The metal oxide preferably contains at least indium or zinc. In particular, indium and zinc are preferably contained. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals is connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide is described.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

The above-described defect states may include a trap state. Charges trapped by the trap states in the metal oxide take a long time to be released and may behave like fixed charges. Thus, a transistor whose channel formation region includes a metal oxide having a high density of trap states has unstable electrical characteristics in some cases.

If the impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, an alkali metal, an alkaline earth metal, iron, nickel, and silicon.

Specifically, the concentration of the above impurities obtained by SIMS is lower than or equal to $1 \times 10^{18}$ atoms/cm$^3$, preferably lower than or equal to $2 \times 10^{16}$ atoms/cm$^3$ in and around the channel formation region of the oxide semiconductor. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates electrons serving as carriers.

Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of a transistor.

Accordingly, the amount of VoH in the metal oxide is preferably reduced as much as possible so that the metal oxide becomes a highly purified intrinsic or substantially highly purified intrinsic metal oxide. It is effective to remove impurities such as water and hydrogen in an oxide semiconductor (sometimes described as dehydration or dehydrogenation treatment) and to compensate for oxygen vacancies by supplying oxygen to the oxide semiconductor (sometimes described as oxygen supplying treatment) to obtain an oxide semiconductor whose VoH is reduced enough. When an oxide semiconductor with a sufficiently low concentration of impurities such as VoH is used for a channel formation region of a transistor, the transistor can have stable electrical characteristics.

An oxide semiconductor with a low carrier concentration is preferably used for a transistor. In the case where the carrier concentration of an oxide semiconductor is reduced, the impurity concentration in the oxide semiconductor is reduced to reduce the density of defect states. In this specification and the like, a state with a low impurity concentration and a low density of defect states is referred to as a highly purified intrinsic or substantially highly purified intrinsic state. As examples of the impurities in the oxide semiconductor, hydrogen, nitrogen, alkali metal, alkaline earth metal, iron, nickel, silicon, and the like are given.

In particular, hydrogen contained in an oxide semiconductor reacts with oxygen bonded to a metal atom to be water, and thus forms oxygen vacancies in the oxide semiconductor in some cases. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy (VoH) can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The carrier concentration of the oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{3^1}$ cm$^{-3}$, and yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^{-3}$.

[Relations Between Carrier Concentration, Sheet Resistance, and Fermi Level]

In this example, the relations between the carrier concentration, the sheet resistance, and the Fermi level of the metal oxide functioning as an oxide semiconductor are described.

Generally, it is known that the relation between the carrier concentration and the sheet resistance of a semiconductor satisfies the following Formula (1), when the carrier concentration is n, the sheet resistance is Rs, the elementary charge is e, the mobility is µ, and the film thickness is t.

[Formula 1]

$$n = \frac{1}{e\mu R_s t} \qquad (1)$$

Figure 8:
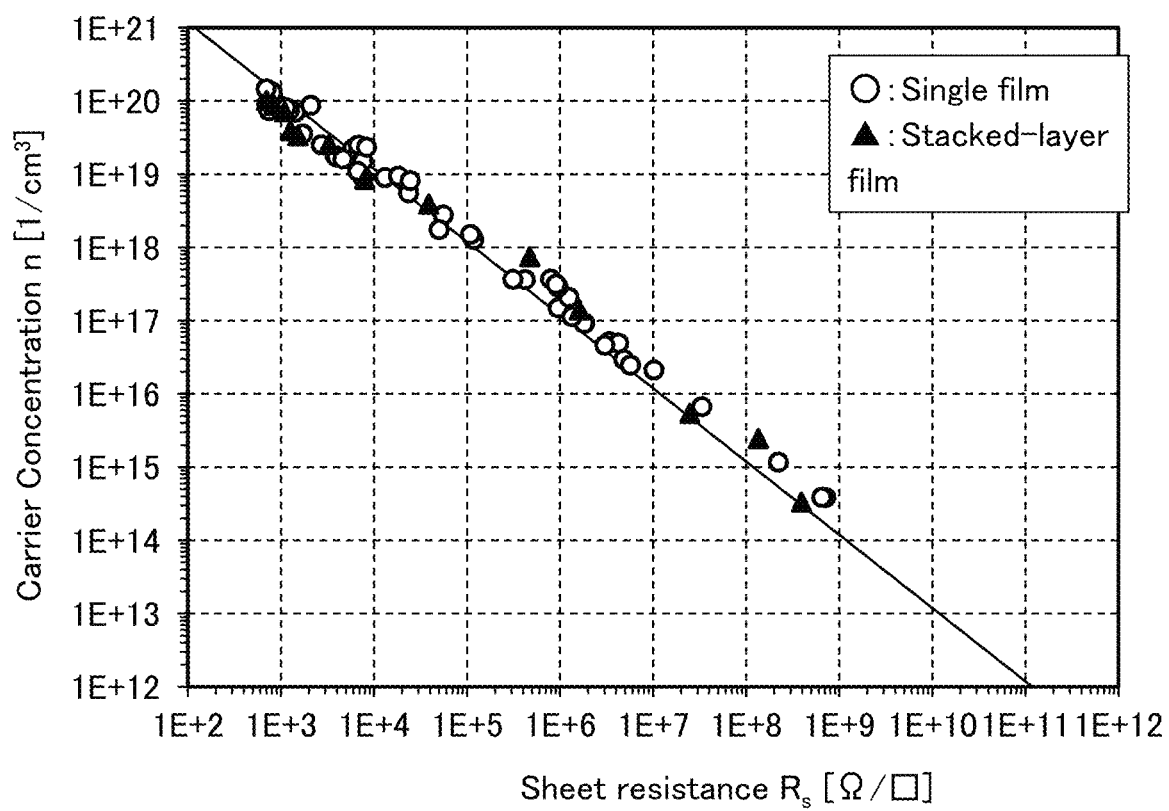
FIG. 8 is a diagram showing the relation between carrier concentration and sheet resistance.

FIG. 8 is a diagram in which the relation between the carrier concentration and the sheet resistance of 70 kinds of samples is plotted; the samples are oxide semiconductor films formed using the sputtering target with the same composition, and subjected to treatments such as bake treatment to change their carrier concentrations. The oxide semiconductor films are formed using a metal oxide sputtering target whose metal element composition is In:Zn:Ga=4:2:4.1 (atomic ratio) and the thickness of the oxide semiconductor films is about 35 nm. In FIG. 8, the data denoted by circles are the data of single-film oxide semiconductor samples (sample size: 53) and the data denoted by triangles are the data of stacked-film samples, in which a protective film such as a silicon oxynitride film is formed over the oxide semiconductor film (sample size: 17).

In FIG. 8, the straight line satisfying the above Formula (1) is also shown. Here, the mobility µ is 15 cm$^2$/Vs and the film thickness t is 35 nm for a calculation. The mobility µ is actually a function of the carrier concentration n, but is a constant for a calculation here.

As shown in FIG. 8, the actual measurement values of the carrier concentration and the sheet resistance of the oxide semiconductor films satisfy the Formula (1) when the oxide semiconductor films formed with the sputtering target with the same composition are used.

Figure 9A:
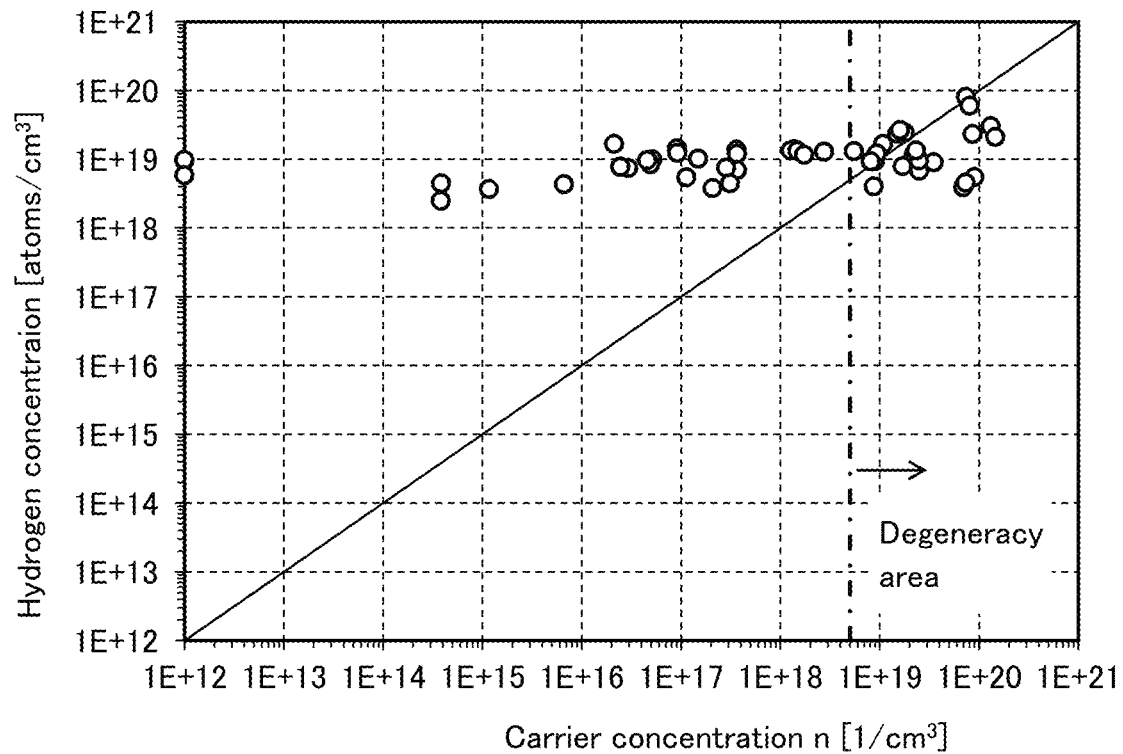
FIG. 9A and FIG. 9B are diagrams each showing the relation between carrier concentration and hydrogen concentration.
Figure 9B:
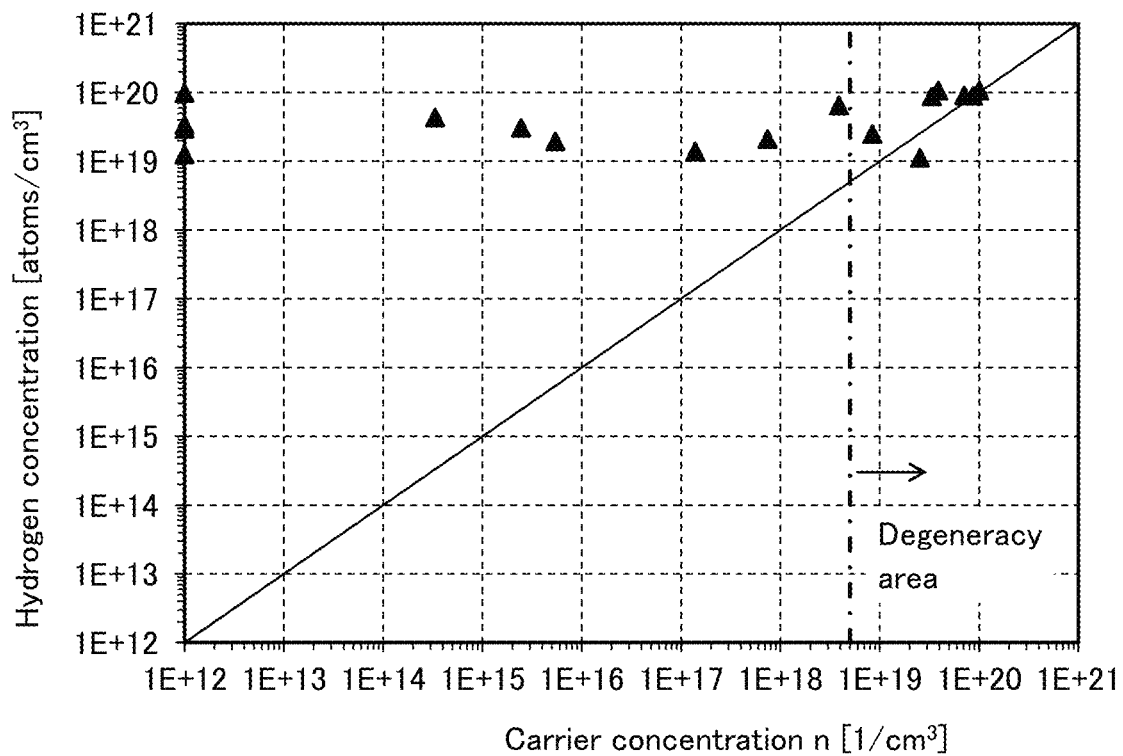

FIG. 9A and FIG. 9B are diagrams of the relations between the hydrogen concentration and the carrier concentration of the same 70 kinds of the samples as in FIG. 8. The data of the single-film samples are plotted in FIG. 9A, and the data of the samples of an oxide semiconductor film with the protective film thereover are plotted in FIG. 9B.

As the carrier concentration in the oxide semiconductor film decreases, the hydrogen concentration and the carrier concentration tend to separate as shown in FIG. 9A and FIG. 9B. On the other hand, in the area where the carriers in the semiconductor film are degenerated (also referred to as degeneracy area), that is, the area where the Fermi level is over the conduction band minimum (the area where the carrier concentration is $5\times10^{18}$ cm$^{-3}$ or more), the hydrogen concentration and the carrier concentration tend to be almost the same.

The results of FIG. 9A and FIG. 9B suggest that almost all of the hydrogen in the oxide semiconductor film in the degeneracy area contribute to generating carriers (conduction electrons). On the other hand, the results suggest that some hydrogen do not contribute to generating carriers (conduction electrons) due to change of the hydrogen state in the non-degeneracy area.

Figure 10:
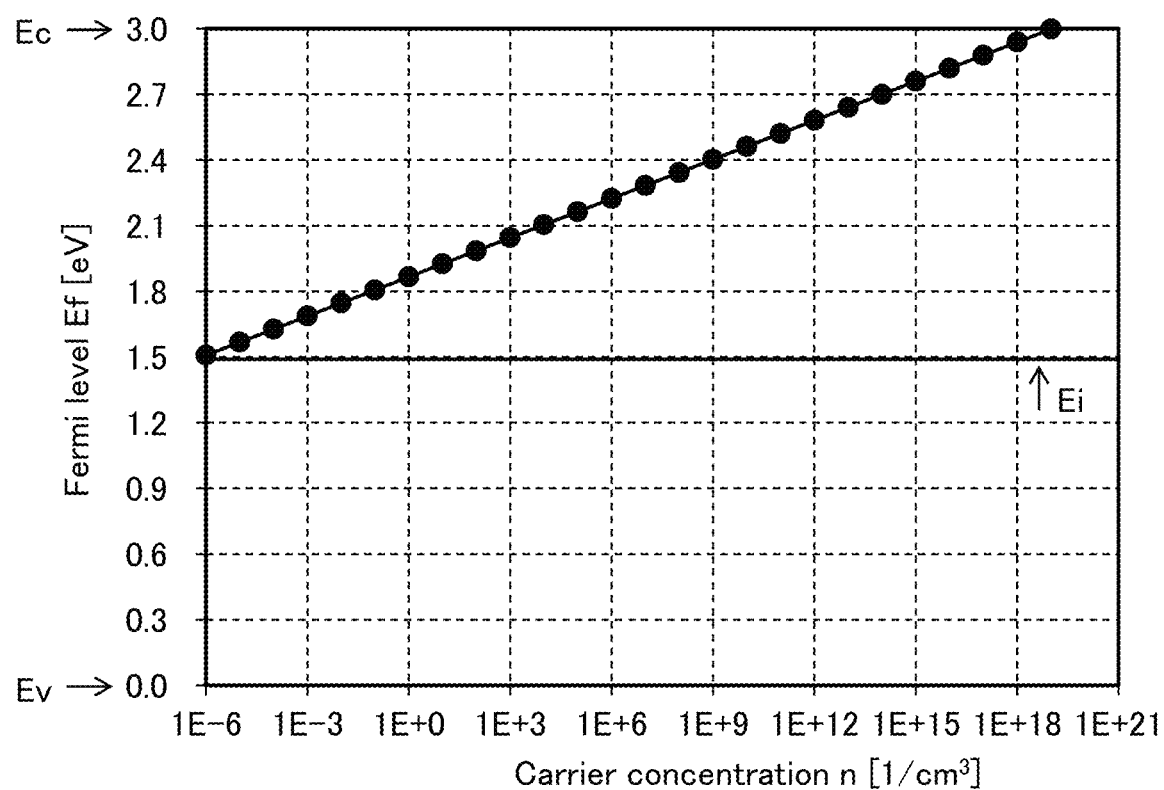
FIG. 10 is a diagram showing the relation between carrier concentration and the Fermi level.

Next, the relation between the carrier concentration n and the Fermi level Ef of an In—Ga—Zn oxide film whose metal element composition is In:Zn:Ga=4:2:3 (atomic ratio) in FIG. 10 is shown. Here shows the result in which a temperature was 300 K in the calculation.

As shown in FIG. 10, the Fermi level Ef depends on the carrier concentration n, and the higher the carrier concentration n is, the closer the Fermi level Ef becomes to the conduction band minimum (Ec). For example, when the carrier concentration n is $1 \times 10^{12}$ cm$^3$, the Fermi level Ef is positioned approximately 0.4 eV below the conduction band minimum (Ec). In addition, when the carrier concentration n is $1 \times 10^{-6}$ cm$^{-3}$, the Fermi level Ef is substantially the same as the intrinsic Fermi level (Ei).

In the case of an In—Ga—Zn oxide film whose metal element composition is In:Zn:Ga=1:1:1 (atomic ratio), the carrier concentration where the Fermi level Ef is substantially the same as the intrinsic Fermi level (Ei) is $1 \times 10^{-9}$ cm$^{-3}$.

The standard of the carrier concentration (donor concentration) of the oxide semiconductor film to obtain normally-off electrical characteristics of a transistor using the oxide semiconductor film is about less than or equal to $1 \times 10^{16}$ cm$^{-3}$, and when the carrier concentration is less than or equal to it, the oxide semiconductor can be substantially seen as i-type. FIG. 10 shows that the Fermi level Ef is positioned near the conduction band minimum (Ec) when the carrier concentration n is $1 \times 10^{16}$ cm$^{-3}$.

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. Another object of one embodiment of the present invention is to provide a semiconductor device with low power consumption.

<Modification Example of Semiconductor Device>

An example of a semiconductor device including a transistor 200 of one embodiment of the present invention is described below using FIG. 6A to FIG. 6C.

Figure 6A:
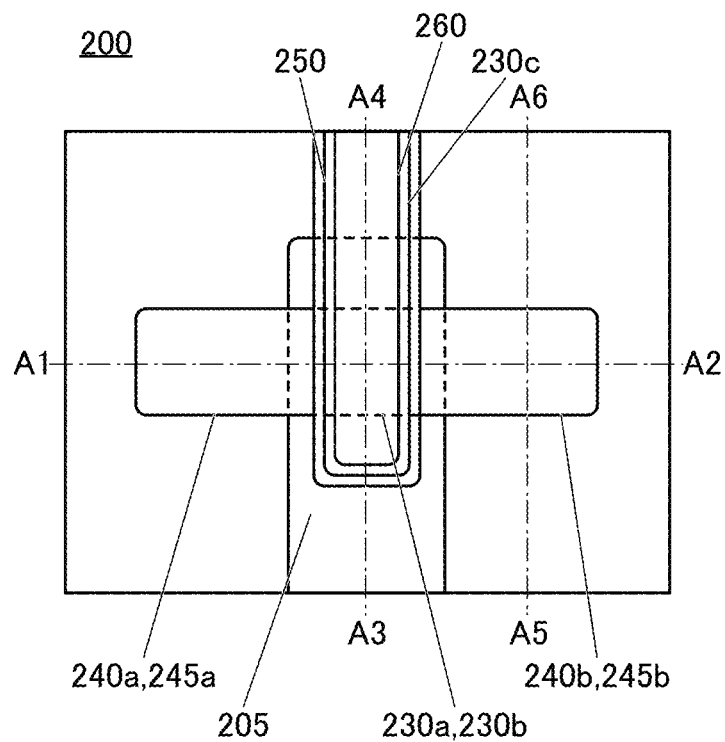
FIG. 6A, FIG. 6B, and FIG. 6C are a top view and cross-sectional views of a semiconductor device of one embodiment of the present invention.

Here, FIG. 6A is atop view. FIG. 6B is a cross-sectional view corresponding to a portion indicated by the dashed-dotted line A1-A2 in FIG. 6A. FIG. 6C is a cross-sectional view corresponding to a portion indicated by the dashed-dotted line A3-A4 in FIG. 6A. For clarity of the drawing, some components are not shown in the top view of FIG. 6A.

Figure 6C:
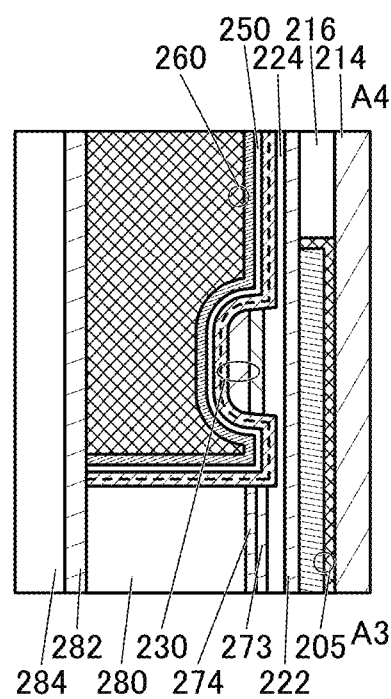
Figure 6B:
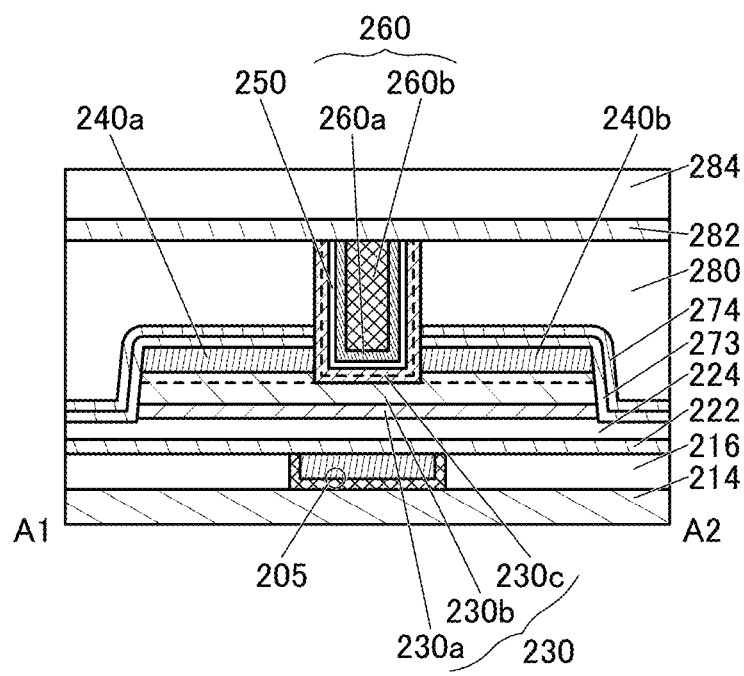

The semiconductor device shown in FIG. 6A to FIG. 6C is different from the semiconductor device shown in FIG. 5A to FIG. 5D in that the oxide 230b has a stacked-layer structure. Additionally, it is different in that the oxide 230c has a stacked-layer structure. Additionally, it is different in that an insulator 273 and an insulator 274 are included.

The oxide 230c may have a stacked-layer structure of two or more layers. For example, in FIG. 6A to FIG. 6C, the first oxide of the oxide 230c and the second oxide of the oxide 230c over the first oxide of the oxide 230c are included.

Specifically, the first oxide of the oxide 230c preferably contains at least one of the metal elements contained in the metal oxide used in the oxide 230b, and further preferably contains all of these metal elements. For example, it is preferable that an In—Ga—Zn oxide be used as the first oxide of the oxide 230c, and an In—Ga—Zn oxide, a Ga—Zn oxide, or gallium oxide be used as the second oxide of the oxide 230c. Owing to the structure, the density of defect states at the interface between the oxide 230b and the first oxide of the oxide 230c can be decreased.

The second oxide of the oxide 230c is preferably a metal oxide that inhibits diffusion or passage of oxygen, compared to the first oxide of the oxide 230c. Providing the second oxide of the oxide 230c between the insulator 250 and the first oxide of the oxide 230c can inhibit diffusion of oxygen contained in the insulator 280 into the insulator 250. Therefore, the oxygen is more likely to be supplied to the oxide 230b through the first oxide of the oxide 230c.

When the atomic ratio of In to the metal element of the main component in the metal oxide used as the second oxide of the oxide 230c is smaller than the atomic ratio of In to the metal element of the main component in the metal oxide used as the first oxide of the oxide 230c, the diffusion of In into the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

The oxide 230b may have a stacked-layer structure of two or more layers. For example, in FIG. 6A to FIG. 6C, the first oxide of the oxide 230b and the second oxide of the oxide 230b over the first oxide of the oxide 230b are included.

Specifically, the second oxide of the oxide 230b is preferably provided between the first oxide of the oxide 230b and the conductor 240 (the conductor 240a and the conductor 240b) functioning as a source electrode and a drain electrode. In the structure, the second oxide of the oxide 230b preferably has a function of inhibiting passage of oxygen.

It is preferable to provide the second oxide of the oxide 230b having a function of inhibiting passage of oxygen between the first oxide of the oxide 230b and the conductor 240 which functions as the source electrode and the drain electrode, in which case the electrical resistance between the conductor 240 and the first oxide of the oxide 230b is reduced. Such a structure can improve the electrical characteristics of the transistor 200 and the reliability of the transistor 200.

The conductor 240 and the first oxide of the oxide 230b are not in contact with each other, which inhibit the conductor 240 from absorbing oxygen in the first oxide of the oxide 230b. Preventing oxidation of the conductor 240 can inhibit the decrease in conductivity of the conductor 240.

A metal oxide containing the element M may be used as the second oxide of the oxide 230b. In particular, aluminum, gallium, yttrium, or tin is preferably used as the element M. The concentration of the element M in the second oxide of the oxide 230b is preferably higher than that of the first oxide of the oxide 230b. Alternatively, gallium oxide may be used as the second oxide of the oxide 230b. A metal oxide such as an In-M-Zn oxide may be used as the second oxide of the oxide 230b.

Specifically, the atomic ratio of the element M to In in the metal oxide used as the second oxide of the oxide 230b is preferably greater than the atomic ratio of the element M to In in the metal oxide used as the first oxide of the oxide 230b. The thickness of the second oxide of the oxide 230b is preferably within the range of 0.5 nm to 5 nm, further preferably within the range of 1 nm to 3 nm. The second oxide of the oxide 230b preferably has crystallinity. When the second oxide of the oxide 230b has crystallinity, release of oxygen in the first oxide of the oxide 230b can be reduced. When the second oxide of the oxide 230b has a hexagonal crystal structure, for example, release of oxygen from the first oxide of the oxide 230b can sometimes be inhibited.

Contact between the conductor 240 (the conductor 240a and the conductor 240b) and the oxide 230 may make oxygen in the oxide 230 diffuse into the conductor 240, resulting in oxidation of the conductor 240. It is highly probable that oxidation of the conductor 240 lowers the conductivity of the conductor 240. Note that diffusion of oxygen in the oxide 230 into the conductor 240 can be rephrased as absorption of oxygen in the oxide 230 by the conductor 240.

Oxygen in the oxide 230 (typically in the oxide 230b) diffuses into the conductor 240, whereby another layer may be formed between the conductor 240 and the oxide 230. The layer contains more oxygen than the conductor 240 does, and thus the layer presumably has an insulating property. In this case, the three-layer structure of the conductor 240, the layer, and the oxide 230 can be regarded as a three-layer structure formed of metal-insulator-semiconductor, which is referred to as an MIS (Metal-Insulator-Semiconductor) structure or a diode junction structure having an MIS structure as its main part in some cases.

The insulator 273 having a barrier property may be provided to cover the top surface of the conductor 240 and the side surfaces of the oxide 230a, the oxide 230b, and the conductor 240. Note that when the insulator 273 is provided, the insulator 245 is not necessarily provided.

For example, oxygen vacancies are formed in the region of the oxide 230 which overlaps with the conductor 240 by the introduction of the metal element of the conductor 240 or absorption of oxygen by the conductor 240. That is, the vicinity of the surface of the oxide 230 which is in contact with the conductor 240 can locally have a lower resistance. The region of the oxide 230 which overlaps with the conductor 240 becomes low resistant; this can increase the on-state current of the transistor 200.

In contrast, the excess oxygen included in the insulator 280 is diffused through the side surface of the region of the oxide 230 which overlaps with the conductor 240 to the oxide 230; thus, the local lower-resistance region which is formed in the region of the oxide 230 which overlaps with the conductor 240 can be reduced and the on-state current of the transistor 200 can be lowered.

When the insulator 273 is provided, the excess oxygen included in the insulator 280 can be inhibited from being supplied through the side surface of the region of the oxide 230 which overlaps with the conductor 240. On the other hand, the excess oxygen included in the insulator 280 can be supplied to the channel formation region of the oxide 230b through the oxide 230c. Thus, the lower-resistance region which is formed in the vicinity of the surface of the oxide 230 in contact with the conductor 240 is not reduced and the oxygen vacancies formed in the channel formation region of the oxide 230 are efficiently compensated.

When the insulator 224 has an excess-oxygen region, excess oxygen contained in the insulator 224 is diffused into the oxide 230b through the oxide 230a in the oxide 230. In other words, excess oxygen can be supplied from the oxide 230a side. Accordingly, the reduction of the lower-resistance region which is formed in the vicinity of the surface of the oxide 230 in contact with the conductor 240 can be inhibited, and the oxygen vacancies formed in the channel formation region of the oxide 230 can be compensated.

The insulator 273 is preferably an aluminum oxide film formed using a sputtering apparatus. When the aluminum oxide film is formed as the insulator 273 under an oxygen gas atmosphere, excess oxygen can be introduced into the insulator 224 while the insulator 273 is formed.

The insulator 274 may be provided over the insulator 273. Note that like the insulator 273, the insulator 274 preferably has a function of inhibiting diffusion of oxygen.

Specifically, coverage with the insulator 273 formed by a sputtering method is low. The insulator 274 is preferably formed by an ALD method. This is because an ALD method can form a film having excellent thickness uniformity and excellent step coverage, which is less likely to be influenced by the shape of an object.

<Application Example of Semiconductor Device>

Using FIG. 7A to FIG. 7D, an example in which a stacked-layer structure of an interlayer film and a plug of one embodiment of the present invention are used to the semiconductor device including the transistor 200 of this example is described.

Figure 7A:
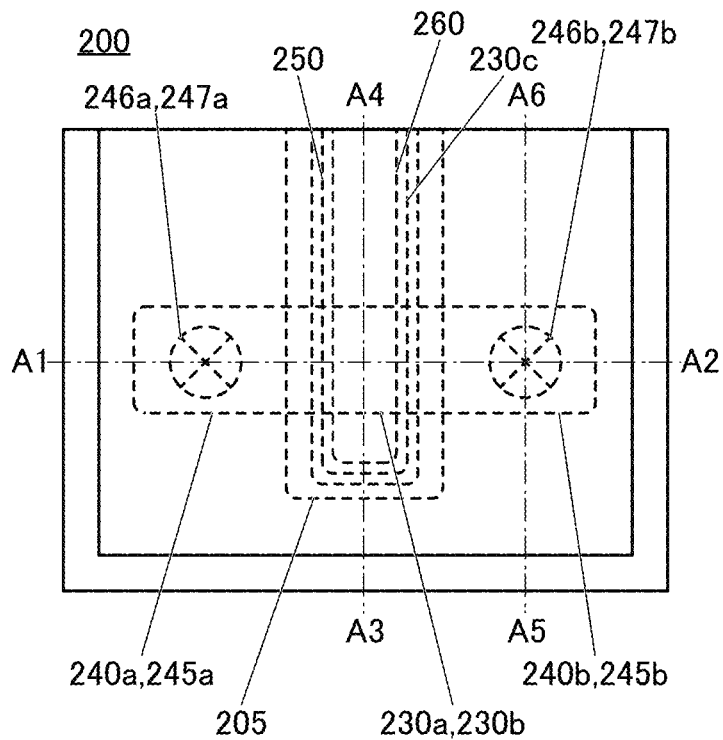
FIG. 7A, FIG. 7B, FIG. 7C, and FIG. 7D are a top view and cross-sectional views of a semiconductor device of one embodiment of the present invention.
Figure 7B:
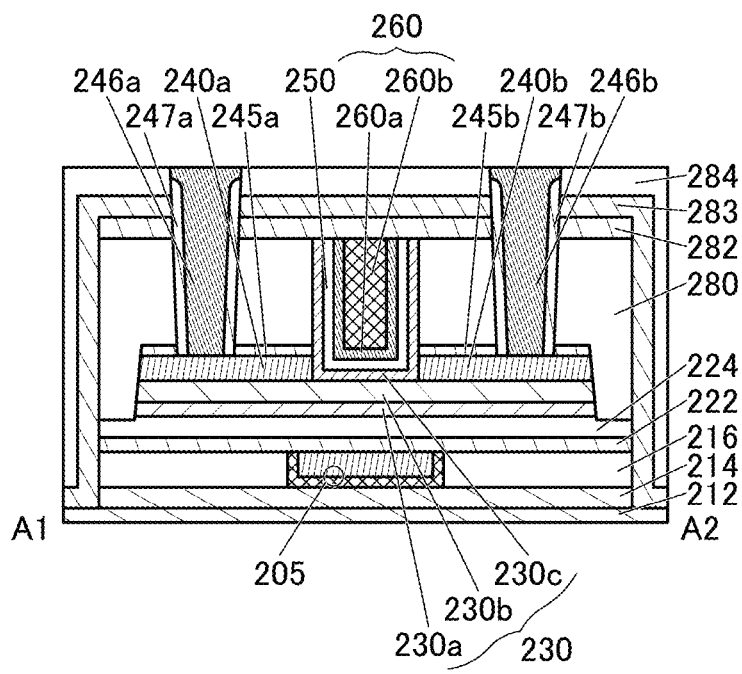
Figure 7C:
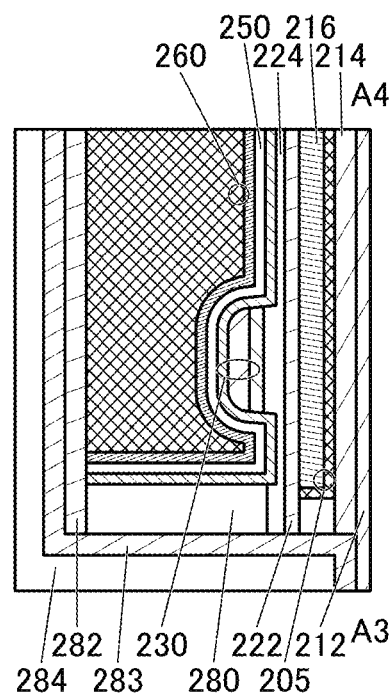
Figure 7D:
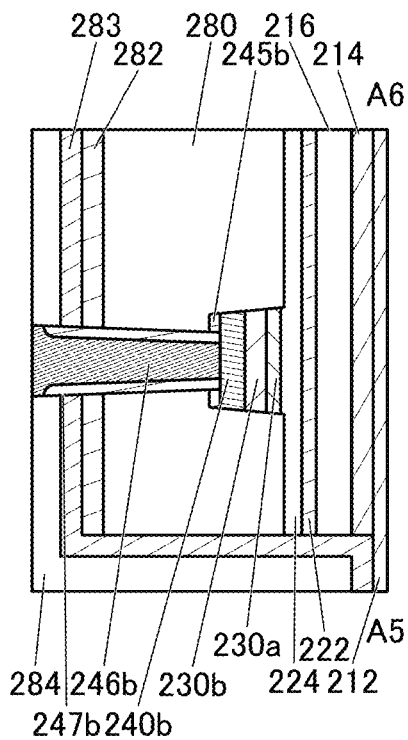

Here, FIG. 7A is a top view. FIG. 7B is a cross-sectional view corresponding to a portion indicated by the dashed-dotted line A1-A2 in FIG. 7A. FIG. 7C is a cross-sectional view corresponding to a portion indicated by the dashed-dotted line A3-A4 in FIG. 7A. FIG. 7D is a cross-sectional view corresponding to a portion indicated by the dashed dotted line A5-A6 in FIG. 7A. For clarity of the drawing, some components are not shown in the top view of FIG. 7A.

In the semiconductor device shown in FIG. 7A to FIG. 7D, the insulator 280, the insulator 282, the insulator 283, and the insulator 284 have openings that expose the transistor 200. In the openings, the conductors 246 functioning as plugs that are connected to the transistor 200 are provided. The insulators 247 are provided on the side surfaces of the conductors 246.

Note that the conductor 246 has a function of a plug or a wiring that is electrically connected to the transistor 200.

The semiconductor device shown in FIG. 7A to FIG. 7D includes the insulator 212 and the insulator 283 that function as barrier layers over and under the transistor 200. The insulator 212 and the insulator 283 are in contact with each other at side of the transistor 200 or in an end portion region of the substrate. In other words, the semiconductor device shown in FIG. 7A to FIG. 7D has a structure in which the transistor 200 and the insulator 280 having the excess-oxygen region are sealed by the barrier layers.

The region where the insulator 212 and the insulator 283 are in contact with each other may be provided along a scribe line. For example, when a plurality of transistors 200 is arranged in a matrix, a region where the insulator 212 and the insulator 283 are in contact with each other may be provided along the row and column where the plurality of transistors are aligned.

When the region where the insulator 212 and the insulator 283 are in contact with each other is provided at an end portion of the substrate, the region may be provided to overlap with the scribe line.

The insulator 283 is provided over the insulator 282. The insulator 284 is formed using a material having high etch rate selectivity ratio with respect to the conductor 248 when the conductor 248 is processed. Thus, the insulator 284 is provided over the insulator 283 as necessary.

The insulators 247 are preferably in contact with the insulator 283. When the insulators 247 and the insulator 283 are in contact with each other, the transistor 200 and the insulator 280 including an excess-oxygen region are sealed with the barrier layers.

Specifically, the insulators 247 are provided in contact with side walls of the openings in the insulator 283, the insulator 282, and the insulator 280, and the conductors 246 are formed in contact with these side surfaces. At least at part of the bottom of the openings, the transistor 200 is positioned and the conductors 246 are in contact with the transistor 200.

Note that in <Modification Example of Semiconductor Device> and <Application Example of Semiconductor Device>, the structure having the same functions as the components included in the semiconductor device described in <Structure Example of Semiconductor Device> are denoted by the same reference numerals. Note that the materials described in detail in <Structure Example of Semiconductor Device> can also be used as constituent materials of the semiconductor devices in this section.

According to the above, a semiconductor device with high reliability can be provided. Alternatively, a semiconductor device having favorable electrical characteristics can be provided. Alternatively, a semiconductor device that can be miniaturized or highly integrated can be provided. Alternatively, a semiconductor device with low power consumption can be provided.

The structure, method, and the like described above in this embodiment can be used in an appropriate combination with the structures, the methods, and the like described in the other embodiments and examples.

Embodiment 3

In this embodiment, one embodiment of a semiconductor device is described with reference to FIG. 11 and FIG. 12.

[Memory Device 1]

Figure 11:
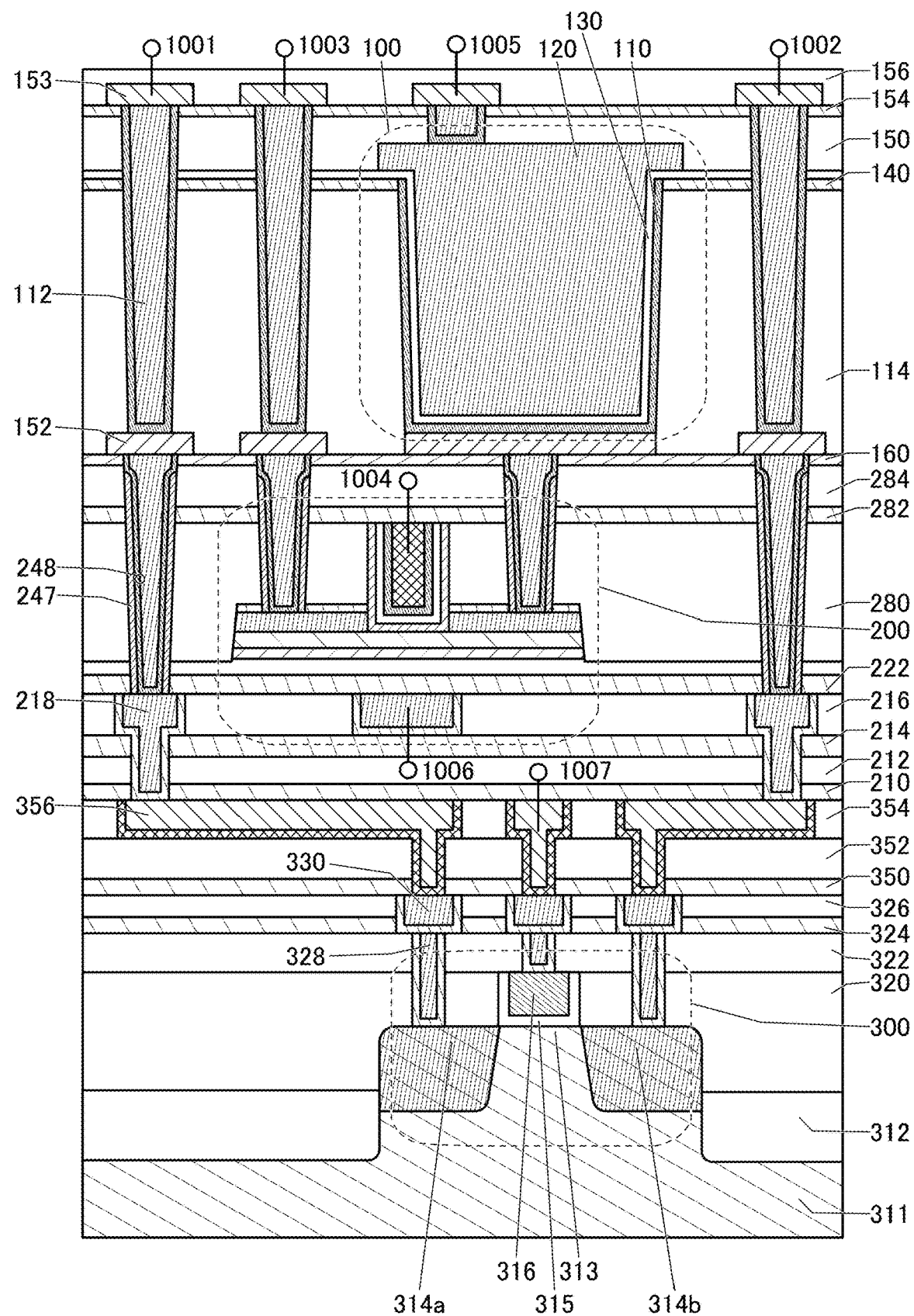
FIG. 11 is a cross-sectional view showing a structure of a memory device of one embodiment of the present invention.

FIG. 11 shows an example of a semiconductor device (memory device) in which a capacitor of one embodiment of the present invention is used. In the semiconductor device of one embodiment of the present invention, the transistor 200 is provided above a transistor 300, and a capacitor 100 is provided above the transistor 200. At least part of the capacitor 100 or the transistor 300 preferably overlaps with the transistor 200. Accordingly, an area occupied by the capacitor 100, the transistor 200, and the transistor 300 in a top view can be reduced, whereby the semiconductor device of this embodiment can be miniaturized or highly integrated. The semiconductor device of this embodiment can be applied to logic circuits typified by a CPU (Central Processing Unit) and a GPU (Graphics Processing Unit) and memory circuits typified by a DRAM (Dynamic Random Access Memory) and an NVM (Non-Volatile Memory), for example.

The transistor 200 described in the above embodiment can be used as the transistor 200. Therefore, for the transistor 200 and layers including the transistor 200, the description in the above embodiment can be referred to.

The transistor 200 is a transistor in which a channel is formed in a semiconductor layer including an oxide semiconductor. The off-state current of the transistor 200 is low; thus, by using the transistor 200 in a memory device, stored data can be retained for a long time. In other words, such a memory device does not require refresh operation or has extremely low frequency of the refresh operation, which leads to a sufficient reduction in power consumption of the memory device. The transistor 200 exhibits favorable electrical characteristics at high temperatures, in comparison with a transistor including silicon in a semiconductor layer. For example, the transistor 200 has favorable electrical characteristics even in the temperature range of 125° C. to 150° C. Moreover, the transistor 200 has an on/off ratio of 10 digits or larger in the temperature range of 125° C. to 150° C. In other words, in comparison with a transistor including silicon in a semiconductor layer, the transistor 200 excels in characteristics such as on-state current and frequency characteristics at higher temperatures.

In the semiconductor device shown in FIG. 11, a wiring 1001 is electrically connected to a source of the transistor 300, a wiring 1002 is electrically connected to a drain of the transistor 300, and a wiring 1007 is electrically connected to a gate of the transistor 300. In addition, a wiring 1003 is electrically connected to one of a source and a drain of the transistor 200, a wiring 1004 is electrically connected to a first gate of the transistor 200, and a wiring 1006 is electrically connected to a second gate of the transistor 200. The other of the source and the drain of the transistor 200 is electrically connected to one electrode of the capacitor 100, and a wiring 1005 is electrically connected to the other electrode of the capacitor 100.

The semiconductor device shown in FIG. 11 has characteristics of being capable of retaining charge stored in the one electrode of the capacitor 100 by switching of the transistor 200; thus, writing, retention, and reading of data can be performed. The transistor 200 is an element in which a back gate is provided in addition to the source, the gate (top gate), and the drain. That is, the transistor 200 is a four-terminal element; hence, its input and output can be controlled independently of each other in a simpler manner than that in two-terminal elements typified by MTJ (Magnetoresistive Random Access Memory) utilizing MTJ (Magnetic Tunnel Junction) properties, ReRAM (Resistive Random Access Memory), and phase-change memory. In addition, the structure of MRAM, ReRAM, and phase-change memory may change at the atomic level when data is rewritten. In contrast, in the semiconductor device shown in FIG. 11, data rewriting is performed by charging or discharging of electrons with the transistor and the capacitor; thus, the semiconductor device has characteristics such as high write endurance and a few structure changes.

Furthermore, by arranging the semiconductor devices shown in FIG. 11 in a matrix, a memory cell array can be formed. In this case, the transistor 300 can be used for a read circuit, a driver circuit, or the like that is connected to the memory cell array. As described above, the semiconductor device shown in FIG. 11 constitutes the memory cell array. When the semiconductor device in FIG. 11 is used as a memory element, for example, an operating frequency of 200 MHz or higher is achieved at a driving voltage of 2.5 V and an evaluation environment temperature ranging from −40° C. to 85° C.

<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is placed over the semiconductor region 313, and the conductor 316 is placed over the insulator 315. The transistors 300 formed in the same layer are electrically isolated from one another by an insulator 312 functioning as an element isolation insulating layer. The insulator 312 can be formed using an insulator similar to an insulator 326 or the like described later. The transistor 300 is either a p-channel transistor or an n-channel transistor.

In the substrate 311, a region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) using GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as the gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Here, in the transistor 300 shown in FIG. 11, the semiconductor region 313 (part of the substrate 311) in which the channel is formed has a convex shape. In addition, the conductor 316 is provided to cover a side surface and a top surface of the semiconductor region 313 with the insulator 315 therebetween. Such a transistor 300 is also referred to as a FIN-type transistor because it utilizes a convex portion of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 shown in FIG. 11 is an example and the structure is not limited thereto; an appropriate transistor is used in accordance with a circuit structure or a driving method.

As shown in FIG. 11, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device in FIG. 11, a silicon-based semiconductor material and an oxide semiconductor can be used in different layers. The semiconductor device shown in FIG. 11 can be manufactured in a process similar to that employing a manufacturing apparatus that is used in the case of a silicon-based semiconductor material, and can be highly integrated.

<Capacitor>

The capacitor 100 includes an insulator 114 over an insulator 160, an insulator 140 over the insulator 114, a conductor 110 positioned in an opening formed in the insulator 114 and the insulator 140, an insulator 130 over the conductor 110 and the insulator 140, a conductor 120 over the insulator 130, and an insulator 150 over the conductor 120 and the insulator 130. Here, at least parts of the conductor 110, the insulator 130, and the conductor 120 are positioned in the opening formed in the insulator 114 and the insulator 140.

The conductor 110 functions as a lower electrode of the capacitor 100, the conductor 120 functions as an upper electrode of the capacitor 100, and the insulator 130 functions as a dielectric of the capacitor 100. The capacitor 100 has a structure in which the upper electrode and the lower electrode face each other with the dielectric positioned therebetween on a side surface as well as the bottom surface of the opening in the insulator 114 and the insulator 140; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used as the insulator 280 can be used as the insulator 114 and the insulator 150. The insulator 140 preferably functions as an etching stopper at the time of forming the opening in the insulator 114 and is formed using an insulator that can be used for the insulator 214.

The shape of the opening formed in the insulator 114 and the insulator 140 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 110 is provided in contact with the opening formed in the insulator 140 and the insulator 114. The top surface of the conductor 110 is preferably substantially level with the top surface of the insulator 140. A conductor 152 provided over the insulator 160 is in contact with the bottom surface of the conductor 110. The conductor 110 is preferably deposited by an ALD method, a CVD method, or the like; for example, a conductor that can be used as the conductor 205 is used.

The insulator 130 is positioned to cover the conductor 110 and the insulator 140. The insulator 130 is preferably deposited by an ALD method or a CVD method, for example. The insulator 130 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for example.

As the insulator 130, a material with high dielectric strength, such as silicon oxynitride, or a high dielectric constant (high-k) material is preferably used. Alternatively, a stacked-layer structure using a material with high dielectric strength and a high dielectric constant (high-k) material may be employed.

As an insulator of a high dielectric constant (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given. The use of such a high-k material can ensure sufficient capacitance of the capacitor 100 even when the insulator 130 has a large thickness. When the insulator 130 has a large thickness, leakage current generated between the conductor 110 and the conductor 120 can be inhibited.

Examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator with high dielectric strength can increase the dielectric strength and inhibit electrostatic breakdown of the capacitor 100.

The conductor 120 is positioned to fill the opening formed in the insulator 140 and the insulator 114. The conductor 120 is electrically connected to the wiring 1005 through a conductor 112 and a conductor 153. The conductor 120 is preferably deposited by an ALD method, a CVD method, or the like and is formed using a conductor that can be used as the conductor 205, for example.

Since the transistor 200 has a structure in which an oxide semiconductor is used, the transistor 200 is highly compatible with the capacitor 100. Specifically, since the transistor 200 containing an oxide semiconductor has a low off-state current, a combination of the transistor 200 and the capacitor 100 enables stored data to be retained for a long time.

<Wiring Layer>

Wiring layers provided with an interlayer film, a wiring, a plug, and the like may be provided between the components. In addition, a plurality of wiring layers can be provided in accordance with design. Note that a plurality of conductors functioning as plugs or wirings is collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 320, an insulator 322, an insulator 324, and an insulator 326 are sequentially stacked over the transistor 300 as interlayer films. Moreover, a conductor 328, a conductor 330, and the like that are electrically connected to the conductor 153 functioning as a terminal are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 11, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring.

An insulator 210, the insulator 212, the insulator 214, and the insulator 216 are stacked in this order over the insulator 354 and the conductor 356. A conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the transistor 300.

The conductor 112, conductors (the conductor 120 and the conductor 110) included in the 35 capacitor 100, and the like are embedded in the insulator 114, the insulator 140, the insulator 130, the insulator 150, and an insulator 154. Note that the conductor 112 functions as a plug or a wiring that electrically connects the capacitor 100, the transistor 200, or the transistor 300 to the conductor 153 functioning as a terminal.

The conductor 153 is provided over the insulator 154, and the conductor 153 is covered with an insulator 156. Here, the conductor 153 is in contact with a top surface of the conductor 112 and functions as a terminal of the capacitor 100, the transistor 200, or the transistor 300.

Examples of an insulator that can be used as an interlayer film include an oxide, a nitride, an oxynitride, a nitride oxide, a metal oxide, a metal oxynitride, and a metal nitride oxide, each of which has an insulating property. For example, when a material with a low relative permittivity is used as the insulator functioning as an interlayer film, the parasitic capacitance generated between wirings can be reduced. Thus, a material is preferably selected depending on the function of an insulator.

For example, as the insulator 320, the insulator 322, the insulator 326, the insulator 352, the insulator 354, the insulator 212, the insulator 114, the insulator 150, the insulator 156, and the like, an insulator with low relative permittivity is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low relative permittivity. Examples of the resin include polyester, polyolefin, polyamide (e.g., nylon and aramid), polyimide, polycarbonate, and acrylic.

It is preferable that the resistivity of an insulator provided over or under the conductor 152 or the conductor 153 be higher than or equal to $1.0 \times 10^{12}$ Ωcm and lower than or equal to $1.0 \times 10^{14}$ Ωcm, preferably higher than or equal to $5.0 \times 10^{12}$ Ωcm and lower than or equal to $1.0 \times 10^{13}$ Ωcm, further preferably higher than or equal to $1.0 \times 10^{13}$ Ωcm and lower than or equal to $5.0\times10^{13}$ Ωcm. The resistivity of the insulator provided over or under the conductor 152 or the conductor 153 is preferably within the above range because the insulator can disperse charges accumulated between the transistor 200, the transistor 300, the capacitor 100, and wirings such as the conductor 152 while maintaining the insulating property, and thus, poor characteristics and electrostatic breakdown of the transistor and the semiconductor device including the transistor due to the charges can be inhibited. As such an insulator, silicon nitride or silicon nitride oxide can be used. For example, the resistivity of the insulator 160 or the insulator 154 can be set within the above range.

When a transistor using an oxide semiconductor is surrounded by an insulator having a function of inhibiting transmission of oxygen and impurities such as hydrogen, the electrical characteristics of the transistor can be stable. Thus, an insulator having a function of inhibiting passage of oxygen and impurities such as hydrogen is used for the insulator 324, the insulator 350, the insulator 210, and like.

As the insulator having a function of inhibiting the transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting the transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, as the conductor 328, the conductor 330, the conductor 356, the conductor 218, the conductor 112, the conductor 152, the conductor 153, and the like, a single layer or stacked layers of a conductive material such as a metal material, an alloy material, a metal nitride material, a metal oxide material, and the like that are formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 247 is preferably provided between the insulator 280 including excess oxygen and the conductor 248 in FIG. 11. Since the insulator 247 is provided in contact with the insulator 282, the conductor 248 and the transistor 200 can be sealed by the insulators having a barrier property.

That is, the excess oxygen included in the insulator 280 can be inhibited from being absorbed by the conductor 248 when the insulator 247 is provided. In addition, by including the insulator 247, the diffusion of hydrogen, which is an impurity, into the transistor 200 through the conductor 248 can be inhibited.

Here, the conductor 248 functions as a plug or a wiring that is electrically connected to the transistor 200 or the transistor 300.

Specifically, the insulator 247 is provided in contact with a side wall of the opening in the insulator 284, the insulator 282, and the insulator 280, and the conductor 248 is formed in contact with its side surface. The conductor 240 is located on at least part of the bottom portion of the opening, and the conductor 248 is in contact with the conductor 240.

The conductor 248 is preferably formed using a conductive material containing tungsten, copper, or aluminum as its main component. In addition, the conductor 248 may have a stacked-layer structure. Although the transistor 200 having a structure in which the conductor 248 has a stacked-layer structure of two layers is shown, the present invention is not limited thereto. For example, the conductor 248 may be provided as a single layer or to have a stacked-layer structure of three or more layers.

In the case where the conductor 248 has a stacked-layer structure, a conductive material having a function of inhibiting passage of impurities such as water and hydrogen is preferably used as a conductor that is in contact with the conductor 240 and in contact with the insulator 280, the insulator 282, and the insulator 284 with the insulator 247 therebetween. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. The use of the conductive material can prevent oxygen added to the insulator 280 from being absorbed by the conductor 248. Moreover, impurities such as water and hydrogen contained in a layer above the insulator 284 can be inhibited from diffusing into the oxide 230 through the conductor 248.

As the insulator 247, for example, an insulator that can be used as the insulator 214, or the like may be used. The insulator 247 can inhibit impurities such as water and hydrogen contained in the insulator 280 and the like from diffusing into the oxide 230 through the conductor 248. In addition, oxygen contained in the insulator 280 can be prevented from being absorbed by the conductor 248.

The conductor 152 functioning as a wiring may be provided in contact with the top surface of the conductor 248. As the conductor functioning as a wiring, a conductive material containing tungsten, copper, or aluminum as its main component is preferably used. Furthermore, the conductor may have a stacked-layer structure and may be a stack of titanium or titanium nitride and any of the above conductive materials, for example. Note that the conductor may be formed to be embedded in an opening provided in an insulator.

The above is the description of the structure example. With the use of this structure, a semiconductor device using a transistor including an oxide semiconductor can be miniaturized or highly integrated. Furthermore, a change in electrical characteristics can be reduced and reliability can be improved in a semiconductor device using a transistor including an oxide semiconductor. A transistor including an oxide semiconductor with a high on-state current can be provided. A transistor including an oxide semiconductor with low off-state current can be provided. A semiconductor device with low power consumption can be provided.

[Storage Device 2]

Figure 12:
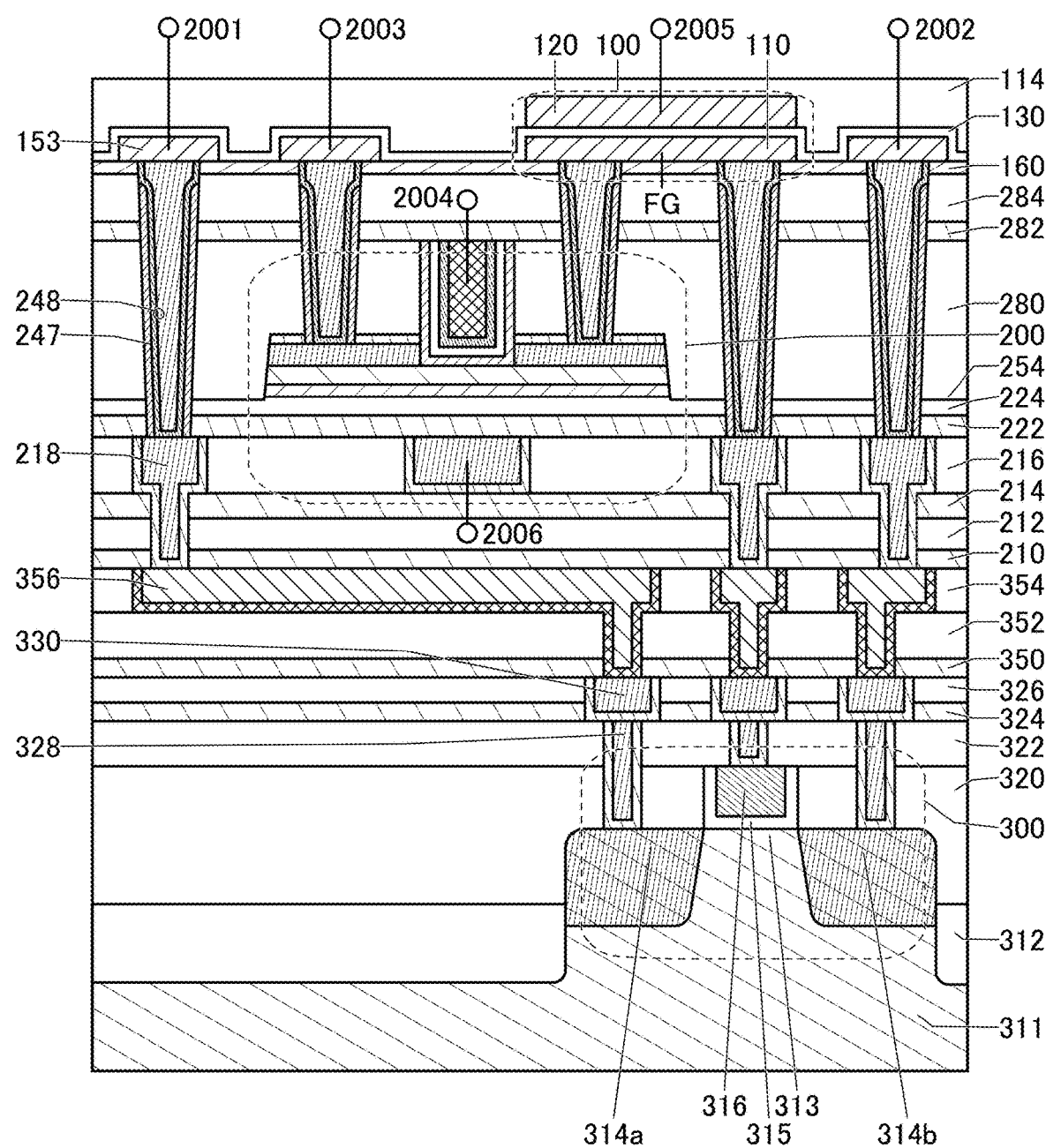
FIG. 12 is a cross-sectional view showing a structure of a memory device of one embodiment of the present invention.

FIG. 12 shows an example of a semiconductor device (memory device) using the semiconductor device of one embodiment of the present invention. Like the semiconductor device shown in FIG. 11, the semiconductor device shown in FIG. 12 includes the transistor 200, the transistor 300, and the capacitor 100. Note that the semiconductor device shown in FIG. 12 differs from the semiconductor device shown in FIG. 11 in that the capacitor 100 is a planar capacitor and that the transistor 200 is electrically connected to the transistor 300.

In the semiconductor device of one embodiment of the present invention, the transistor 200 is provided above the transistor 300, and the capacitor 100 is provided above the transistor 300 and the transistor 200. In the semiconductor device of one embodiment of the present invention, the transistor 200 is provided above a transistor 300, and a capacitor 100 is provided above the transistor 200. Accordingly, the area occupied by the capacitor 100, the transistor 200, and the transistor 300 in a top view can be reduced, so that the memory device of this embodiment can achieve miniaturization or higher integration.

Note that the transistor 200 and the transistor 300 mentioned above can be used as the transistor 200 and the transistor 300, respectively. Therefore, the above description can be referred to for the transistor 200, the transistor 300, and the layers including them.

In the semiconductor device shown in FIG. 12, a wiring 2001 is electrically connected to the source of the transistor 300, and a wiring 2002 is electrically connected to the drain of the transistor 300. A wiring 2003 is electrically connected to one of the source and the drain of the transistor 200, a wiring 2004 is electrically connected to the first gate of the transistor 200, and a wiring 2006 is electrically connected to the second gate of the transistor 200. The gate of the transistor 300 and the other of the source and the drain of the transistor 200 are electrically connected to one electrode of the capacitor 100, and a wiring 2005 is electrically connected to the other electrode of the capacitor 100. Note that a node where the gate of the transistor 300, the other of the source and the drain of the transistor 200, and the one electrode of the capacitor 100 are connected to one another is hereinafter referred to as a node FG in some cases.

The semiconductor device shown in FIG. 12 is capable of retaining the potential of the gate of the transistor 300 (the node FG) by switching of the transistor 200; thus, data writing, retention, and reading can be performed.

By arranging the semiconductor devices shown in FIG. 12 in a matrix, a memory cell array can be formed.

The layer including the transistor 300 has the same structure as that in the semiconductor device shown in FIG. 11, and therefore, the above description can be referred to for the structure below the insulator 354.

The insulator 210, the insulator 212, the insulator 214, and the insulator 216 are positioned over the insulator 354. Here, an insulator having a function of inhibiting passage of oxygen and impurities such as hydrogen is used for the insulator 210, as for the insulator 350 and the like.

The conductor 218 is embedded in the insulator 210, the insulator 212, the insulator 214, and the insulator 216. The conductor 218 functions as a plug or a wiring that is electrically connected to the capacitor 100, the transistor 200, or the transistor 300. For example, the conductor 218 is electrically connected to the conductor 316 functioning as the gate electrode of the transistor 300.

Note that the conductor 248 functions as a plug or a wiring that is electrically connected to the transistor 200 or the transistor 300. For example, the conductor 248 electrically connects the conductor 240b functioning as the other of the source and the drain of the transistor 200 and the conductor 110 functioning as one electrode of the capacitor 100 through the conductor 248.

The planar capacitor 100 is provided above the transistor 200. The capacitor 100 includes the conductor 110 functioning as a first electrode, the conductor 120 functioning as a second electrode, and the insulator 130 functioning as a dielectric. Note that as the conductor 110, the conductor 120, and the insulator 130, those described above in Memory Device 1 can be used.

The conductor 153 and the conductor 110 are provided in contact with the top surface of the conductor 248. The conductor 153 is in contact with the top surface of the conductor 248 and functions as a terminal of the transistor 200 or the transistor 300.

The conductor 153 and the conductor 110 are covered with the insulator 130, and the conductor 120 is positioned to overlap with the conductor 110 with the insulator 130 therebetween. In addition, the insulator 114 is positioned over the conductor 120 and the insulator 130.

Although FIG. 12 shows an example in which a planar capacitor is used as the capacitor 100, the semiconductor device of this embodiment is not limited thereto. For example, the capacitor 100 may be a cylinder capacitor 100 like that shown in FIG. 11.

[Memory Device 3]

Figure 13:
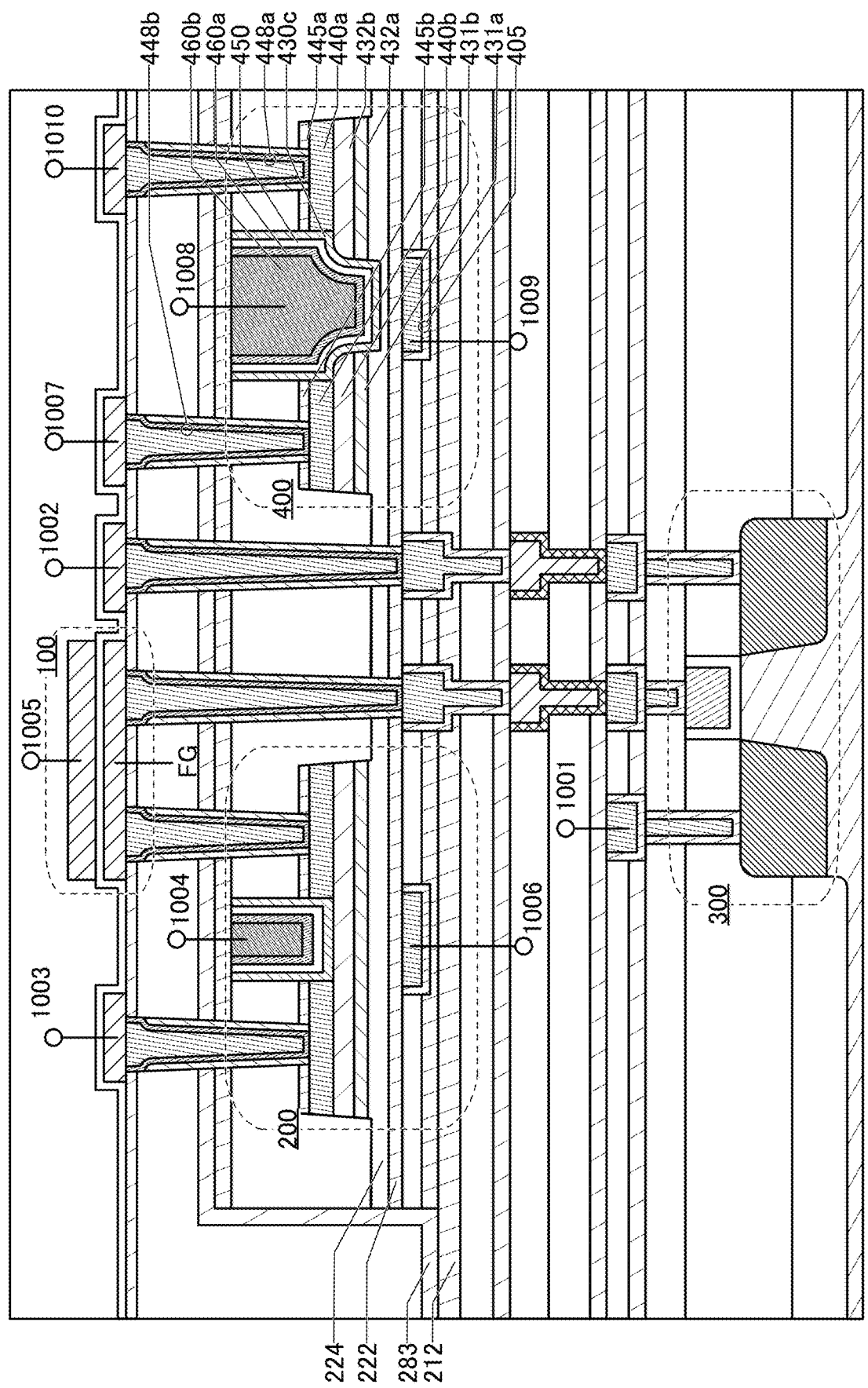
FIG. 13 is a cross-sectional view showing a structure of a memory device of one embodiment of the present invention.

FIG. 13 shows an example of a memory device using the semiconductor device of one embodiment of the present invention. The memory device shown in FIG. 13 includes a transistor 400 in addition to the semiconductor device including the transistor 200, the transistor 300, and the capacitor 100 shown in FIG. 12.

The transistor 400 can control a second gate voltage of the transistor 200. For example, a first gate and a second gate of the transistor 400 are diode-connected to a source of the transistor 400, and the source of the transistor 400 is connected to the second gate of the transistor 200. When a negative potential of the second gate of the transistor 200 is retained in this structure, the first gate-source voltage and the second gate-source voltage of the transistor 400 become 0 V. In the transistor 400, a drain current at the time when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

In FIG. 13, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to a second gate (back gate) of the transistor 200. Furthermore, a gate of the transistor 300 and the other of the source and the drain of the transistor 200 are electrically connected to one electrode of the capacitor 100, and a wiring 1005 is electrically connected to the other electrode of the capacitor 100. The wiring 1007 is electrically connected to the source of the transistor 400, a wiring 1008 is electrically connected to a gate of the transistor 400, a wiring 1009 is electrically connected to a second gate (back gate) of the transistor 400, and a wiring 1010 is electrically connected to the drain of the transistor 400. Here, the wiring 1006, the wiring 1007, the wiring 1008, and the wiring 1009 are electrically connected to each other.

When the memory device shown in FIG. 13 is arranged in a matrix like the memory devices shown in FIG. 11 and FIG. 12, a memory cell array can be formed. Note that one transistor 400 can control the second gate voltages of a plurality of transistors 200. For this reason, the number of transistors 400 is preferably smaller than the number of transistors 200.

<Transistor 400>

The transistor 400 and the transistor 200 are formed in the same layer and thus can be fabricated in parallel. The transistor 400 includes a conductor 460 (a conductor 460a and a conductor 460b) functioning as a first gate electrode; a conductor 405 functioning as a second gate electrode; the insulator 222, the insulator 224, and an insulator 450 functioning as a gate insulating layer; an oxide 430c including a region where a channel is formed; a conductor 440a, an oxide 432a, and an oxide 432b functioning as one of a source and a drain; a conductor 440b, an oxide 431a, and an oxide 431b functioning as the other of the source and the drain; and a insulator 445a and a insulator 445b functioning as a barrier layer.

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 440 (the conductor 440a and the conductor 440b) is in the same layer as the conductor 240. The insulator 445 (the insulator 445a and the insulator 445b) is in the same layer as the insulator 245. The oxide 430c is in the same layer as the oxide 230c. The insulator 450 is in the same layer as the insulator 250. The conductor 460 is in the same layer as the conductor 260.

Note that the components formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen and water are reduced, as in the oxide 230 or the like. Accordingly, the threshold voltage of the transistor 400 can be higher than 0 V, the off-state current can be reduced, and the drain current at the time when the second gate voltage and the first gate voltage are 0 V can be extremely low.

This embodiment can be implemented in an appropriate combination with the structures described in the other embodiments, Example, and the like.

Embodiment 4

In this embodiment, a memory device of one embodiment of the present invention including a transistor in which oxide is used as a semiconductor (hereinafter referred to as an OS transistor in some cases) and a capacitor (hereinafter such a memory device is also referred to as an OS memory device in some cases) is described with reference to FIG. 14A, FIG. 14B and FIG. 15A to FIG. 15H. The OS memory device is a memory device including at least a capacitor and an OS transistor that controls charge and discharge of the capacitor. Since the off-state current of the OS transistor is extremely low, the OS memory device has excellent retention characteristics and can function as a nonvolatile memory.

<Structure Example of Memory Device>

Figure 14A:
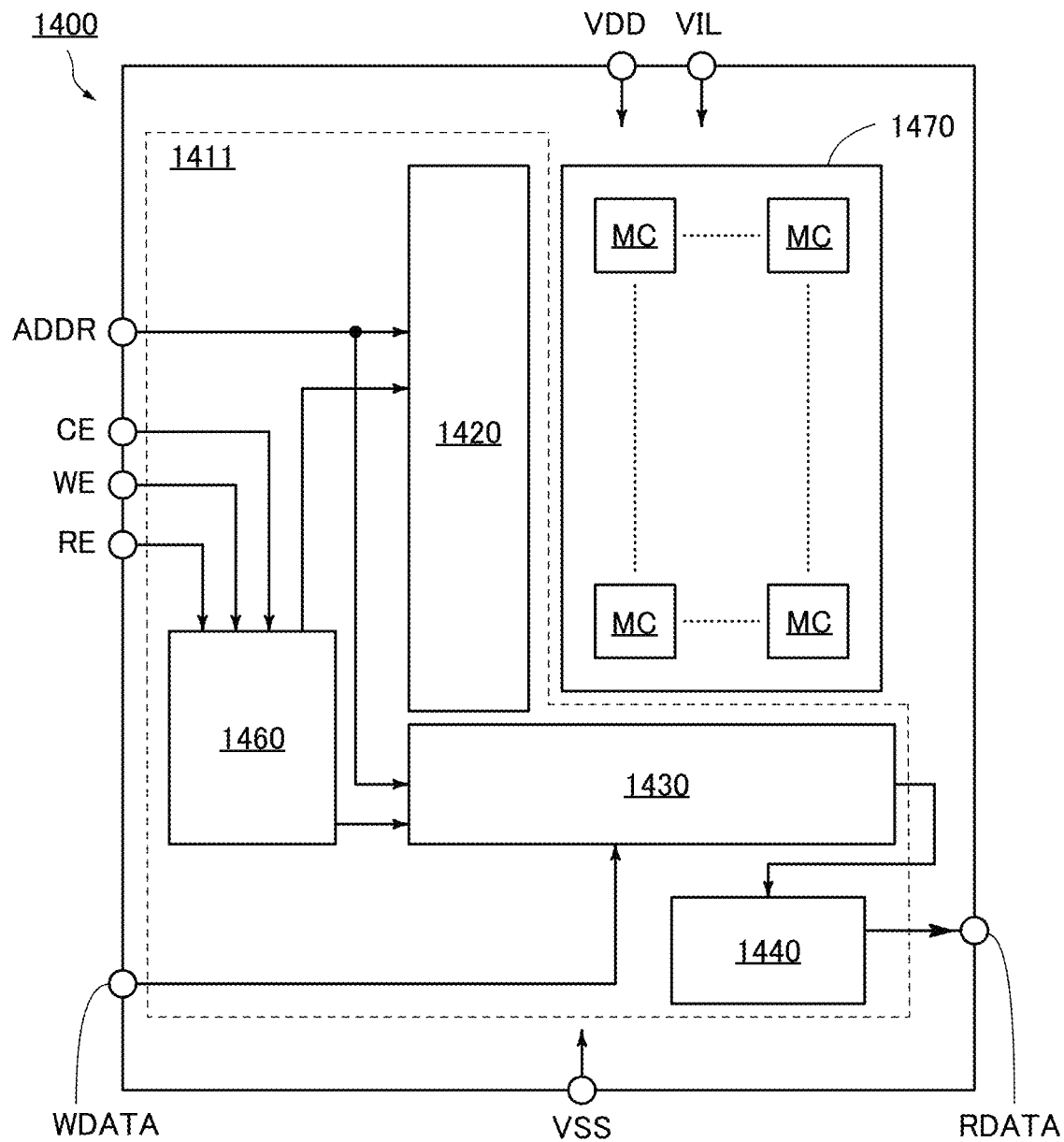
FIG. 14A and FIG. 14B are block diagrams showing a structure example of a memory device of one embodiment of the present invention.

FIG. 14A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are wirings connected to memory cells included in the memory cell array 1470, which is described in detail later. An amplified data signal is output to the outside of the memory device 1400 as a digital data signal RDATA through the output circuit 1440.

Furthermore, the row circuit 1420 includes, for example, a row decoder, a word line driver circuit, and the like, and can select a row to be accessed.

As power supply voltages, a low power supply voltage (VSS), a high power supply voltage (VDD) for the peripheral circuit 1411, and a high power supply voltage (VIL) for the memory cell array 1470 are supplied to the memory device 1400 from the outside. In addition, control signals (CE, WE, and RE), an address signal ADDR, and a data signal WDATA are input to the memory device 1400 from the outside. The address signal ADDR is input to the row decoder and the column decoder, and the data signal WDATA is input to the write circuit.

The control logic circuit 1460 processes signals (CE, WE, and RE) input from the outside, and generates control signals for the row decoder or the column decoder. CE denotes a chip enable signal, WE denotes a write enable signal, and RE denotes a read enable signal. Signals processed by the control logic circuit 1460 are not limited thereto, and other input signals may be input as necessary.

The memory cell array 1470 includes a plurality of memory cells MC arranged in a matrix and a plurality of wirings. Note that the number of wirings that connect the memory cell array 1470 and the row circuit 1420 depends on the structure of the memory cell MC, the number of memory cells MC included in one column, and the like. Furthermore, the number of wirings that connect the memory cell array 1470 and the column circuit 1430 depends on the structure of the memory cell MC, the number of memory cells MC included in one row, and the like.

Figure 14B:
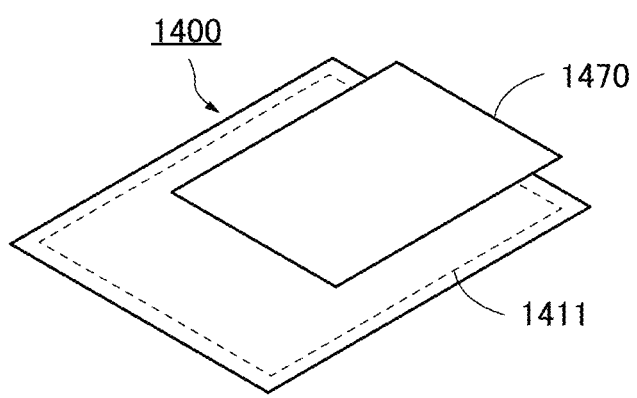

Note that FIG. 14A shows an example in which the peripheral circuit 1411 and the memory cell array 1470 are formed on the same plane; however, this embodiment is not limited thereto. For example, as shown in FIG. 14B, the memory cell army 1470 may be provided over the peripheral circuit 1411 to partly overlap with the peripheral circuit 1411. For example, a structure may be employed in which the sense amplifier is provided below the memory cell array 1470 to overlap with the memory cell array 1470.

FIG. 15A to FIG. 15H show structure examples of a memory cell which can be used to the memory cell MC.

[DOSRAM]

Figure 15A:
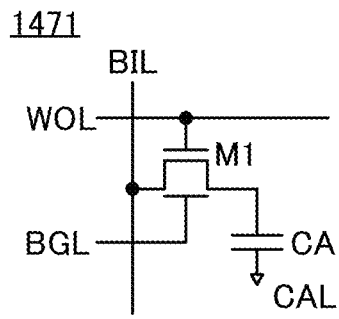
FIG. 15A, FIG. 15B, FIG. 15C, FIG. 15D, FIG. 15E, FIG. 15F, FIG. 15G, and FIG. 15H are circuit diagrams showing structure examples of a memory device of one embodiment of the present invention.
Figure 15B:
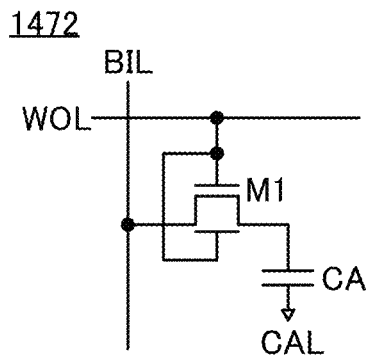
Figure 15C:
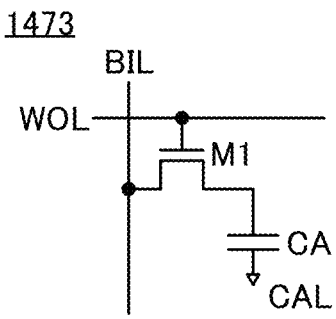

FIG. 15A to FIG. 15C each show a circuit structure example of a DRAM memory cell. In this specification and the like, a DRAM using a memory cell including one OS transistor and one capacitor is sometimes referred to as a DOSRAM (Dynamic Oxide Semiconductor Random Access Memory). A memory cell 1471 shown in FIG. 15A includes a transistor M1 and a capacitor CA. Note that the transistor MI includes a gate (also referred to as a top gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 shown in FIG. 15A corresponds to the memory device shown in FIG. 11. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 shown in FIG. 11 corresponds to a transistor provided in the peripheral circuit 1411 of the memory device 1400 shown in FIG. 14A and FIG. 14B.

The memory cell MC is not limited to the memory cell 1471, and its circuit structure can be changed. For example, as in a memory cell 1472 shown in FIG. 15B, the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 shown in FIG. 15C.

In the case where the semiconductor device described in the above embodiment is used in the memory cell 1471 or the like, the transistor 200 can be used as the transistor M1, and the capacitor 100 can be used as the capacitor CA. The use of an OS transistor as the transistor M1 enables the leakage current of the transistor M1 to be extremely low. That is, written data can be retained for a long time with the use of the transistor M1; thus, the frequency of refresh of the memory cell can be reduced. Alternatively, the refresh operation of the memory cell can be omitted. In addition, since the transistor M1 has an extremely low leakage current, multi-level data or analog data can be retained in the memory cell 1471, the memory cell 1472, and the memory cell 1473.

In the DOSRAM, providing a sense amplifier below the memory cell array 1470 so that they overlap each other as described above can shorten the bit line. This reduces the bit line capacity, which reduces the storage capacity of the memory cell.

[NOSRAM]

FIGS. 15D to 15G each show a circuit structure example of a gain-cell memory cell including two transistors and one capacitor. A memory cell 1474 shown in FIG. 15D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to the wiring RBL, a second terminal of the transistor M3 is connected to the wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 15D:
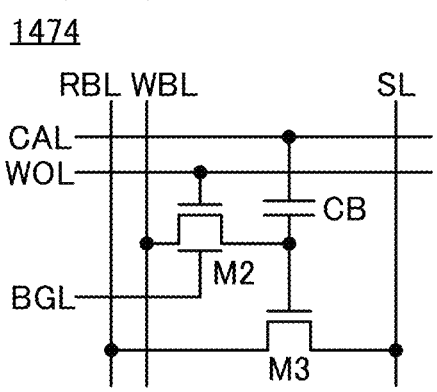
Figure 15E:
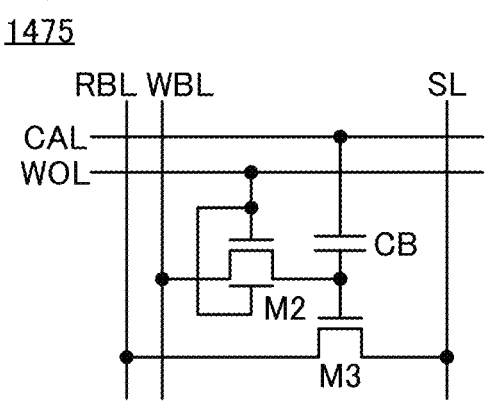
Figure 15F:
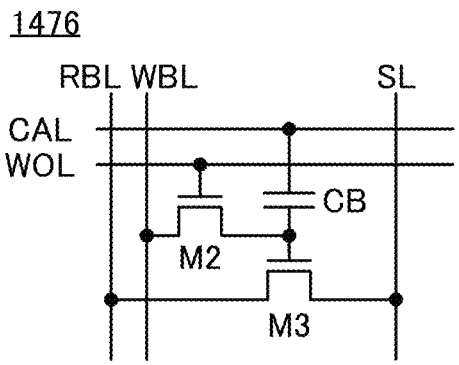
Figure 15G:
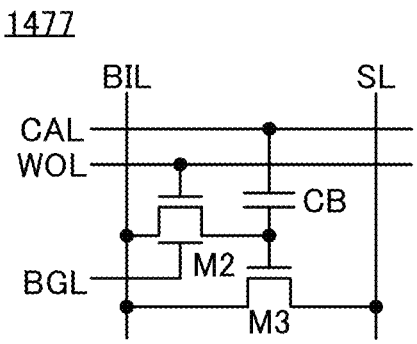

Here, the memory cell 1474 shown in FIG. 15D corresponds to the memory device shown in FIG. 12. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 2003, the wiring 2004, the wiring 2006, the wiring 2005, the wiring 2002, and the wiring 2001, respectively.

The memory cell MC is not limited to the memory cell 1474, and its circuit structure can be changed as appropriate. For example, as in a memory cell 1475 shown in FIG. 15E, a structure may be employed in which the back gate of the transistor M2 is connected not to the wiring BGL but to the wiring WOL in the memory cell MC. Alternatively, for example, like a memory cell 1476 shown in FIG. 15F, the memory cell MC may be a memory cell including a single-gate transistor, that is, the transistor M2 that does not include a back gate. Alternatively, for example, like a memory cell 1477 shown in FIG. 15G, the memory cell MC may have a structure where the wiring WBL and the wiring RBL are combined into one wiring BIL.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the use of the transistor M2; thus, the frequency of refresh of the memory cell can be reduced. Alternatively, the refresh operation of the memory cell can be omitted. In addition, the extremely low leakage current allows multi-level data or analog data to be retained in the memory cell 1474. The same applies to the memory cell 1475 to the memory cell 1477.

Note that the transistor M3 may be a transistor containing silicon in a channel formation region (hereinafter such a transistor is referred to as a Si transistor in some cases). The conductivity type of the Si transistor may be an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistor M2 and the transistor M3, the circuit of the memory cell array 1470 can be formed using only n-channel transistors.

Figure 15H:
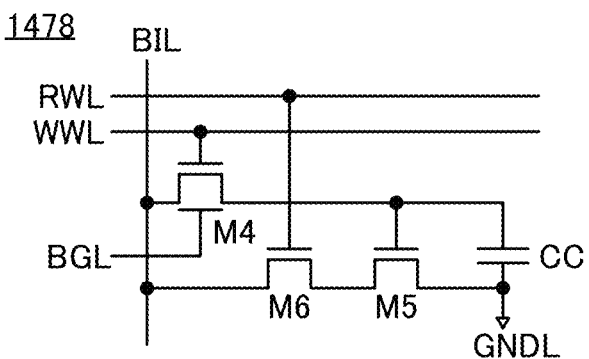

In addition, FIG. 15H shows an example of a gain-cell memory cell including three transistors and one capacitor. A memory cell 1478 shown in FIG. 15H includes a transistor M4 to a transistor M6 and a capacitor CC. The capacitor CC is provided as necessary. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be configured using only n-channel transistors.

In the case where the semiconductor device described in the above embodiment is used in the memory cell 1478, the transistor 200 can be used as the transistor M4, the transistors 300 can be used as the transistor M5 and the transistor M6, and the capacitor 100 can be used as the capacitor CC. The use of an OS transistor as the transistor M4 enables the leakage current of the transistor M4 to be extremely low.

Note that the structures of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

The structure described in this embodiment can be used in an appropriate combination with the structures described in the other embodiments, examples, and the like.

Embodiment 5

In this embodiment, an example of a chip 1200 on which the semiconductor device of the present invention is mounted is described with reference to FIG. 16A and FIG. 16B. A plurality of circuits (systems) is mounted on the chip 1200. The technique for integrating a plurality of circuits (systems) on one chip is referred to as system on chip (SoC) in some cases.

Figure 16A:
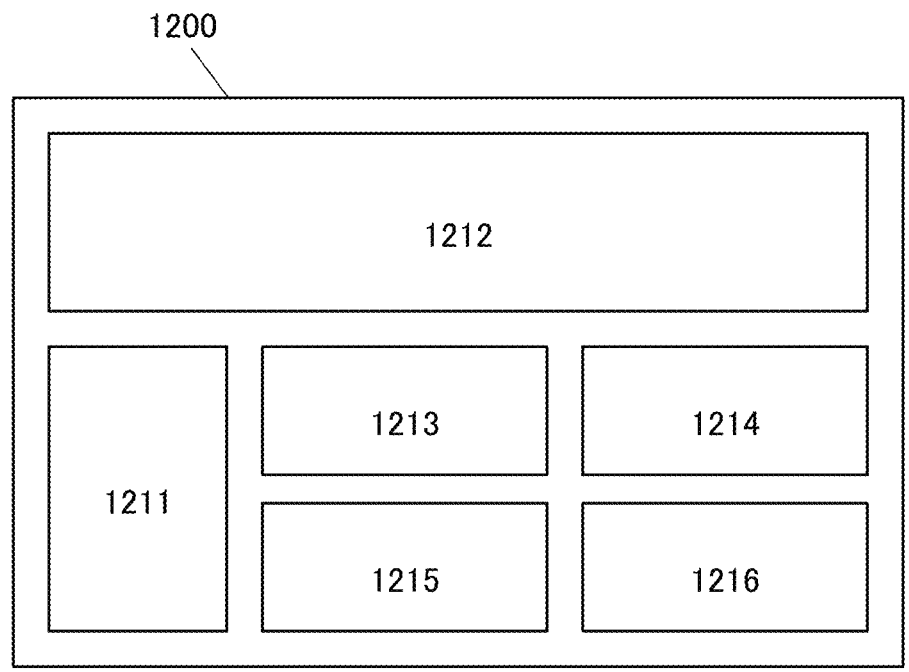
FIG. 16A and FIG. 16B are schematic diagrams of a semiconductor device of one embodiment of the present invention.

As shown in FIG. 16A, the chip 1200 includes a CPU 1211, a GPU 1212, one or more of analog arithmetic units 1213, one or more of memory controllers 1214, one or more of interfaces 1215, one or more of network circuits 1216, and the like.

Figure 16B:
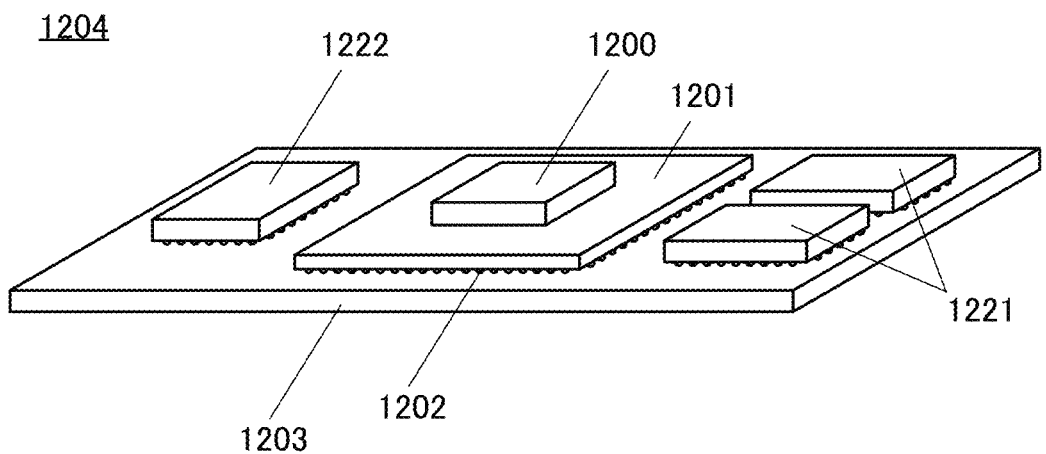

A bump (not shown) is provided on the chip 1200, and as shown in FIG. 16B, the chip 1200 is connected to a first surface of a printed circuit board (PCB) 1201. A plurality of bumps 1202 is provided on the rear surface of the first surface of the PCB 1201 and are connected to a motherboard 1203.

Memory devices such as a DRAM 1221 and a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. As the memory, the NOSRAM or the DOSRAM described above can be used. The GPU 1212 is suitable for parallel computation of a large number of data and thus can be used for image processing and product-sum operation. When an image processing circuit or a product-sum operation circuit using an oxide semiconductor of the present invention is provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, data transfer from the CPU 1211 to the GPU 1212, data transfer between the memories included in the CPU 1211 and the GPU 1212, and transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit to be connected to an external device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 in the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using the SoC technology, and thus can have a small size. The GPU module 1204 is excellent in image processing, and thus is suitably used in portable electronic devices such as a smartphone, a tablet terminal, a laptop PC, and a portable (mobile) game console. Furthermore, the product-sum operation circuit using the GPU 1212 can execute a method in a deep neural network (DNN), a convolutional neural network (CNN), a recurrent neural network (RNN), an autoencoder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments, examples, and the like.

Embodiment 6

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 17A to FIG. 17E schematically show some structure examples of removable memory devices. The semiconductor device described in the above embodiment is processed into a packaged memory chip and used in a variety of storage devices and removable memories, for example.

Figure 17A:
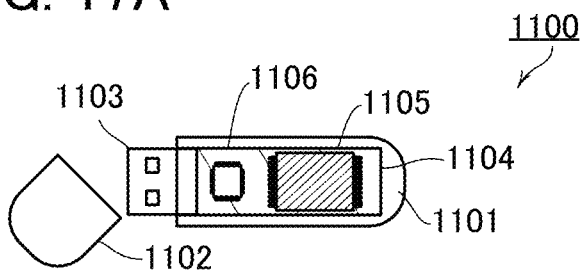
FIG. 17A, FIG. 17B, FIG. 17C, FIG. 17D, and FIG. 17E are schematic diagrams of memory devices of one embodiment of the present invention.

FIG. 17A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figure 17B:
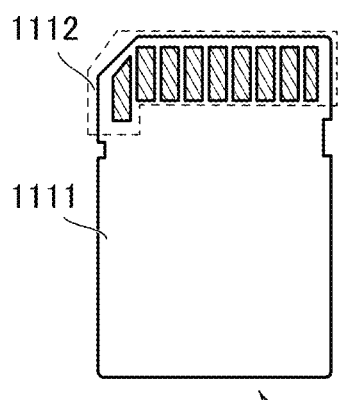
Figure 17C:
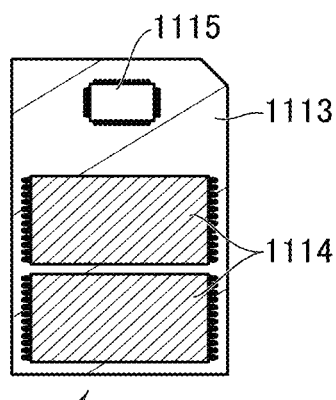

FIG. 17B is a schematic external view of an SD card, and FIG. 17C is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figure 17D:
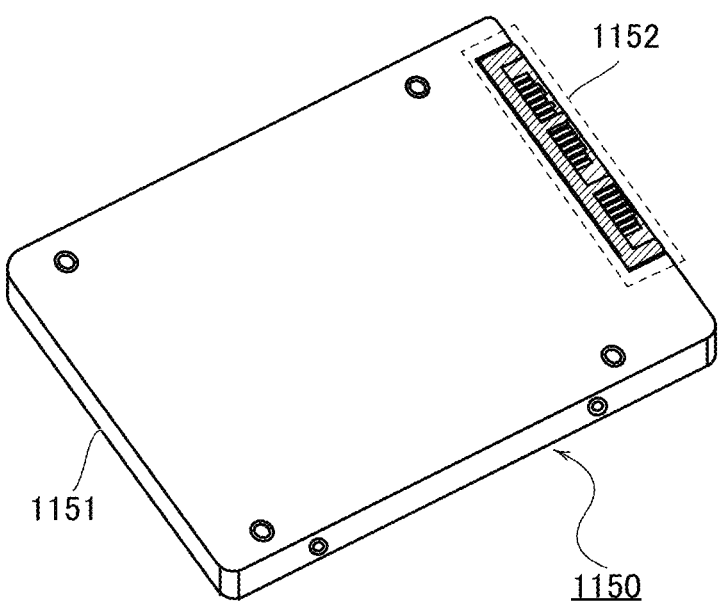
Figure 17E:
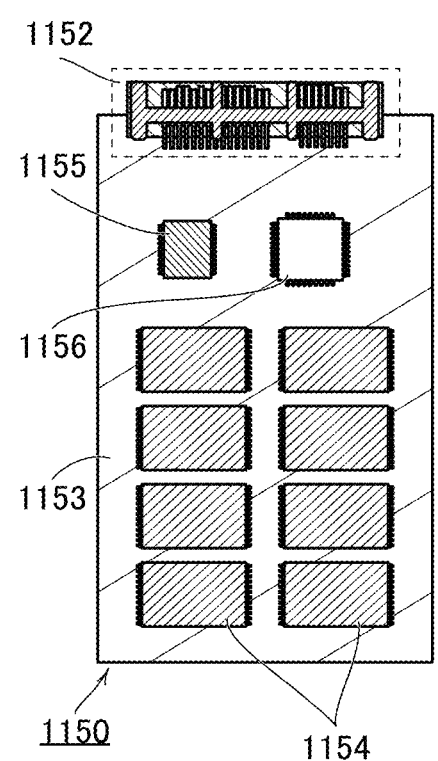

FIG. 17D is a schematic external view of an SSD, and FIG. 17E is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments, examples, and the like.

Embodiment 7

The semiconductor device of one embodiment of the present invention can be used for a processor such as a CPU and a GPU or a chip. FIG. 18A to FIG. 18H show specific examples of electronic devices including a processor such as a CPU or a GPU or a chip of one embodiment of the present invention.

<Electronic Device and System>

The GPU or the chip of one embodiment of the present invention can be incorporated into a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in an electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 18A to FIG. 18H show examples of electronic devices.

[Information Terminal]

Figure 18A:
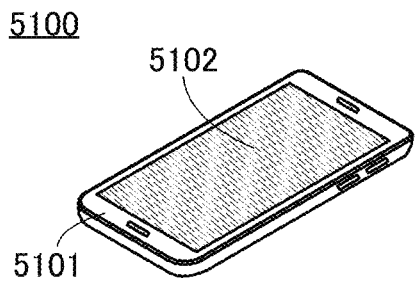
FIG. 18A, FIG. 18B, FIG. 18C, FIG. 18D, FIG. 18E, FIG. 18F, FIG. 18G, and FIG. 18H are diagrams showing electronic devices of one embodiment of the present invention.

FIG. 18A shows a mobile phone (smartphone), which is a type of an information terminal. An information terminal 5100 includes a housing 5101 and a display portion 5102. As input interfaces, a touch panel is provided in the display portion 5102 and a button is provided in the housing 5101.

The information terminal 5100 can execute an application utilizing artificial intelligence, with the use of the chip of one embodiment of the present invention. Examples of the application utilizing artificial intelligence include an application for interpreting a conversation and displaying its content on the display portion 5102; an application for recognizing letters, figures, and the like input to the touch panel of the display portion 5102 by a user and displaying them on the display portion 5102; and an application for biometric authentication using fingerprints, voice prints, or the like.

Figure 18B:
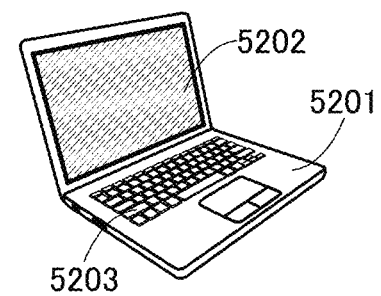

FIG. 18B shows a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence, with the use of the chip of one embodiment of the present invention. Examples of the application utilizing artificial intelligence include design-support software, text correction software, and software for automatic menu generation. Furthermore, with the use of the notebook information terminal 5200, novel artificial intelligence can be developed.

Note that although the smartphone and the notebook information terminal are respectively shown in FIG. 18A and FIG. 18B as examples of the electronic device, one embodiment of the present invention can be applied to an information terminal other than the smartphone and the notebook information terminal. Examples of an information terminal other than the smartphone and the notebook information terminal include a PDA (Personal Digital Assistant), a desktop information terminal, and a workstation.

[Game Machines]

Figure 18C:
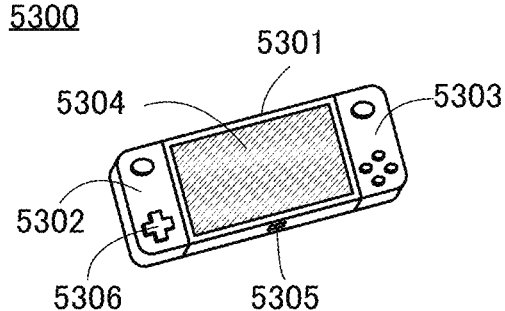

FIG. 18C shows a portable game machine 5300, which is an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), a video to be output to the display portion 5304 can be output to another video device (not shown). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302, and the housing 5303, for example.

Figure 18D:
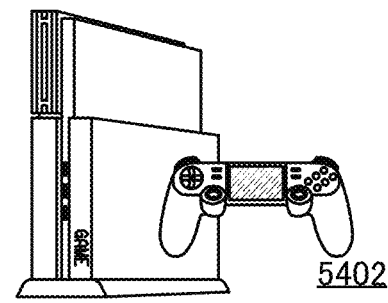

FIG. 18D shows a stationary game machine 5400, which is an example of a game machine. A controller 5402 is connected to the stationary game machine 5400 with or without a wire.

Using the GPU or the chip of one embodiment of the present invention in a game machine such as the portable game machine 5300 and the stationary game machine 5400 can achieve a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5300, the portable game machine 5300 including artificial intelligence can be obtained.

In general, the progress of a game, the actions and words of game characters, and expressions of a phenomenon and the like in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

When a game requiring a plurality of players is played on the portable game machine 5300, the artificial intelligence can create a virtual game player; thus, the game can be played alone with the game player created by the artificial intelligence as an opponent.

Although the portable game machine and the stationary game machine are respectively shown in FIG. 18C and FIG. 18D as examples of a game machine, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like) and a throwing machine for batting practice installed in sports facilities.

[Large Computer]

The GPU or the chip of one embodiment of the present invention can be used in a large computer.

Figure 18E:
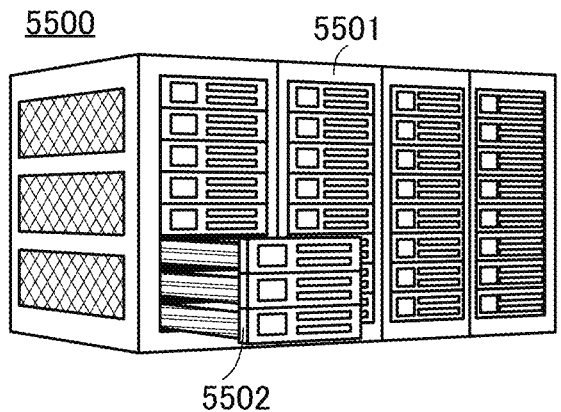
Figure 18F:
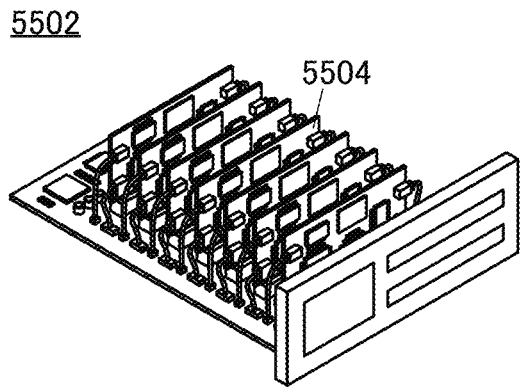

FIG. 18E shows a supercomputer 5500 as an example of a large computer. FIG. 18F shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504, and the GPU or the chip described in the above embodiment can be mounted on the substrates.

The supercomputer 5500 is a large computer mainly used for scientific computation. In scientific computation, an enormous amount of arithmetic operation needs to be processed at high speed; hence, power consumption is high and chips generate a large amount of heat. Using the GPU or the chip of one embodiment of the present invention in the supercomputer 5500 can achieve a low-power-consumption supercomputer. Moreover, heat generation from a circuit can be reduced owing to low power consumption; thus, the influence of heat generation on the circuit, the peripheral circuit, and the module can be reduced.

Although a supercomputer is shown as an example of a large computer in FIG. 18E and FIG. 18F, a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be used in an automobile, which is a moving vehicle, and around a driver's seat in the automobile.

Figure 18G:
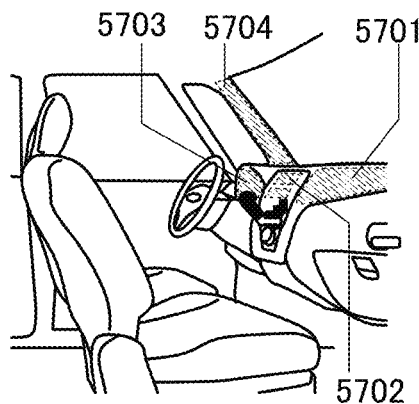

FIG. 18G shows the periphery of a windshield inside an automobile, which is an example of a moving vehicle. FIG. 18G shows a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, a mileage, a fuel meter, a gear-shift indicator, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (a blind spot) by showing an image taken by an imaging device (not shown) provided for the automobile. That is, displaying an image taken by the imaging device provided on the outside of the automobile leads to compensation for the blind spot and enhancement of safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be used as a component of artificial intelligence, the chip can be used in an automatic driving system of the automobile, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 18H:
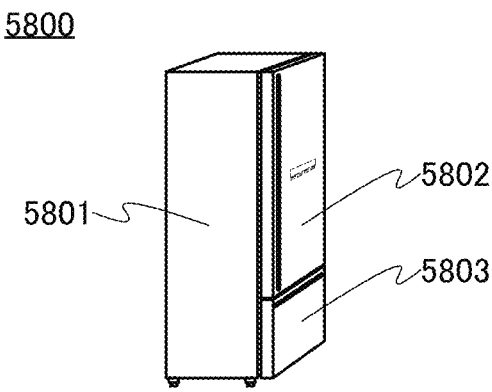

FIG. 18H shows an electric refrigerator-freezer 5800, which is an example of an electrical appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as an example of an electrical appliance, other examples of an electrical appliance include a vacuum cleaner, a microwave oven, an electronic oven, a rice cooker, a water heater, an IH cooker, a water server, a heating-cooling combination appliance such as an air conditioner, a cleaning machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments, examples, and the like.

Example 1

In this example, a semiconductor device which includes the plug structure and the transistor 200 shown in FIG. 4A and in which the transistor 200 is sealed by the stacked-layer structure shown in FIG. 4B was fabricated. Then, cross sections of a plug in a region were observed.

A semiconductor device 990 includes a plurality of the transistors 200 fabricated in the same process. Note that the channel length and channel width of the fabricated transistor 200 were each designed to be 60 nm. In the semiconductor device 990, the density of the transistors 200 was set to 2.9/μm². A plug connected to the transistor 200 was formed.

<Method for Fabricating Samples>

A methods of fabricating the semiconductor device 990 including the plug structure shown in FIG. 4A and the transistor 200 are described below.

First, the transistor 200 was formed. Next, as a film to be the insulator 280, a silicon oxide film was formed over the transistor 200 by a CVD method. After that, the film to be the insulator 280 was planarized by a CMP method to form the insulator 280.

Next, an aluminum oxide film was formed as the insulator 282 over the insulator 280 by a sputtering method.

Then, a silicon nitride film was formed as the insulator 283 over the insulator 282 by a sputtering method. As the insulator 284, a silicon oxide film was formed over the insulator 283 by a CVD method.

After that, part of the insulator 284, the insulator 283, the insulator 282, and the insulator 280 was removed, so that the openings 295 that expose part of the transistor 200 were formed.

Here, a mask whose plug shape was square was used for Sample 1A. A mask whose plug shape was round was used for Sample 1B.

In addition, a cleaning step was performed only on Sample 1B. As the cleaning step, QDR (Quick Dump Rinsing) cleaning in which bubbling with a nitrogen gas using carbonated water was performed.

Next, as a film to be the insulator 247, an aluminum oxide film was formed by an ALD method, and then etch back treatment was performed so that the insulators 247 were formed only on the side surfaces of the openings 295.

Next, as a film to be the conductor 246, a titanium nitride film and a tungsten film were successively formed.

Then, part of the film to be the conductor 246 was removed by a CMP method to form the conductor 246.

Through the above steps, the semiconductor device 990 was fabricated.

<Cross-Sectional Observation of Plug Connected to Transistor 200>

Next, a plan-view observation was performed on two plugs of each of Sample 1A and Sample 1B. These are referred to as Sample 1A-1, Sample 1A-2, Sample 1B-1, and Sample 1B-2. The position of Sample 1A-1 and the position of Sample 1B-1 was selected from regions which were similarly exposed in the substrates. The position of Sample 1A-2 and the position of Sample 1B-2 was selected from regions which were similarly exposed in the substrates. The following table shows the masks of Samples and the presence or absence of a cleaning step.

TABLE 1

| Sample name | Mask | Cleaning process |
| --- | --- | --- |
| Sample 1A-1 Sample 1A-2 | Square mask | No |
| Sample 1B-1 Sample 1B-2 | Round mask | Yes |

Note that the plan-view observation was performed on the thin-sliced samples with a scanning transmission electron microscope (STEM). As an apparatus for the observation, HD-2700 manufactured by Hitachi High-Technologies Corporation was used. FIG. 19 shows the plan-view STEM observation results of the samples.

Figure 19A:
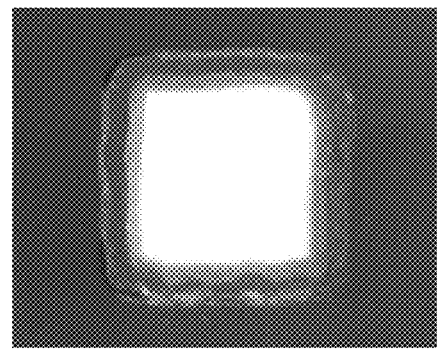
FIG. 19A, FIG. 19B, FIG. 19C, and FIG. 19D are diagrams showing cross sections of semiconductor devices of an example.
Figure 19B:
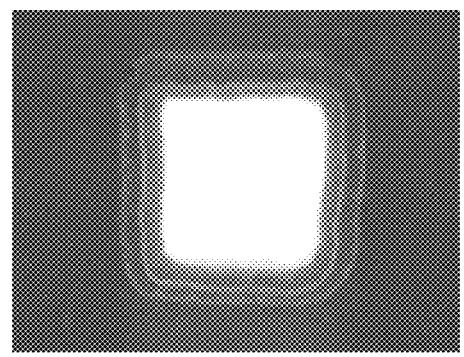
Figure 19C:
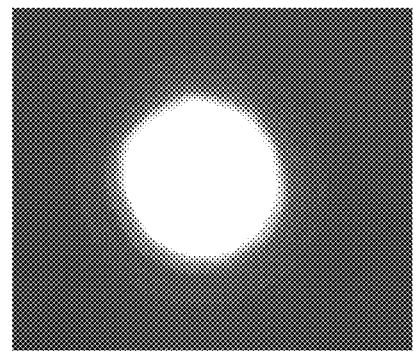
Figure 19D:
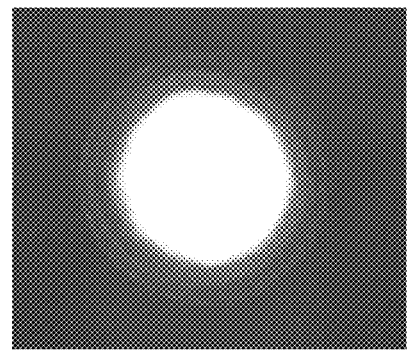

FIG. 19A shows a plan view of the plug of Sample 1A-1.
FIG. 19B shows a plan view of the plug of Sample 1A-2.
FIG. 19C shows a plan view of the plug of Sample 1B-1.
FIG. 19D shows a plan view of the plug of Sample 1B-2.

The plan views of FIG. 19A and FIG. 19B showed that a void was formed in the opening. It was confirmed that the formed void was intensely formed at corners. In particular, it was confirmed that a large void was formed between the side surfaces of the opening and the conductor as well as at corners in the plug shown in FIG. 19A compared to that in FIG. 19B.

In contrast, the plan views of FIG. 19C and FIG. 19D showed that no void was formed. In addition, the plan views of FIG. 19C and FIG. 19D showed that a formation anomaly by processing depending on a plug formation position did not exist.

It was confirmed that, in the step of forming the openings 295, changing the mask and adding the cleaning step reduced the formation anomaly by processing.

At least part of this example can be implemented in combination with the other embodiments described in this specification as appropriate.

Example 2

In this example, a plurality of the transistors 200 including the oxide semiconductor shown in FIG. 6A to FIG. 6C was formed in the same process, transistor characteristics were measured, and variations of the transistor characteristics were evaluated.

A semiconductor device including the transistor 200 shown in FIG. 6A to FIG. 6C is referred to as Sample 2A. The design values of the channel length and the channel width of Sample 2A were each 60 nm. The transistor density in Sample 2A was $2.0/\mu m^2$.

The sample 2A is described below.

In Sample 2A, the oxide 230a was formed using an In—Ga—Zn oxide deposited by a sputtering method using a target with In:Ga:Zn=1:3:4 (atomic ratio). The oxide 230b was formed to have a stacked-layer structure of an In—Ga—Zn oxide deposited by a sputtering method using a target with In:Ga:Zn=4:2:4.1 (atomic ratio) and an In—Ga—Zn oxide deposited by a sputtering method using a target with In:Ga:Zn=1:3:4 (atomic ratio). Note that the film to be the oxide 230a and the film to be the oxide 230b were successively formed.

The oxide 230c was formed to have a stacked-layer structure of an In—Ga—Zn oxide deposited by a sputtering method using a target with In:Ga:Zn=4:2:4.1 (atomic ratio) and an In—Ga—Zn oxide deposited by a sputtering method using a target with In:Ga:Zn=1:3:4 (atomic ratio).

The conductor 240 was formed using a tantalum nitride film. The insulator 250 was formed using a silicon oxynitride film.

The conductor 260a was formed using a titanium nitride film. The conductor 260b was formed using a tungsten film. The film to be the conductor 260a and the film to be the conductor 260b were successively formed.

<Electrical Characteristics of Transistors Included in Sample 2A>

First, heat treatment was performed on Sample 2A at 400° C. for 8 hours under a nitrogen atmosphere. After that, electrical characteristics of 27 transistors included in Sample 2A were measured. About electrical characteristics, Id-Vg characteristics were measured when the drain voltage Vd was set at 1.2 V and the gate voltage Vg was changed from −4 V to +4 V.

Here, in Id-Vg transistor characteristics, the value of the gate voltage Vg at a drain current $Id=1.0\times10^{-12}$ [A] was the Shift value (Vsh).

In addition, in Id-Vg transistor characteristics, the value of the drain current Id at a gate voltage Vg=Vsh+2.5 V and a drain current Id=1.2 V was the on-current value (Ion).

Figure 20A:
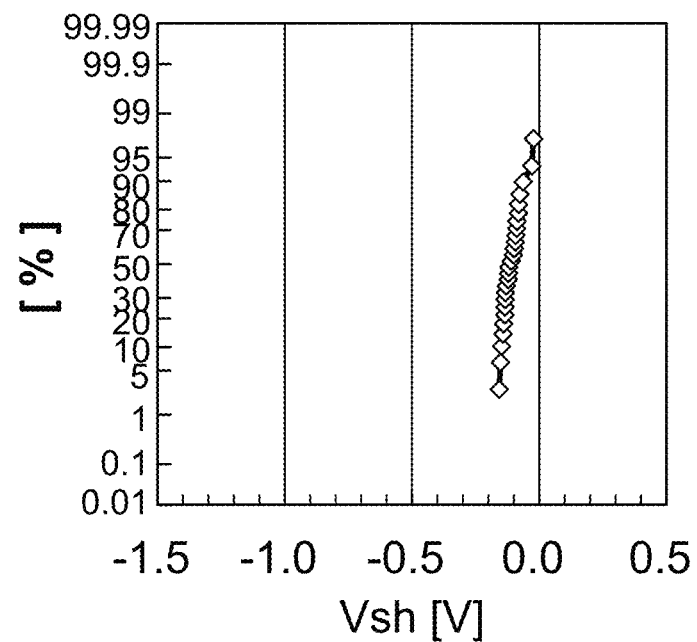
FIG. 20A is a diagram showing a normal probability plot of the Shift value of a sample of an example.
Figure 20B:
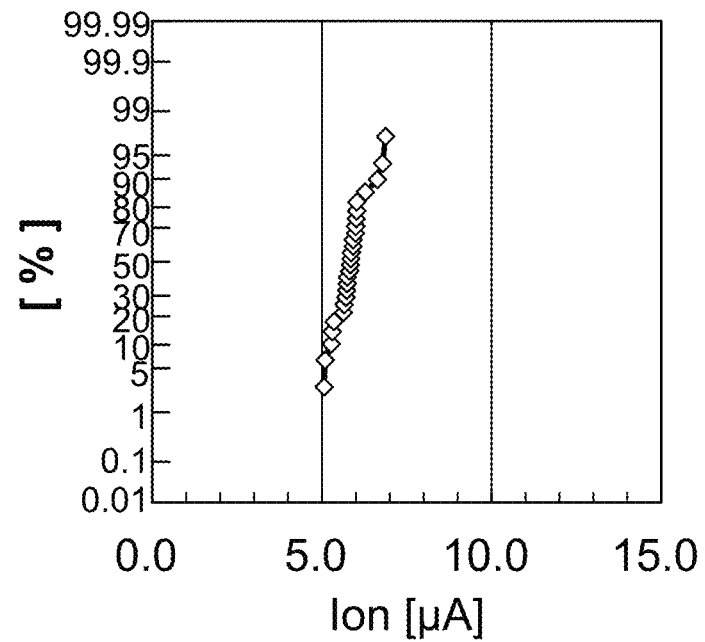
FIG. 20B is a diagram showing a normal probability plot of the on-state current of the sample of an example.

FIG. 20A and FIG. 20B show normal probability plot diagrams of electrical characteristics of 26 transistors included in Sample 2A. FIG. 20A shows the Shift value (Vsh) variations. FIG. 20B shows the on-current (Ion) [pA] variations.

In FIG. 20A and FIG. 20B, a measurement result of a transistor which was determined to be an outlier by Smirnov-Grubbs test (significance level is 5%) was omitted.

From FIG. 20A, the average value of the Shift value is −0.11 V and the standard deviation a, which shows variation in a surface, is 0.035 V in Sample 2A. From FIG. 20B, in Sample 2A, the average value of the on current is 5.85 μA, and the value obtained by dividing the standard deviation a, which shows variation of the on current in a surface, by the average value (a/average value) is 7.7%.

It was confirmed that the transistor 200 using the present invention has almost the same variation value as the transistor using Si.

At least part of this example can be implemented in combination with the other embodiments described in this specification as appropriate.

Example 3

In this example, the transistor 200 including the oxide semiconductor shown in FIG. 7A to FIG. 7D was fabricated, and evaluated anticipating high voltage driving.

The semiconductor device including the transistor 200 shown in FIG. 7A to FIG. 7D includes transistors whose channel length design values (L) are L=60 nm, 100 nm, 200 nm, and 350 nm, and whose channel width design value (W) is 60 nm. In the following description, L and W show designed values.

The semiconductor device including the transistor 200 is described below.

The oxide 230a was formed using an In—Ga—Zn oxide deposited by a sputtering method using a target with In:Ga:Zn=1:3:4 (atomic ratio). The oxide 230b was formed to have a stacked-layer structure of an In—Ga—Zn oxide deposited by a sputtering method using a target with In:Ga:Zn=4:2:4.1 (atomic ratio) and an In—Ga—Zn oxide deposited by a sputtering method using a target with In:Ga:Zn=1:3:4 (atomic ratio). Note that the film to be the oxide 230a and the film to be the oxide 230b were successively formed.

The oxide 230c was formed to have a stacked-layer structure of an In—Ga—Zn oxide deposited by a sputtering method using a target with In:Ga:Zn=4:2:4.1 (atomic ratio) and an In—Ga—Zn oxide deposited by a sputtering method using a target with In:Ga:Zn=1:3:4 (atomic ratio).

The conductor 240 was formed using a tantalum nitride film. The insulator 250 was formed using a silicon oxynitride film.

The conductor 260a was formed using a titanium nitride film. The conductor 260b was formed using a tungsten film. The film to be the conductor 260a and the film to be the conductor 260b were successively formed.

After the semiconductor device including the transistor 200 was manufactured, heat treatment was performed at 400° C. under a nitrogen atmosphere for 8 hours.

<Drain Withstand Voltage of Transistor 200>

First, the drain withstand voltages of the transistors with L=60 nm, 100 nm, 200 nm, and 350 nm, and W=60 nm were measured. In addition, three transistors of each size were measured. In the measurement, the gate voltage Vg was set to +5 V and the drain voltage Vd was increased from 0 V to check the drain current Id. The drain withstand voltage was Vd at the time when Id sharply decreased, that is, the transistor 200 was broken. The maximum voltage of Vd was +20 V. The temperature at the measurement was 85° C.

Figure 21A:
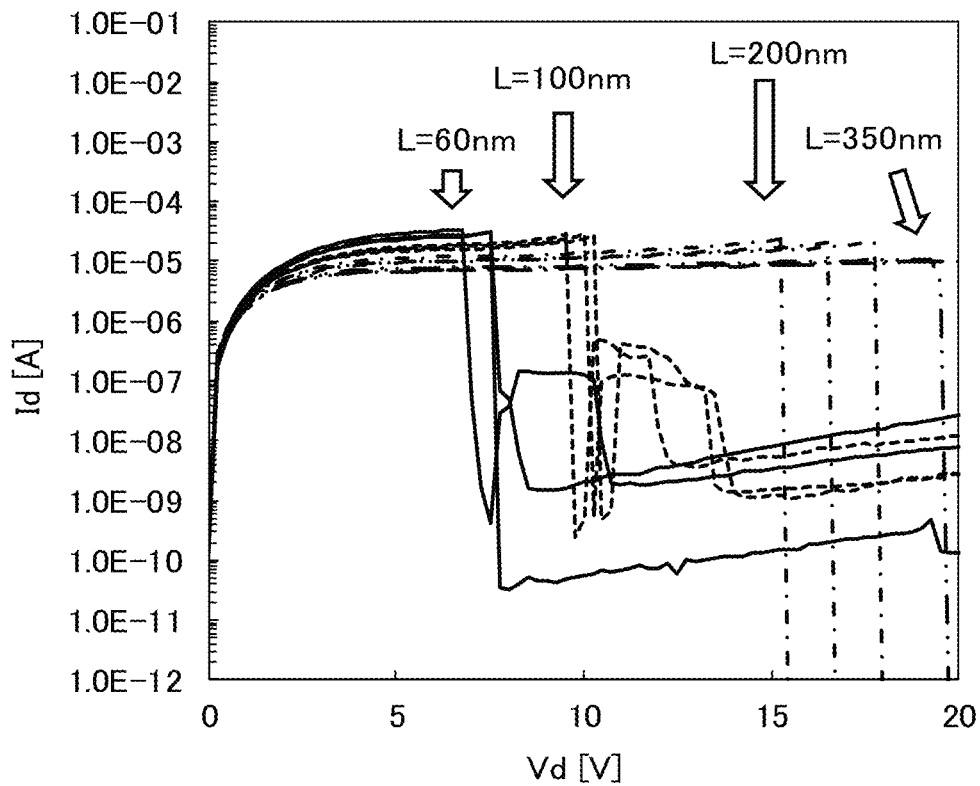
FIG. 21A is a diagram showing Id-Vd characteristics of an example.
Figure 21B:
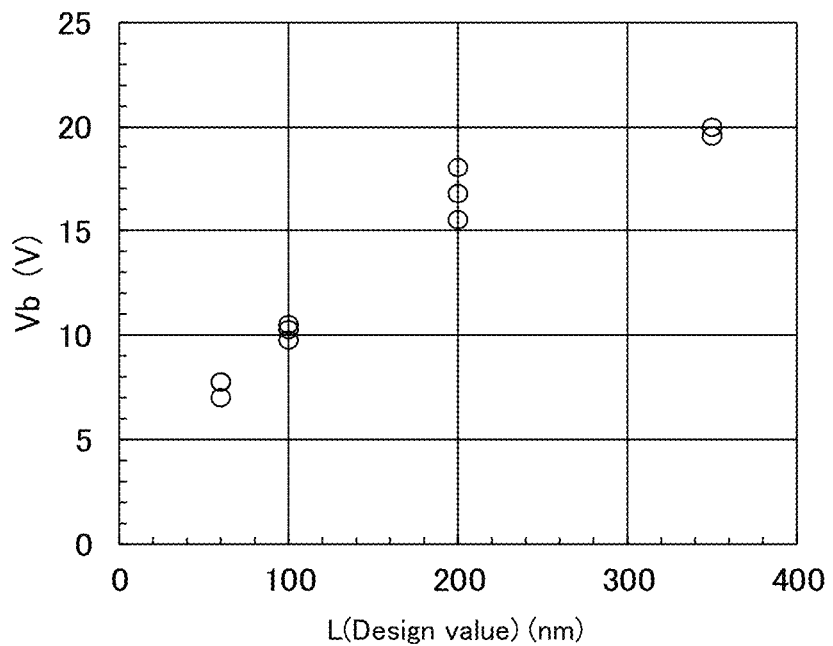
FIG. 21B is a diagram showing drain withstand voltage VbL dependence of an example.

FIG. 21A shows a graph of Id-Vd characteristics. The transistor with L=60 nm was broken at from approximately +7 V to approximately +8 V, the transistor with L=100 nm was broken at from approximately +9.5 V to approximately +10 V, the transistor with L=200 nm was broken at from approximately +15 V to approximately +17.5 V, and the transistor with L=350 nm was broken at from approximately +19.5 V to approximately +20 V. Note that one of the transistors with L=350 nm was not broken at Vd=20 V. FIG. 21B shows a break voltage graph, that is, the L dependence of the drain withstand voltage (Vb). This confirms that the drain withstand voltage increases when L becomes long. This also confirms that even the transistor with L=60 nm has a drain withstand voltage of +6 V or more.

<Reliability of Transistor 200 at High Voltage Driving>

Next, the reliability of the transistor with L=60 nm and W=60 nm and of the transistor with L=350 nm and W=60 nm was tested focusing on the amount of change in the Vsh of the transistors. As the condition of the reliability test, a temperature stress of 125° C. was applied to the transistors, the initial Id-Vg characteristics were measured at 125° C., and the initial Vsh was calculated. The comparative amount of change from the initial Vsh was set as ΔVsh; then, after one-hour stress, the Vsh values were measured at 125° C., and ΔVsh was calculated from the difference to be the change amount. Two kinds of reliability tests were performed: +DBT (+Drain Bias Temperature) test, in which a stress voltage was given to Vd and Vg, Vs, and Vbg were GND, and +GBT (Gate Bias Temperature) test, in which a stress voltage was given to Vg, and Vs, Vd, and Vbg were GND.

Figure 22A:
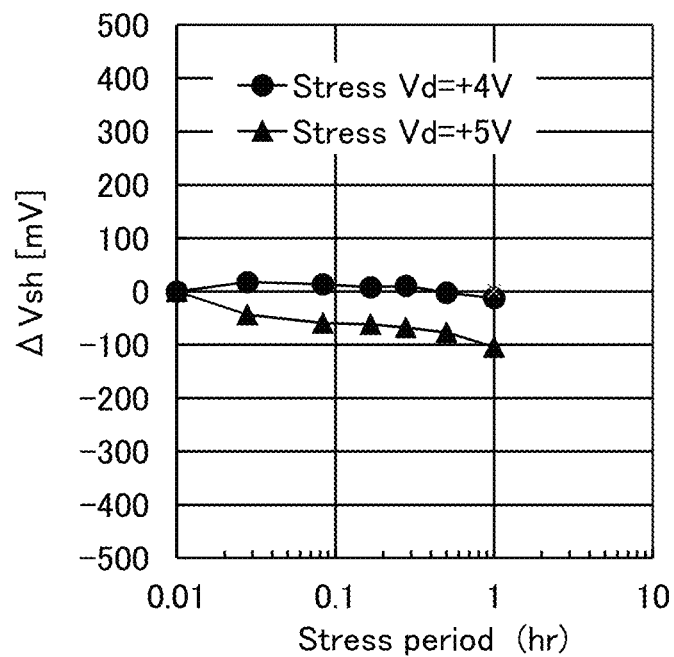
FIG. 22A is a diagram showing +DBT test results of an example.

FIG. 22A shows the +DBT test result of the transistor with L=60 nm and W=60 nm. At Vd=+4 V stress, ΔVsh was approximately −10 mV, and at Vd=+5 V stress, ΔVsh was approximately −100 mV.

Figure 22B:
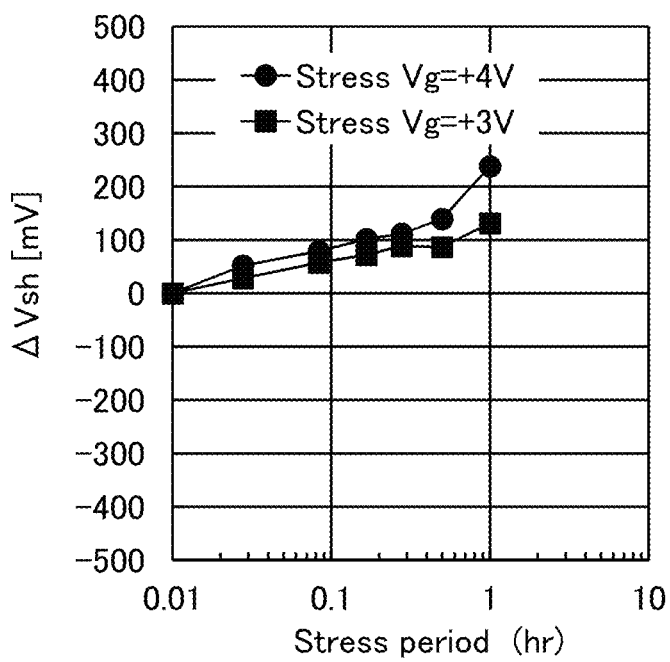
FIG. 22B is a diagram showing +GBT test results of an example.

FIG. 22B shows the +GBT test result of the transistor with L=60 nm and W=60 nm. At Vg=+3 V stress, ΔVsh was approximately +130 mV, and at Vd=+4 V stress, ΔVsh was approximately +240 mV.

Figure 23A:
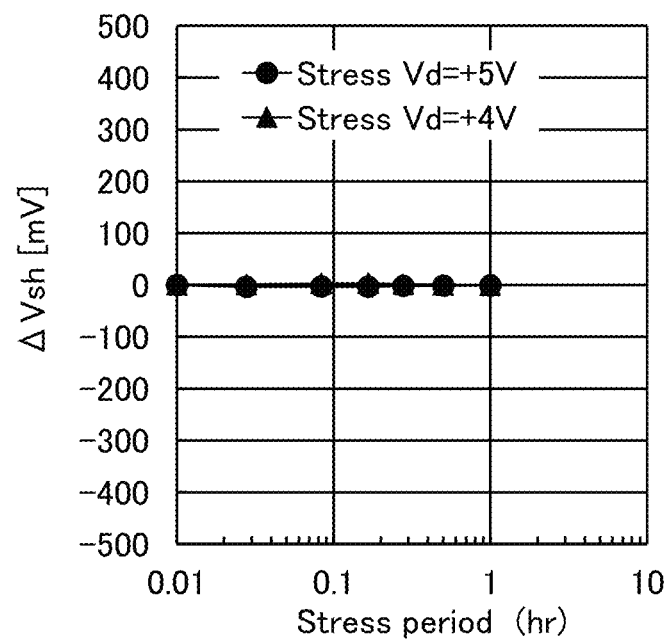
FIG. 23A is a diagram showing +DBT test results of an example.

FIG. 23A shows the +DBT test result of the transistor with L=350 nm and W=60 nm. At Vd=+4 V stress and at Vd=+5 V stress, ΔVsh was 0 mV; no change of Vsh was observed.

Figure 23B:
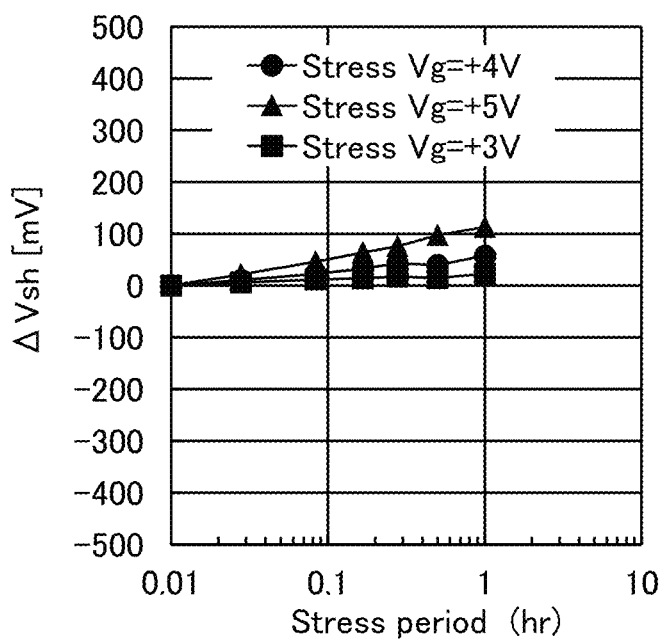
FIG. 23B is a diagram showing +GBT test results of an example.

FIG. 23B shows the +GBT test result of the transistor with L=350 nm and W=60 nm. At Vg=+3 V stress, ΔVsh was approximately +20 mV, at Vg=+4 V stress, ΔVsh was approximately +60 mV, and at Vg=+5 V stress, ΔVsh was approximately +110 mV.

Figure 24A:
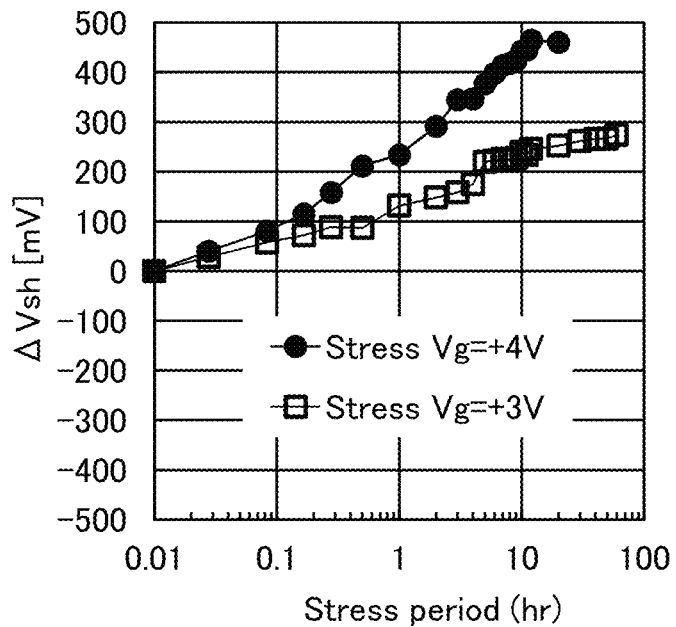
FIG. 24A and FIG. 24B are diagrams showing +GBT long-term test results of an example.
Figure 24B:
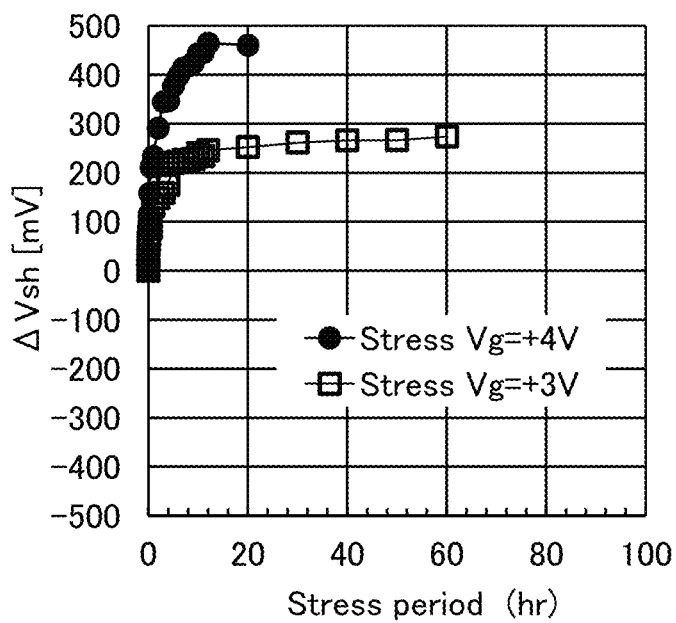

Next, stress period dependence of ΔVsh at the +GBT long-term test was measured. FIG. 24A and FIG. 24B show stress period dependence of ΔVsh at the +GBT long-term test of transistors with L=60 nm and W=60 nm. In FIG. 24A, the stress period was a log scale and in FIG. 24B, the stress period was a linear scale. When a stress period was 60 hours at Vg=+3 V stress, ΔVsh was approximately +270 mV and when a stress period was 20 hours at Vg=+4 V stress, ΔVsh was approximately +460 mV.

Figure 25A:
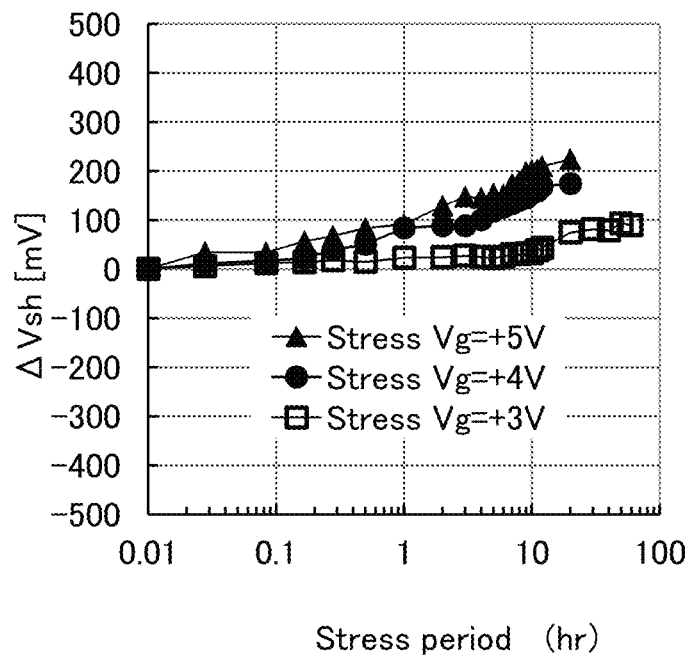
FIG. 25A and FIG. 25B are diagrams showing +GBT long-term test results of an example.
Figure 25B:
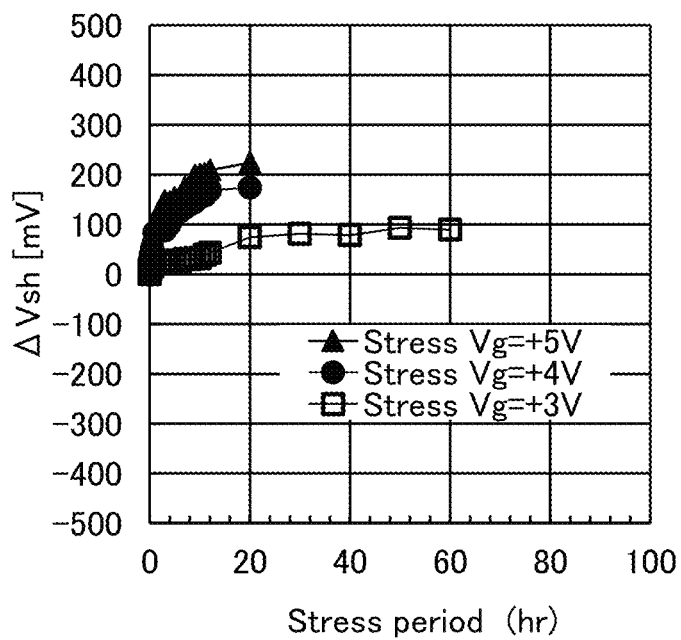

FIG. 25A and FIG. 25B show stress period dependence of ΔVsh at the +GBT long-term test of transistors with L=350 nm and W=60 nm. In FIG. 25A, the stress period was a log scale and in FIG. 25B, the stress period was a linear scale. When a stress period was 60 hours at Vg=+3 V stress, ΔVsh was approximately +90 mV, when a stress period was 20 hours at Vg=+4 V stress, ΔVsh was approximately +170 mV, and when a stress period was 20 hours at Vg=+5 V stress, ΔVsh was approximately +220 mV.

The change tendencies of Vsh in FIG. 24B and FIG. 25B, whose stress periods were linear scale, show that in either stress condition, Vsh positive changes were large at the initial stress, and then the Vsh changes tended to be saturated.

At least part of this example can be implemented in combination with the other embodiments described in this specification as appropriate.

Example 4

In this example, the transistor 200 including an oxide semiconductor shown in FIG. 7A to FIG. 7D was fabricated, and a HC (Hot Carrier) deterioration test and a hysteresis evaluation were performed.

The semiconductor device including the transistor 200 is described below.

The oxide 230a was formed using an In—Ga—Zn oxide deposited by a sputtering method using a target with In:Ga:Zn=1:3:4 (atomic ratio). The oxide 230b was formed to have a stacked-layer structure of an In—Ga—Zn oxide deposited by a sputtering method using a target with In:Ga:Zn=4:2:4.1 (atomic ratio) and an In—Ga—Zn oxide deposited by a sputtering method using a target with In:Ga:Zn=1:3:4 (atomic ratio). Note that the film to be the oxide 230a and the film to be the oxide 230b were successively formed.

The oxide 230c was formed to have a stacked-layer structure of an In—Ga—Zn oxide deposited by a sputtering method using a target with In:Ga:Zn=4:2:4.1 (atomic ratio) and an In—Ga—Zn oxide deposited by a sputtering method using a target with In:Ga:Zn=1:3:4 (atomic ratio).

The conductor 240 was formed using a tantalum nitride film. The insulator 250 was formed using a silicon oxynitride film.

The conductor 260a was formed using a titanium nitride film. The conductor 260b was deposited using a tungsten film. The film to be the conductor 260a and the film to be the conductor 260b were successively formed.

After the semiconductor device including the transistor 200 was manufactured, heat treatment was performed at 400° C. under a nitrogen atmosphere for 8 hours.

<HC Deterioration Test of Transistor 200>

In the HC deterioration Test of this example, the stress described below was given to a transistor and transistor characteristics before and after the stress were compared. The stress is described in detail below.

Under an environment at a temperature of 25° C., Vd was fixed to +5 V. Vg was given under four conditions of Vth+0 V, Vth+0.5 V, Vth+1.0 V, and Vth+2V. Before and after Vg was given, an Id-Vg measurement was performed at Vd=+0.1 V, and ΔId (%), which was an Id change rate before and after the application of the stress at Vg=Vsh+2.5V, was evaluated with the obtained Id-Vg characteristics. That is, ΔId (%) was calculated by 100×(Id after stress was given/Id before stress was given). The transistor under the HC deterioration test had L=60 nm and W=60 nm.

Figure 26A:
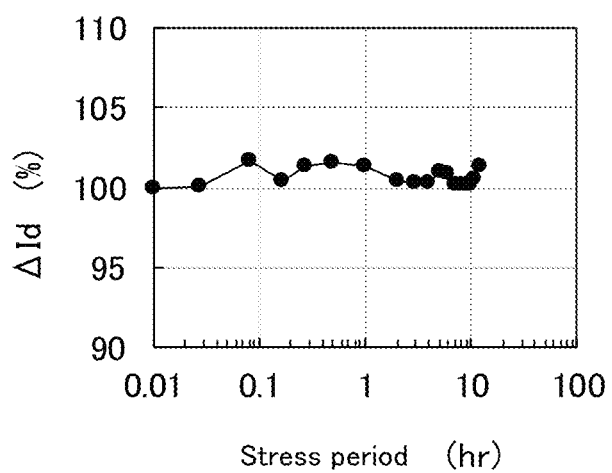
FIG. 26A and FIG. 26B are diagrams showing HC deterioration test results of an example.
Figure 26B:
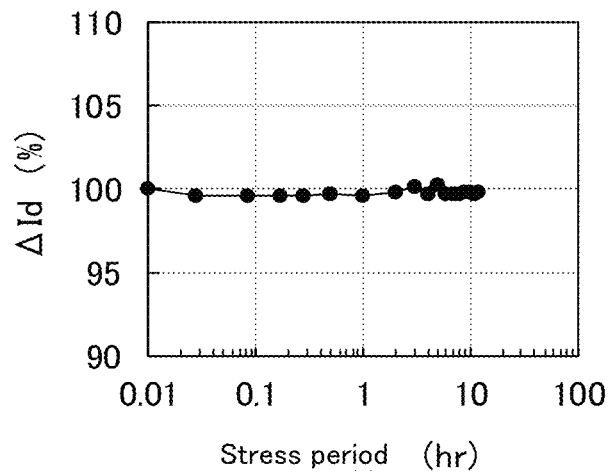

FIG. 26A, FIG. 26B, FIG. 27A, and FIG. 27B show the results of the HC deterioration test. FIG. 26A shows stress period dependence of ΔId when Vd=+5 V and Vg=Vth+0 V=+0.39 V were given as stress. ΔId after 12 hours of a stress period was 101.3%. FIG. 26B shows stress period dependence of Δd when Vd=+5 V and Vg=Vth+0.5V=+1.11 V were given as stress. ΔId after 12 hours of a stress period was 99.9%.

Figure 27A:
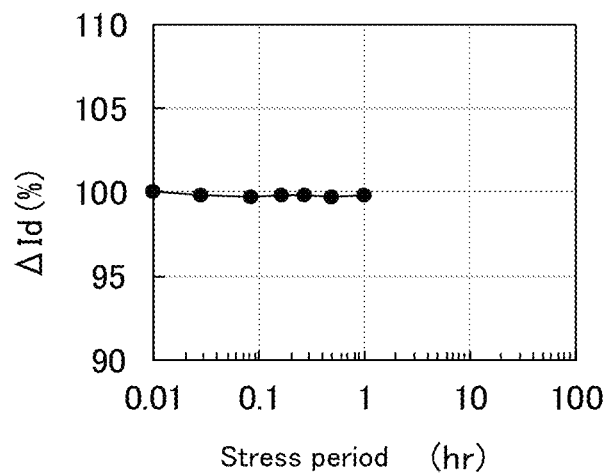
FIG. 27A and FIG. 27B are diagrams showing HC deterioration test results of an example.
Figure 27B:
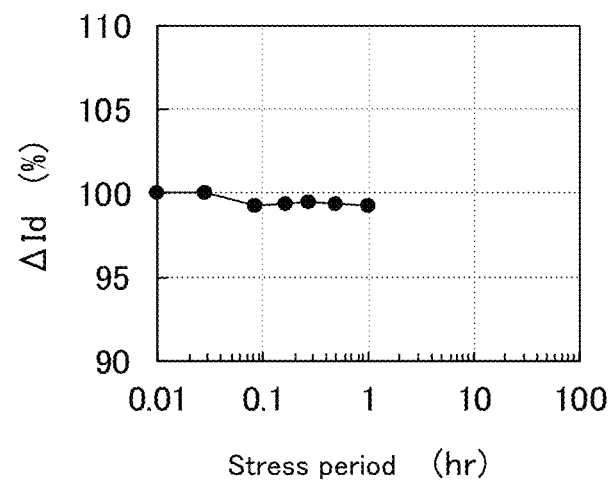

FIG. 27A shows stress period dependence of ΔId when Vd=+5 V and Vg=Vth+1.0 V=+1.51 V were given as stress. ΔId after one hour of a stress period was 99.8%. FIG. 27B shows stress period dependence of ΔId when Vd=+5 V and Vg=Vth+2.0 V=+2.58 V were given as stress. Ad after one hour of a stress period was 99.3%. From the above results, the HC deterioration test shows ΔId within the range of 99% to 102% regardless of the scale of Vg given as stress.

<Hysteresis Evaluation of Transistor 200>

A hysteresis evaluation was performed as follows. At a temperature of 25° C. and Vd=+1.2 V, Vg was swept from −2 V to +4 V (positive sweep) and Id-Vg characteristics were measured; then, Vg was swept from +4 V to −2 V (negative sweep) and Id-Vg characteristics were measured. This measurement was performed three times, and differences of Id-Vg characteristics between the positive sweep and the negative sweep were evaluated. Three transistor each with L=350 nm and W=60 nm, and three transistors each with L=60 nm and W=60 nm were evaluated.

Figure 28A:
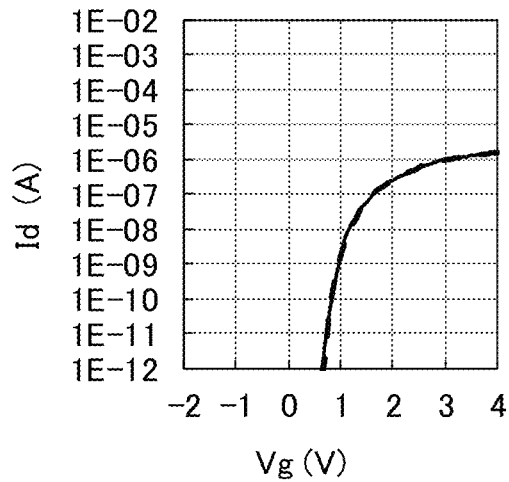
FIG. 28A, FIG. 28B, and FIG. 28C are diagrams showing hysteresis evaluation results of an example.
Figure 28B:
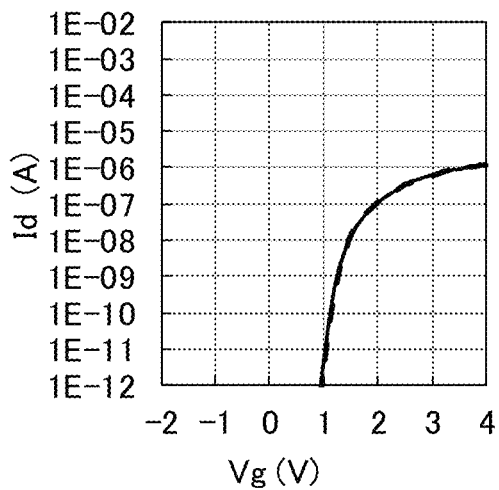
Figure 28C:
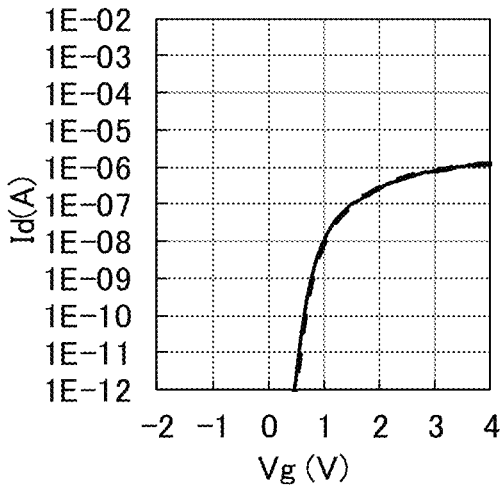

FIG. 28A, FIG. 28B, FIG. 28C, FIG. 29A, FIG. 29B, and FIG. 29C show hysteresis evaluation results. The solid line in each diagram show the results of the positive sweep. The broken lines show the results of the negative sweep. FIG. 28A shows the first test result of the first transistor with L=350 nm and W=60 nm. FIG. 28B shows the first test result of the second transistor with L=350 nm and W=60 nm. FIG. 28C shows the first test result of the third transistor with L=350 nm and W=60 nm. The solid lines and the broken lines are overlapped in FIG. 28A, FIG. 28B, and FIG. 28C; no difference was observed between the positive sweep and the negative sweep. In the second and the third test, all the transistors showed no difference between the positive sweep and the negative sweep, which was not shown.

Figure 29A:
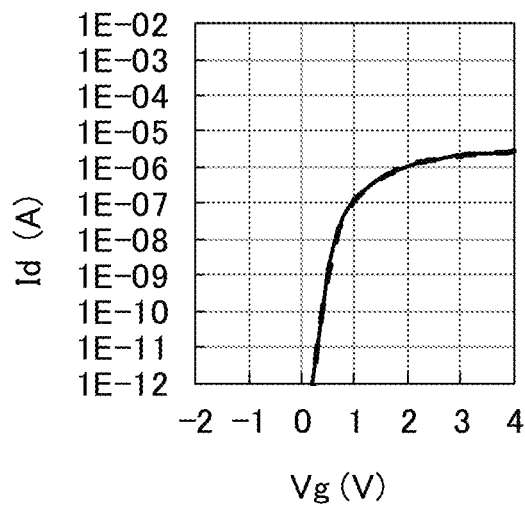
FIG. 29A, FIG. 29B, and FIG. 29C are diagrams showing hysteresis evaluation results of an example.
Figure 29B:
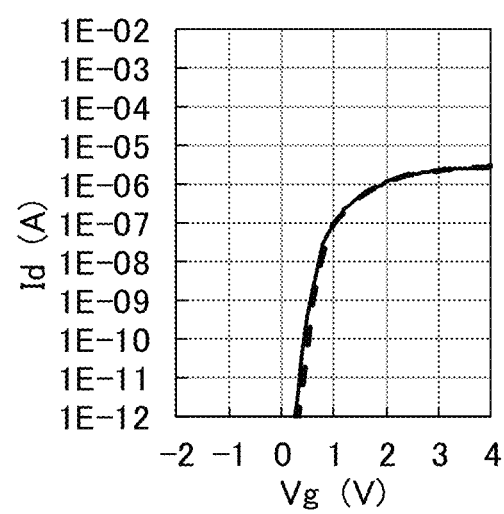
Figure 29C:
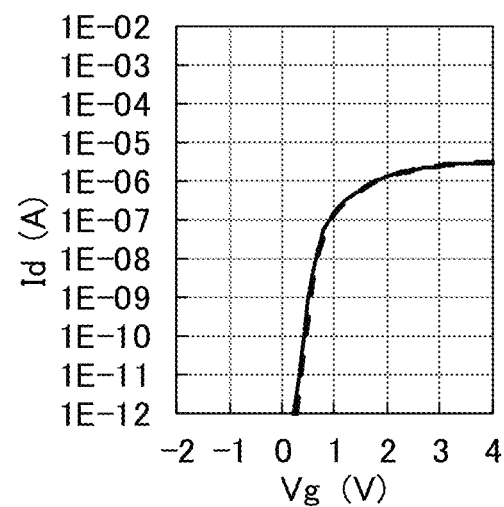

FIG. 29A shows the first test result of the first transistor with L=60 nm and W=60 nm. FIG. 29B shows the first test result of the second transistor with L=60 nm and W=60 nm. FIG. 29C shows the first test result of the third transistor with L=60 nm and W=60 nm. The solid lines and the broken lines are overlapped in FIG. 29A, FIG. 29B, and FIG. 29C; no difference was observed between the positive sweep and the negative sweep. In the second and the third test, all the transistors showed no difference between the positive sweep and the negative sweep, which was not shown. From the above results, in the hysteresis evaluation, no difference was observed between the positive sweep and the negative sweep in all the transistors.

At least part of this example can be implemented in combination with the other embodiments described in this specification as appropriate.

REFERENCE NUMERALS

200: transistor, 201 substrate, 205 conductor, 210 insulator, 212 insulator, 214 insulator, 216 insulator, 218 conductor, 222 insulator, 224 insulator, 230 oxide, 230a oxide, 230b oxide, 230c oxide, 240 conductor, 240a conductor, 240b conductor, 245 insulator, 245a insulator, 245b insulator, 246 conductor, 246A conductive film, 247 insulator, 248 conductor, 250 insulator, 260 conductor, 260a conductor, 260b conductor, 273 insulator, 274 insulator, 280 insulator, 282 insulator, 283 insulator, 284 insulator, 290A film, 290B hard mask, 292 resist mask, 295 opening, 297 region, 299 cleaning machine

The invention claimed is:

1. A manufacturing method of a semiconductor device comprising:
    forming an oxide semiconductor of a transistor;
    forming a first insulator over the oxide semiconductor;
    forming a second insulator over and in contact with the first insulator;
    forming a third insulator over the second insulator;
    forming a fourth insulator over the third insulator;
    forming an opening in the fourth insulator, the third insulator, the second insulator, and the first insulator;
    cleaning the inside of the opening;
    forming a fifth insulator only on a side surface of the cleaned opening after the cleaning; and
    embedding a conductor in the cleaned opening,
    wherein the first insulator is formed to comprise an excess-oxygen region,
    wherein the second insulator and the fifth insulator comprise aluminum oxide, respectively,
    wherein a side surface of the second insulator and the fifth insulator are in contact with each other,
    wherein the third insulator is in contact with side surfaces of the second insulator, the fourth insulator, and the fifth insulator, and
    wherein the opening is processed to have a cylindrical shape or an inverted cone shape.

2. The manufacturing method of a semiconductor device according to claim 1,
    wherein the oxide semiconductor is an In—Ga—Zn oxide.

3. The manufacturing method of a semiconductor device according to claim 1,
    wherein carbonated water is used in the cleaning.

* * * * *